(12) United States Patent
Weis

(10) Patent No.: US 7,642,586 B2
(45) Date of Patent: Jan. 5, 2010

(54) INTEGRATED MEMORY CELL ARRAY

(75) Inventor: Rolf Weis, Dresden (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 11/517,634

(22) Filed: Sep. 8, 2006

(65) Prior Publication Data

US 2008/0061337 A1 Mar. 13, 2008

(51) Int. Cl.
*H01L 27/108* (2006.01)

(52) U.S. Cl. .............................. 257/296; 257/E27.084

(58) Field of Classification Search ................ 257/296, 257/297, 298, 299, 300, 301, 302, 303, 304, 257/305, 306, 307, 308, 309, 310, 311, 312, 257/313, 327, 328, 329, 330, 331, 332, 333, 257/334, E27.081, E27.084–E27.089
See application file for complete search history.

(56) References Cited

U.S. PATENT DOCUMENTS

| 5,250,830 | A * | 10/1993 | Yagishita et al. ............ 257/302 |
| 5,959,322 | A | 9/1999 | Lee |
| 6,337,497 | B1 * | 1/2002 | Hanafi et al. ................ 257/306 |
| 6,894,336 | B2 | 5/2005 | van Roijen |
| 2006/0046424 | A1 | 3/2006 | Chance et al. |

FOREIGN PATENT DOCUMENTS

| DE | EP 1003219 | 5/2000 |
| DE | 10326158 | 1/2004 |
| EP | 1482562 A2 | 12/2004 |

OTHER PUBLICATIONS

German Office Action dated Jun. 22, 2007.
U.S. Appl. No. 11/517,639, filed Sep. 8, 2006, Rolf Weis, Entire Document.
M. Terauchi, et al., "Depletion Isolation Effect of Surrounding Gate Transistors", IEEE Transactions on Electron Devices. vol. 44, No. 12, Dec. 1997, p. 2303-2305.
M. Terauchi, et al., "A Surrounding Gate Transistor (SGT) Gain Cell for Ultra High Density Drams", ULSI Research Center, Toshiba Corporation. 3A-3. p. 21-22.

* cited by examiner

*Primary Examiner*—Sue Purvis
*Assistant Examiner*—Kevin Quinto
(74) *Attorney, Agent, or Firm*—Eschweiler & Associates, LLC

(57) ABSTRACT

The present invention provides an integrated memory cell array comprising: a semiconductor substrate; a plurality of cell transistor devices including: a pillar formed in said semiconductor substrate; a gate trench surrounding said pillar; a first source/drain region formed in an upper region of said pillar; a gate dielectric formed on the bottom of said gate trench and surrounding a lower region of said pillar; a gate formed on said gate dielectric in said gate trench and surrounding a lower region of said pillar; and a second source/drain region formed in an upper region of said semiconductor substrate adjoining said gate trench; a plurality of bitlines being connected to respective first groups of first source/drain regions of said cell transistor devices; a plurality of wordlines connecting the respective gates of second groups said cell transistor devices; and a plurality of cell capacitor devices being connected to the second source/drain regions of said cell transistor devices.

20 Claims, 65 Drawing Sheets

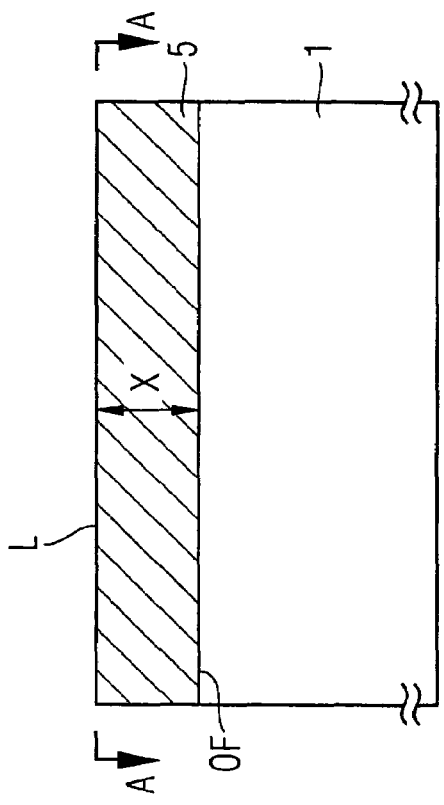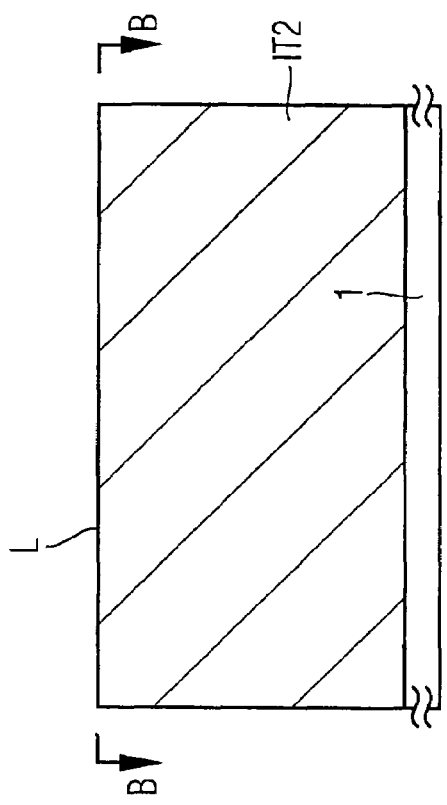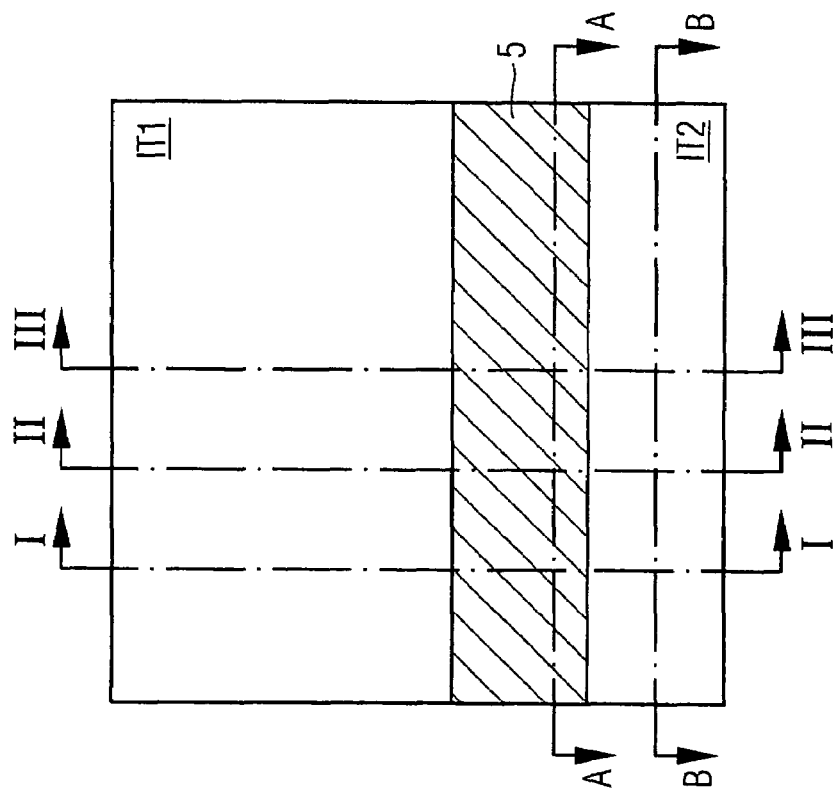

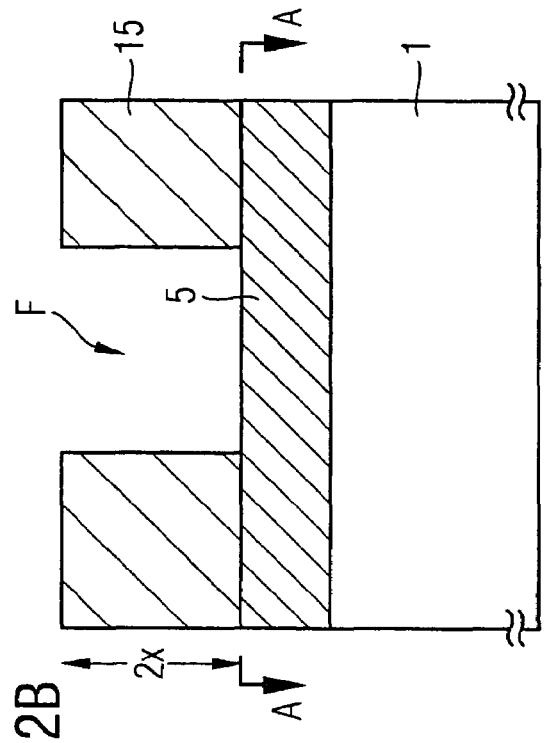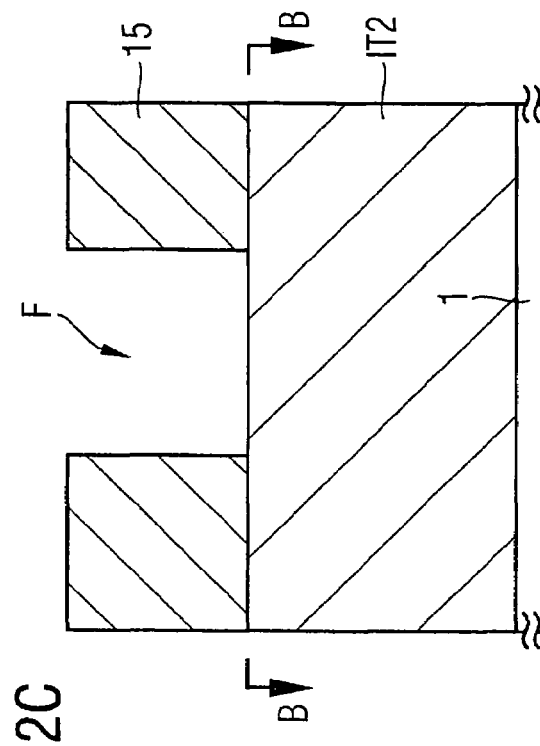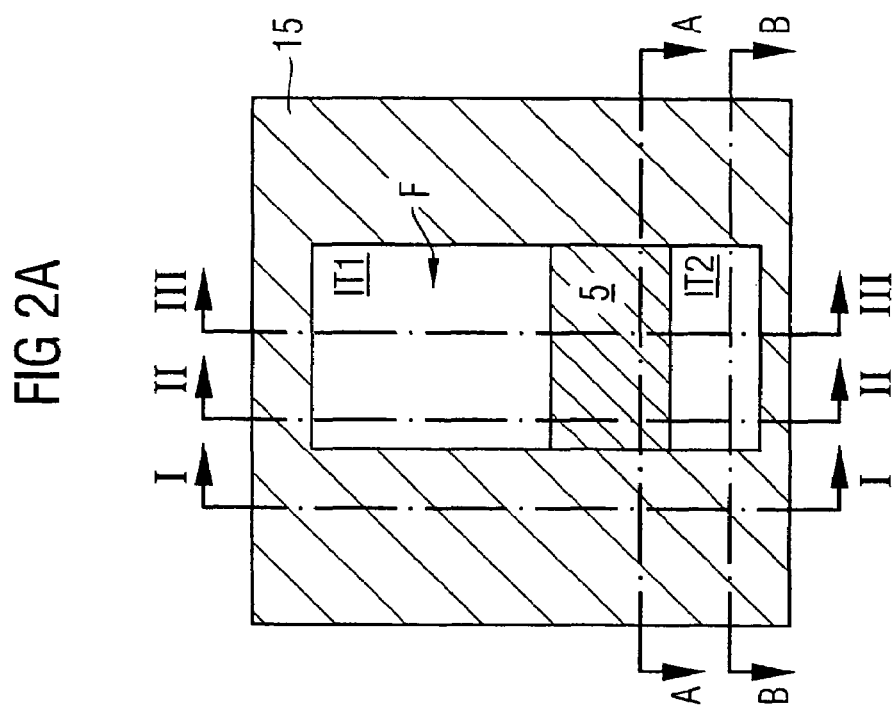

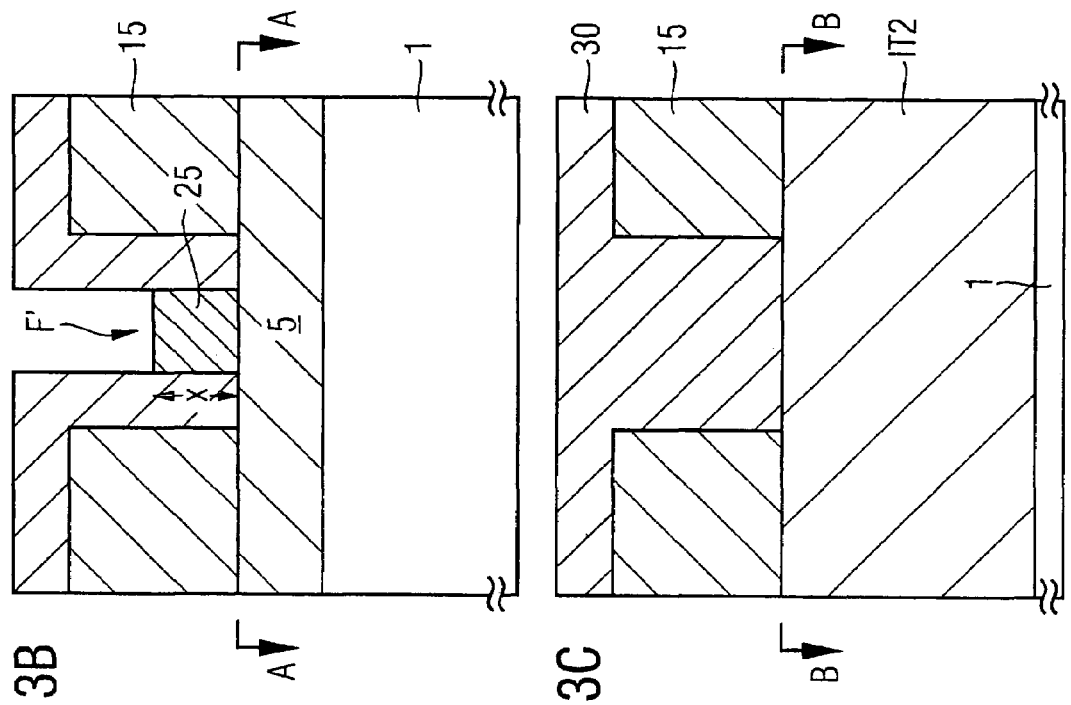
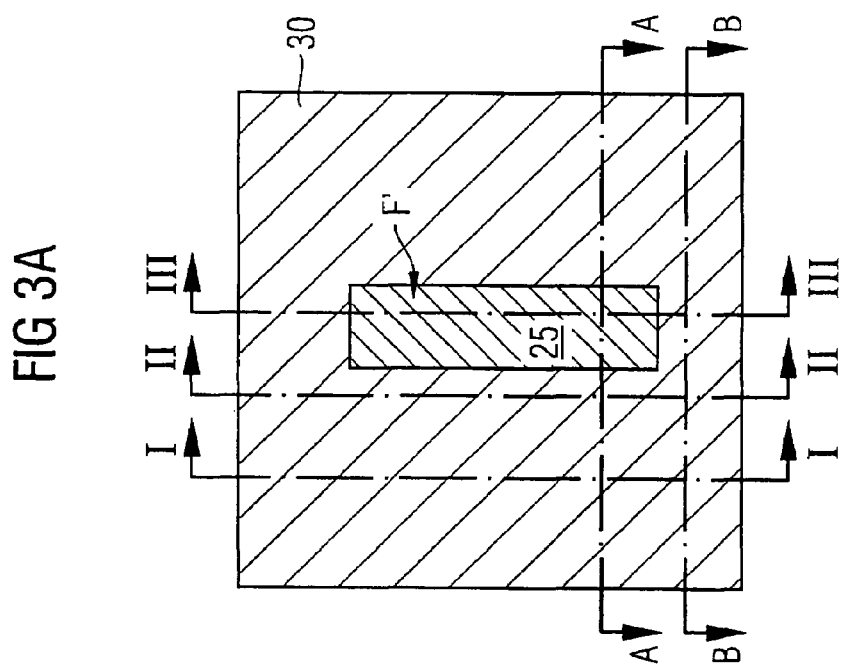

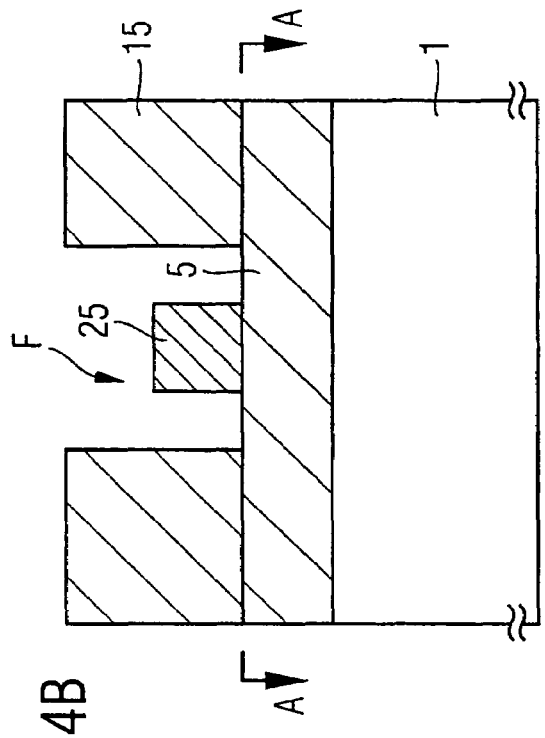
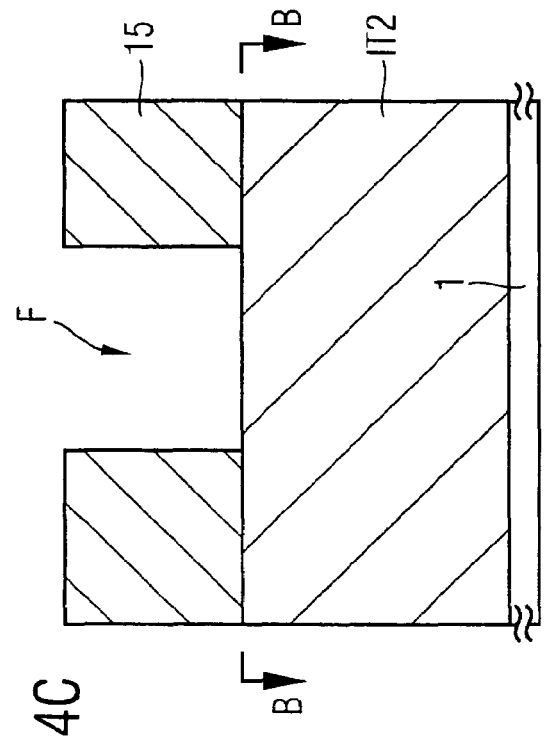
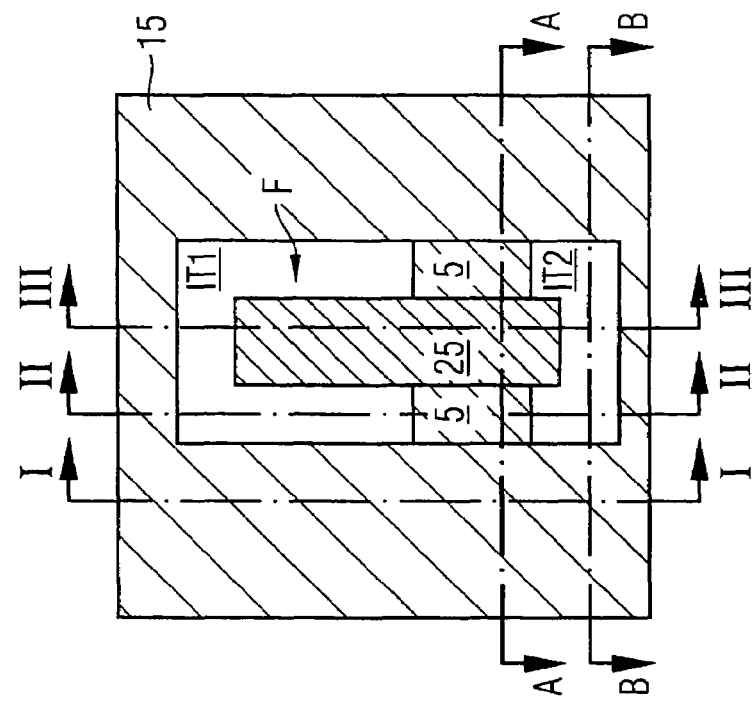

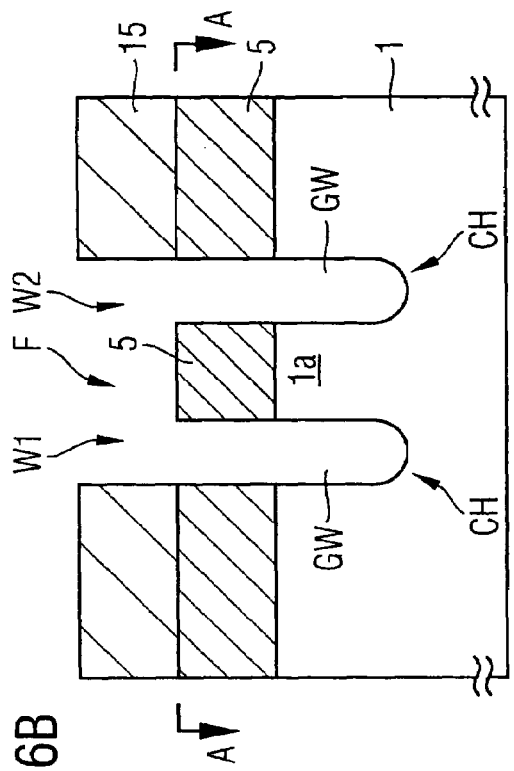
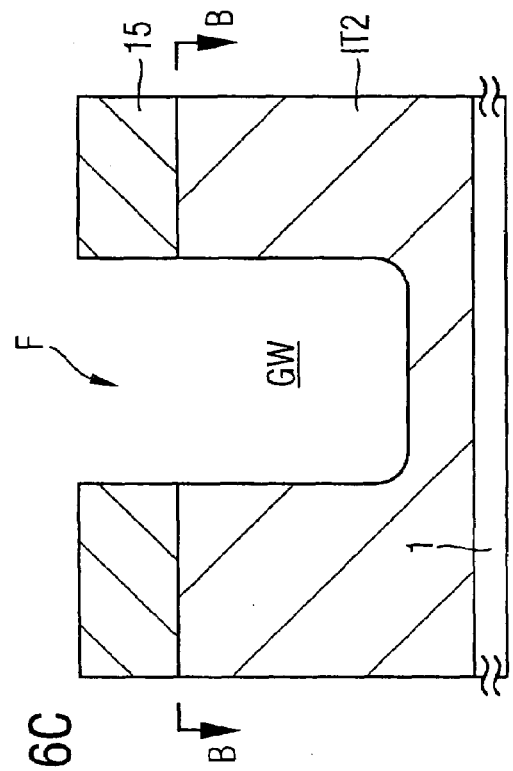
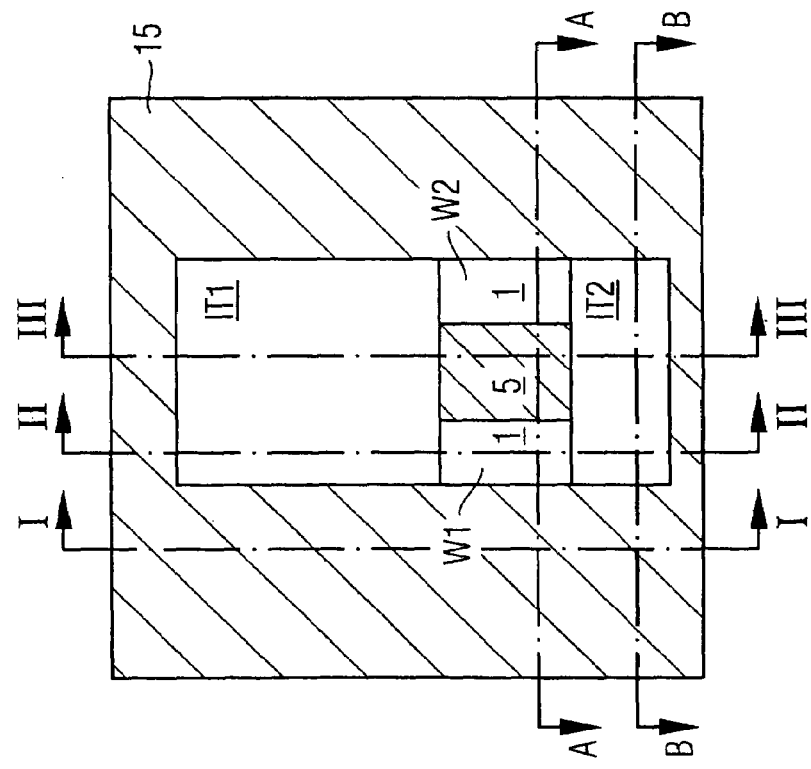

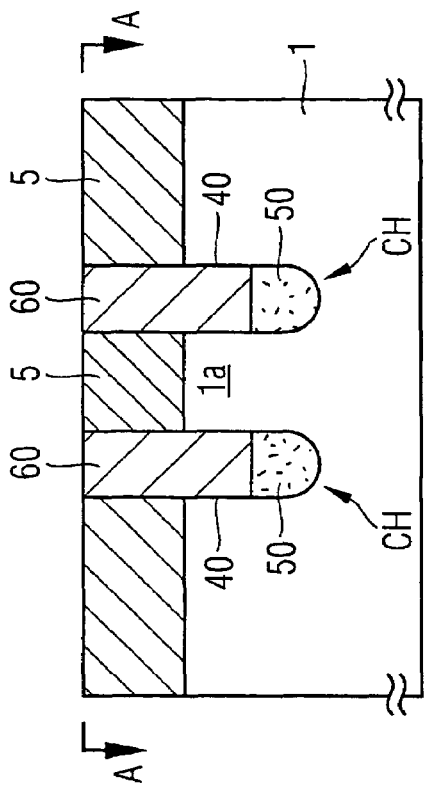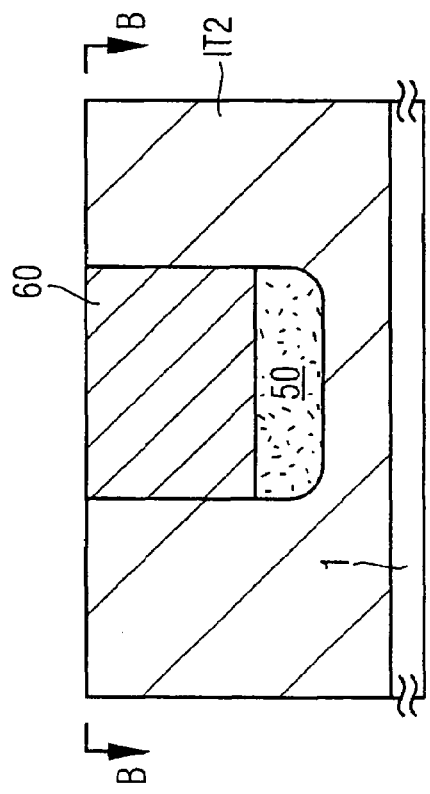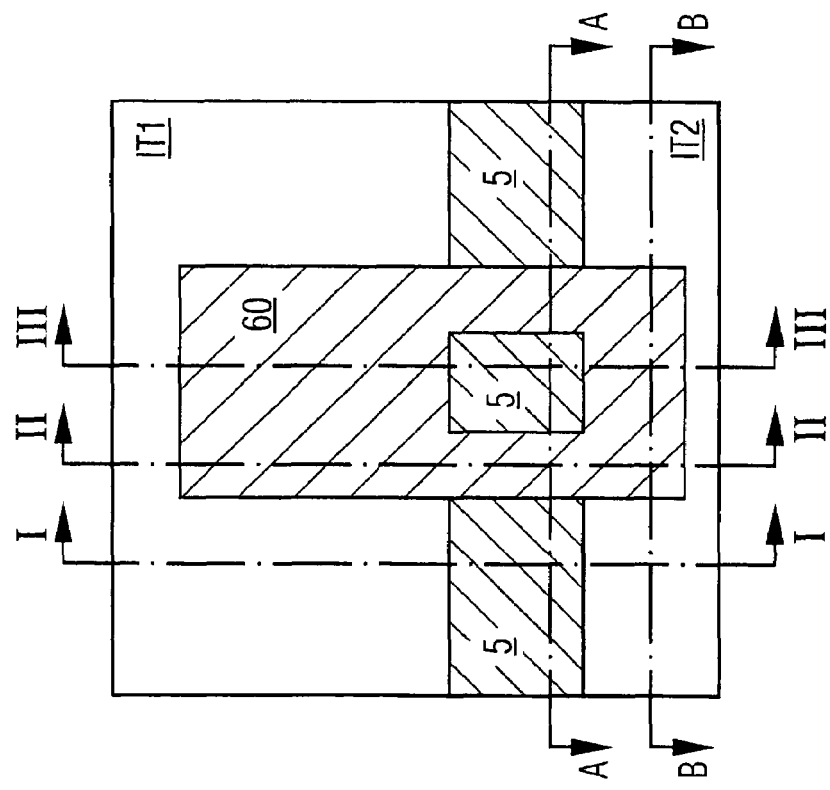

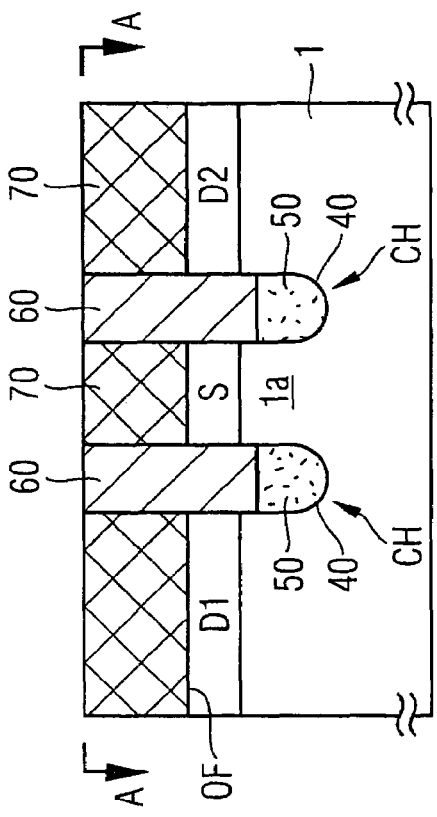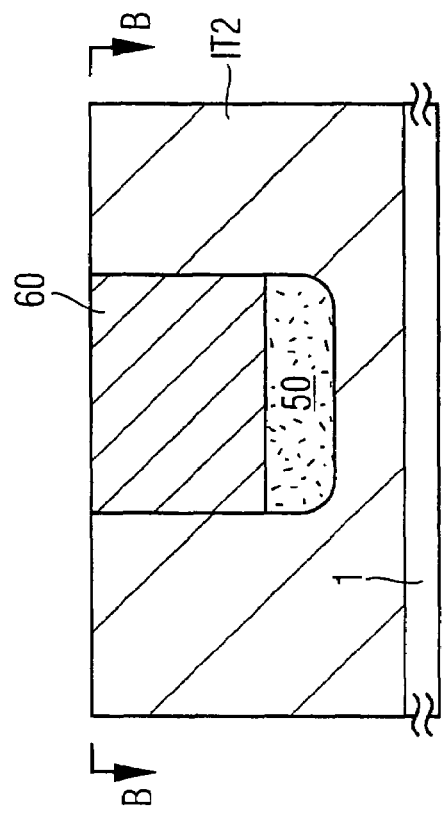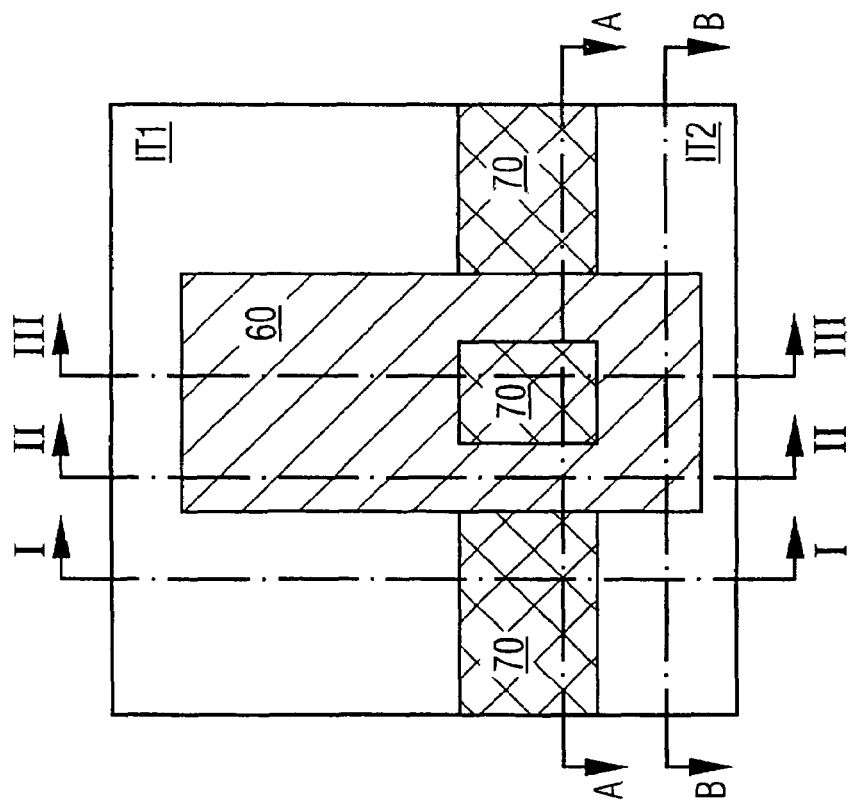

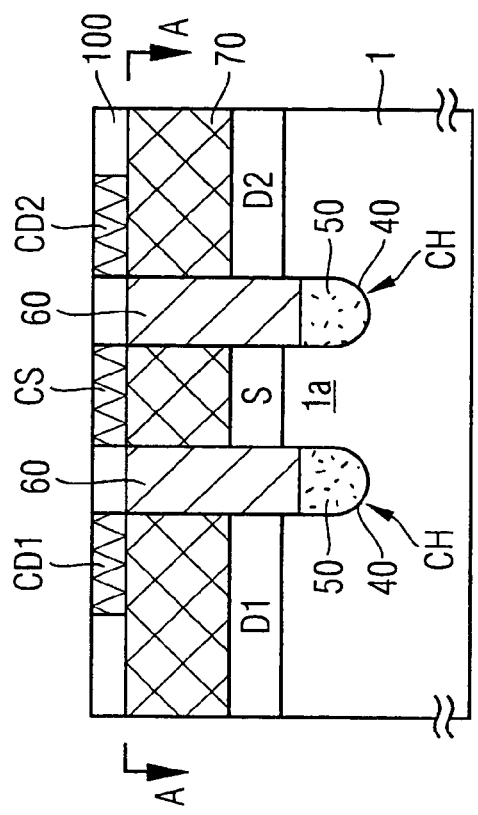
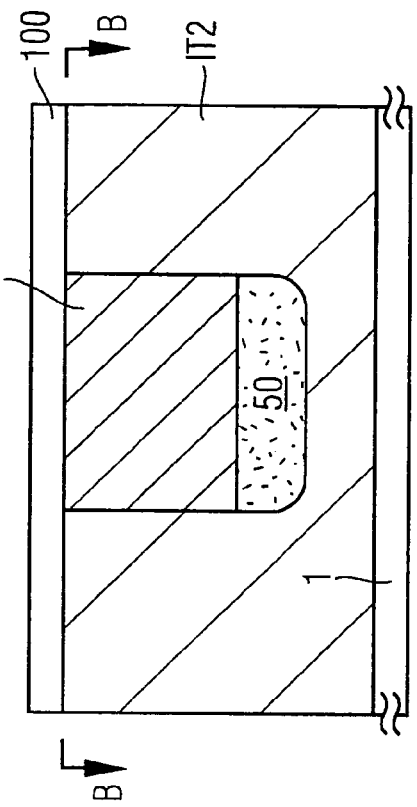
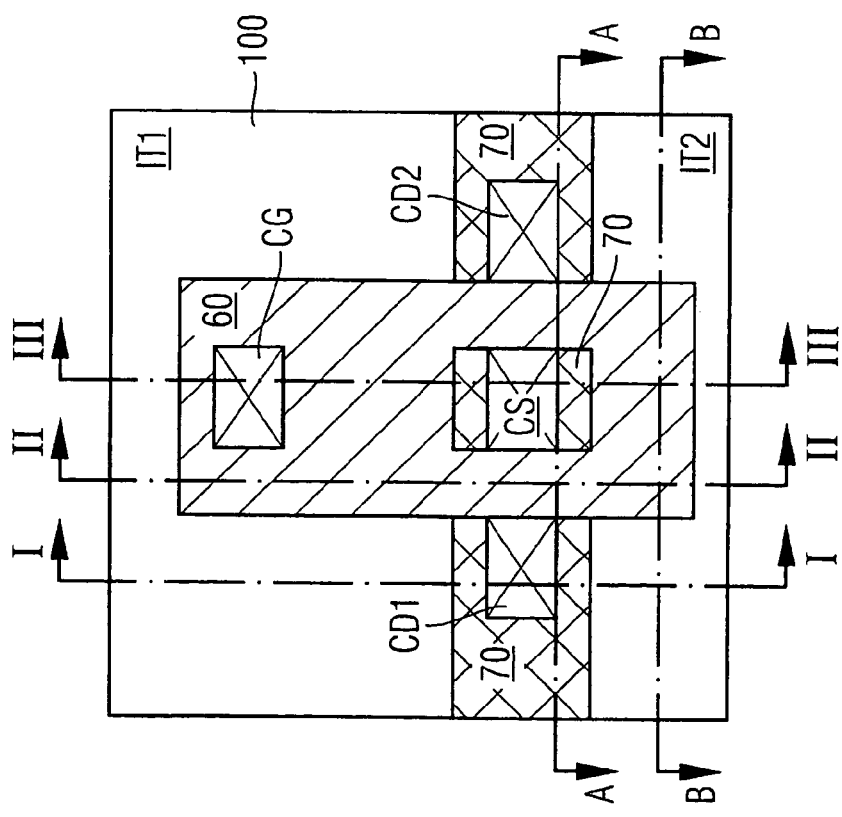

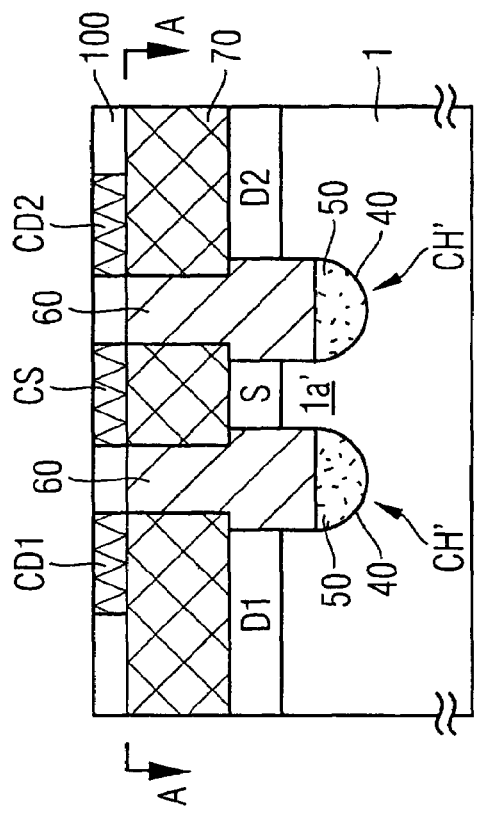
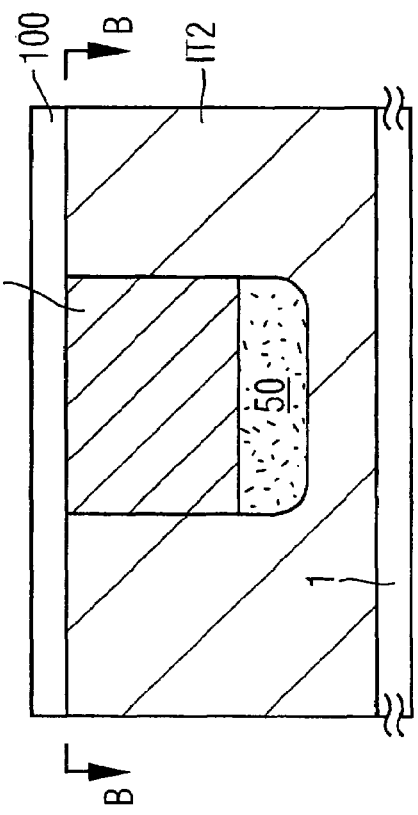
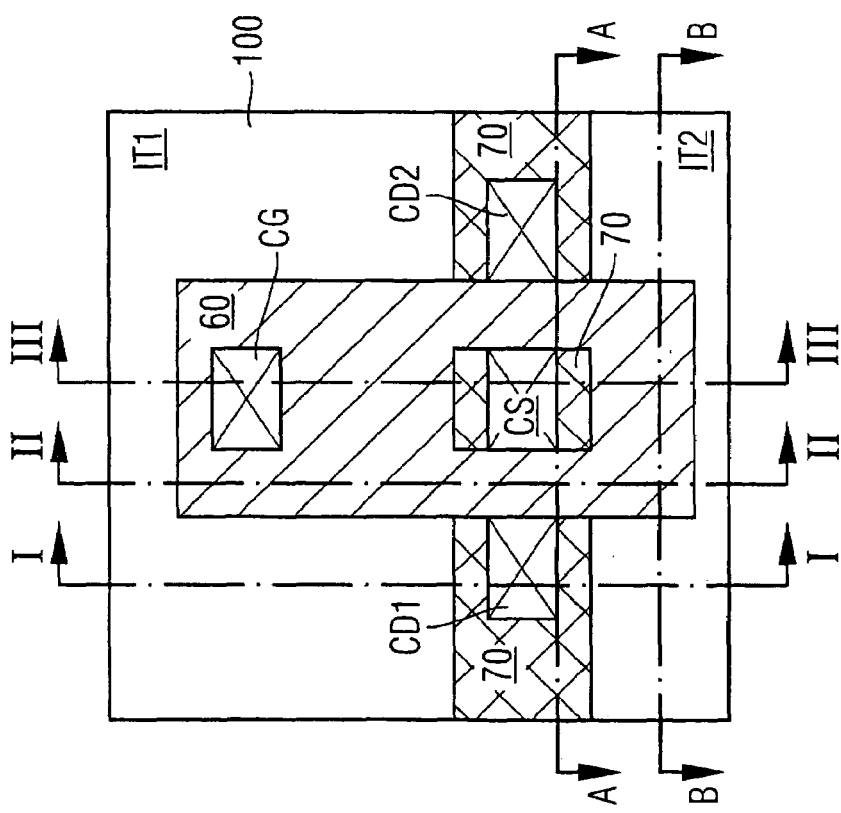

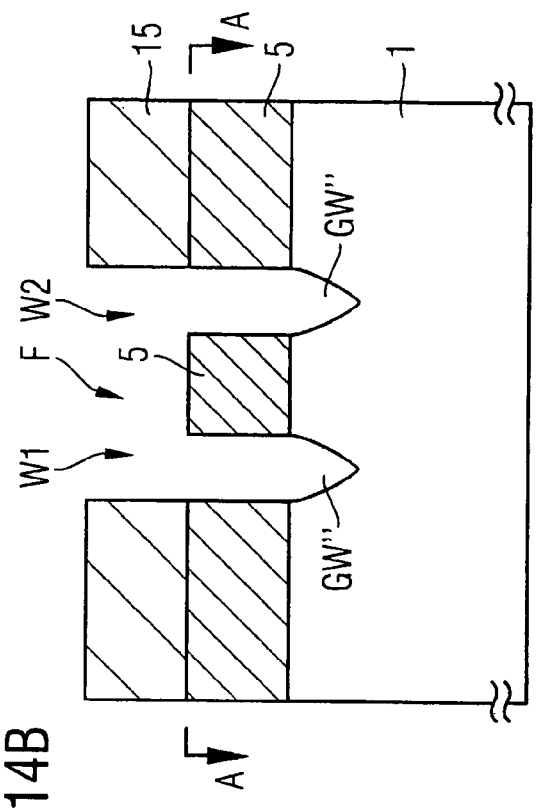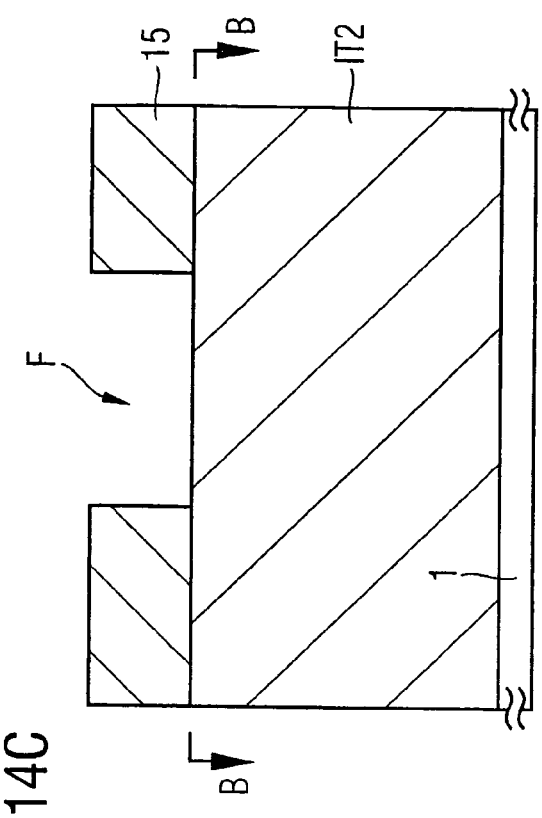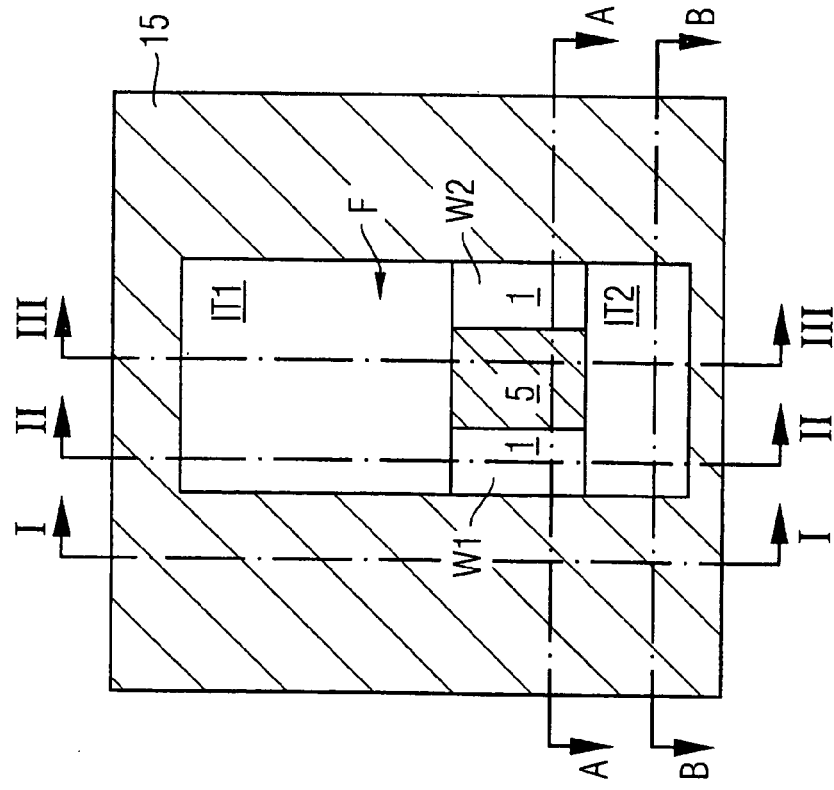

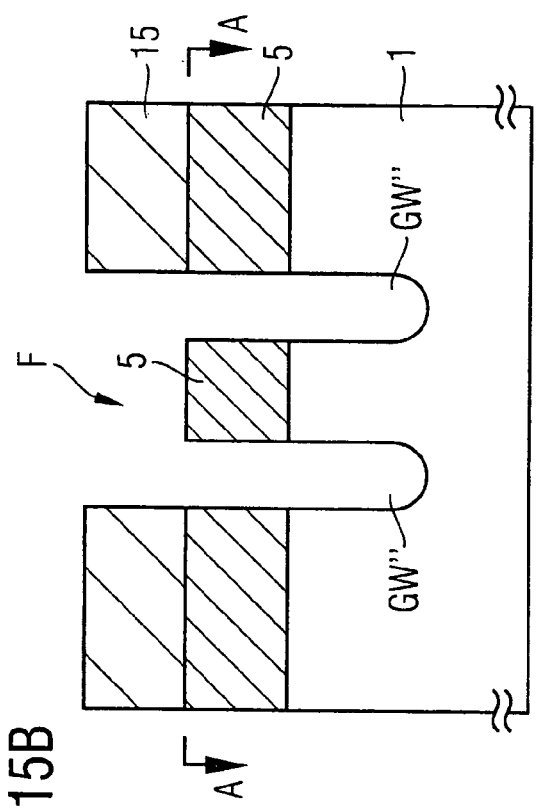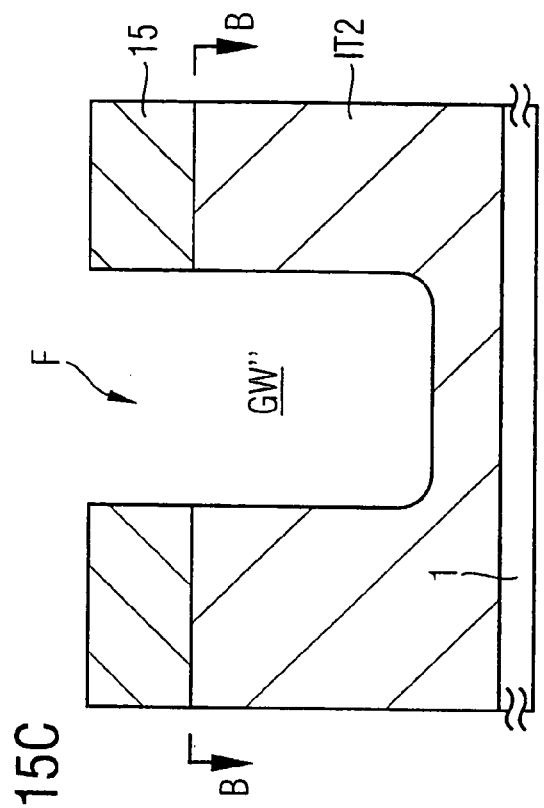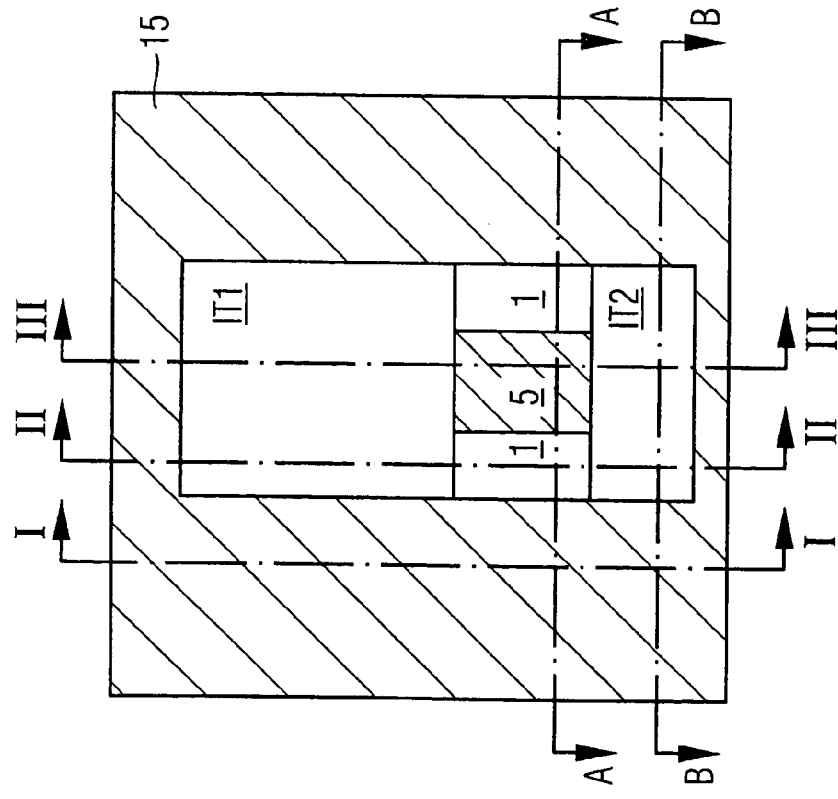

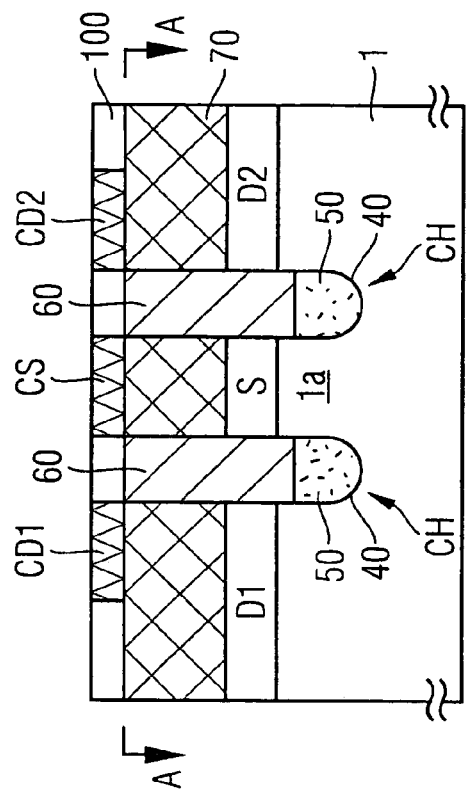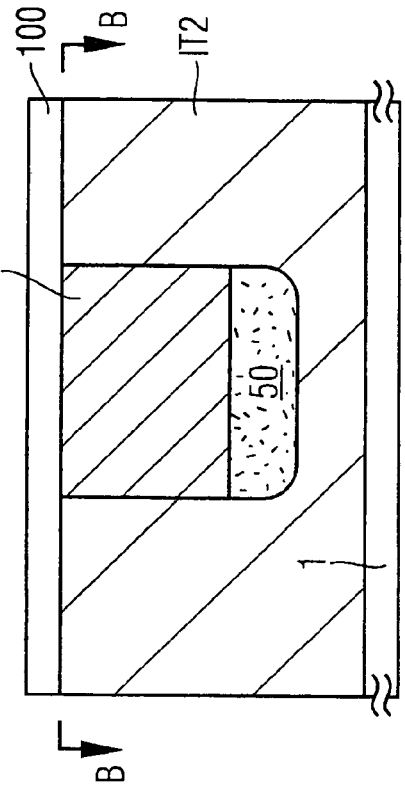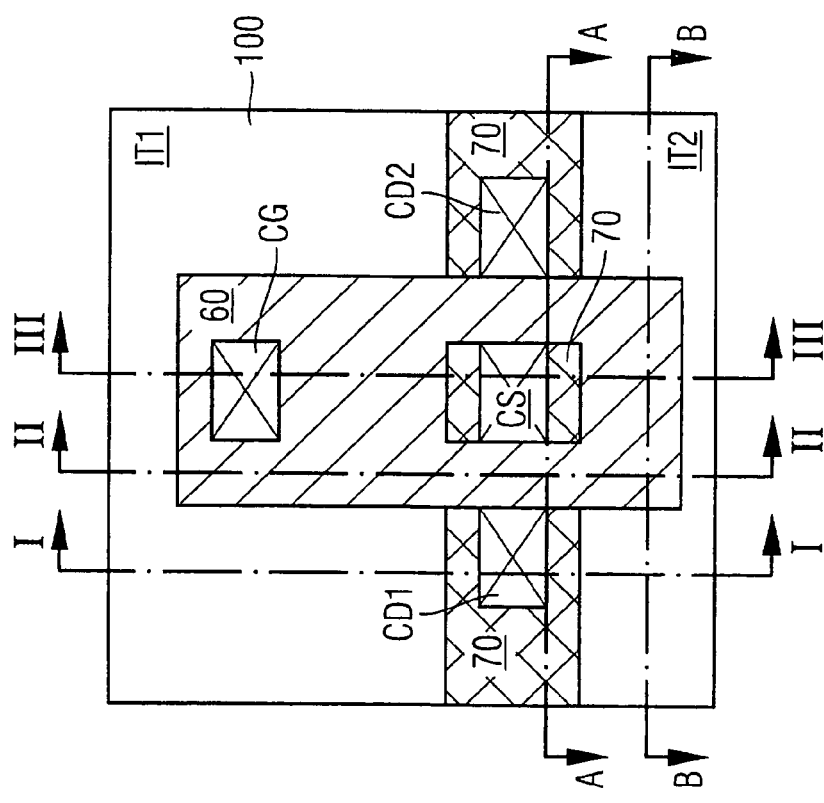

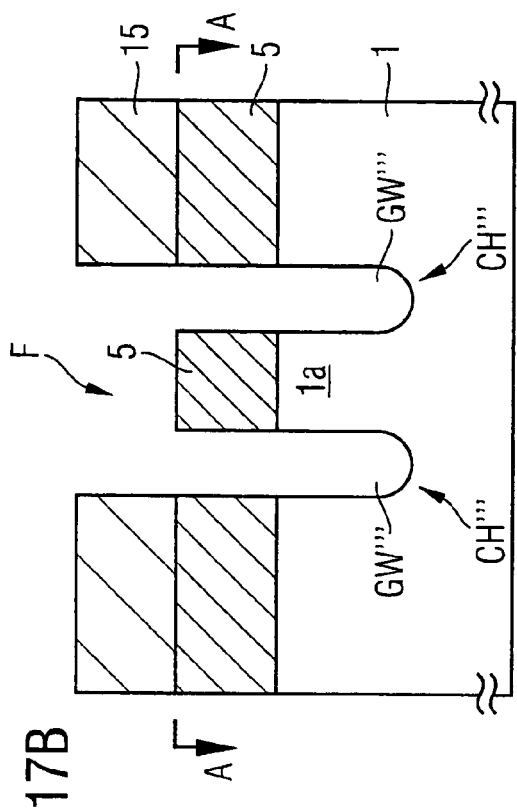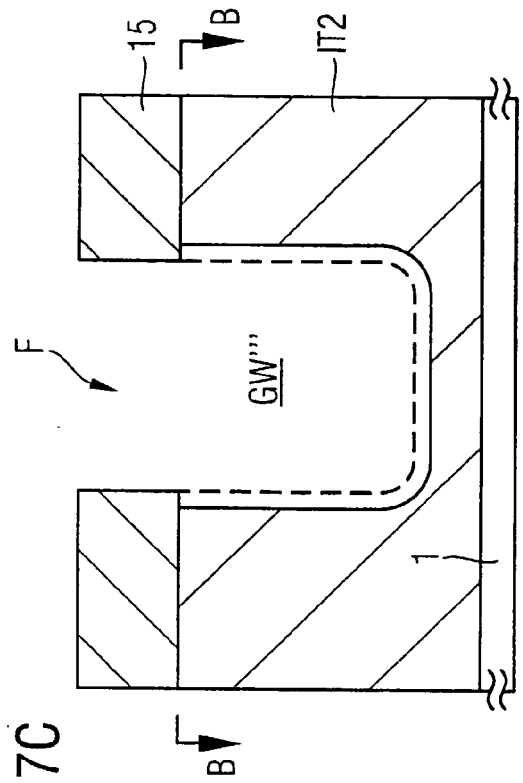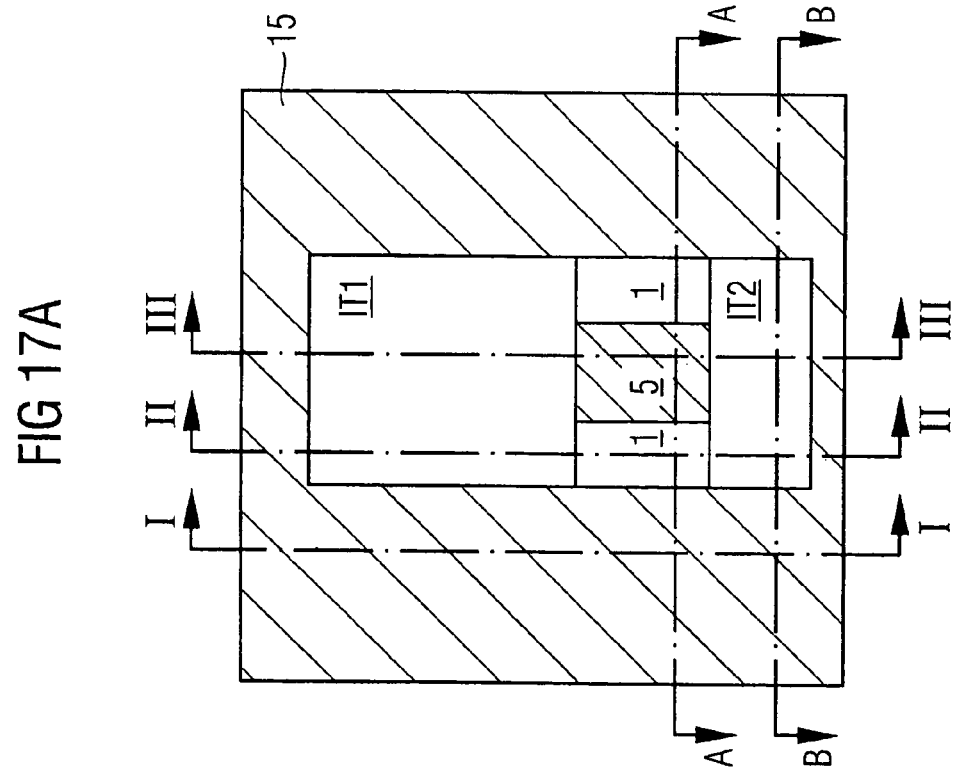

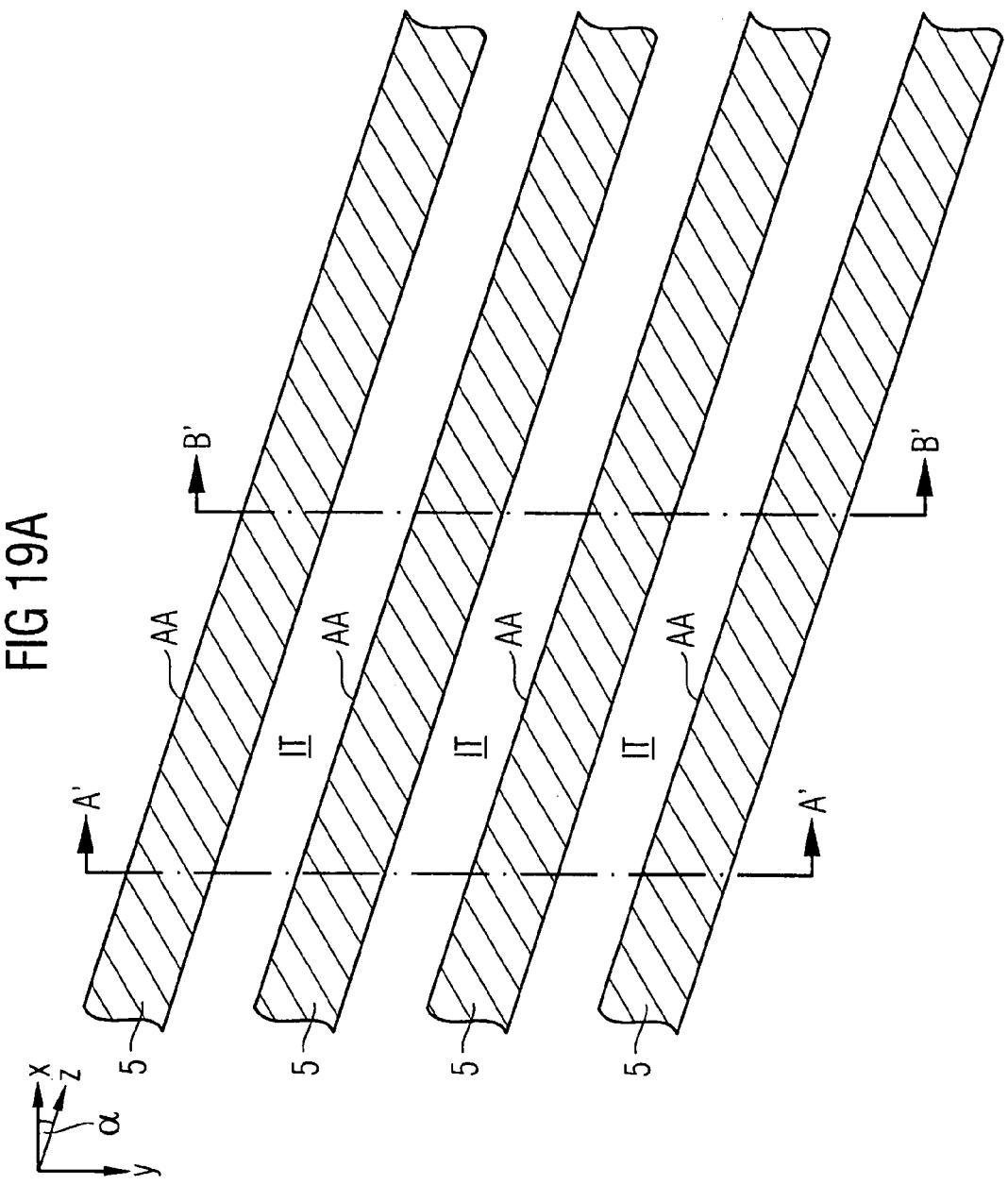

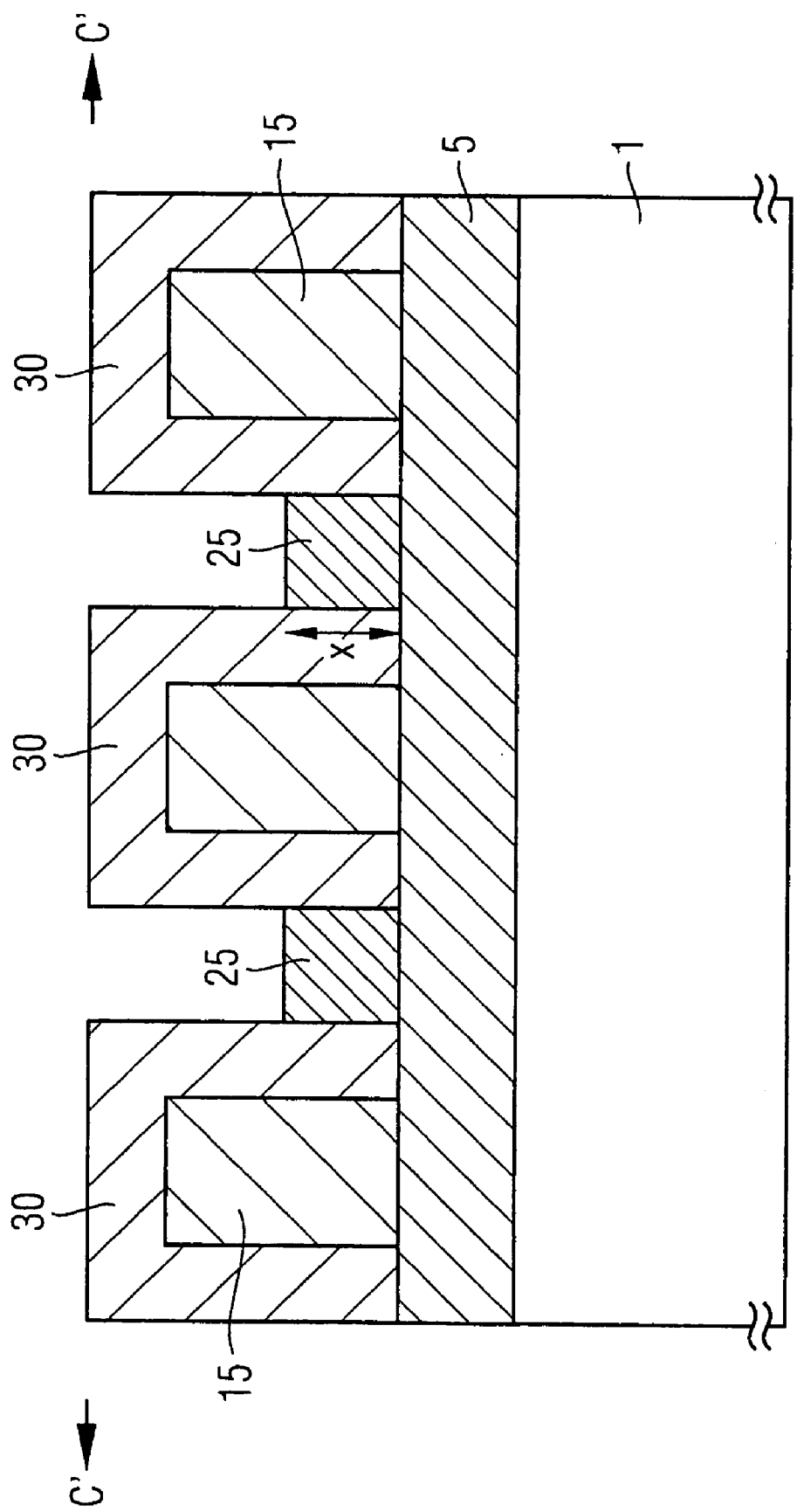

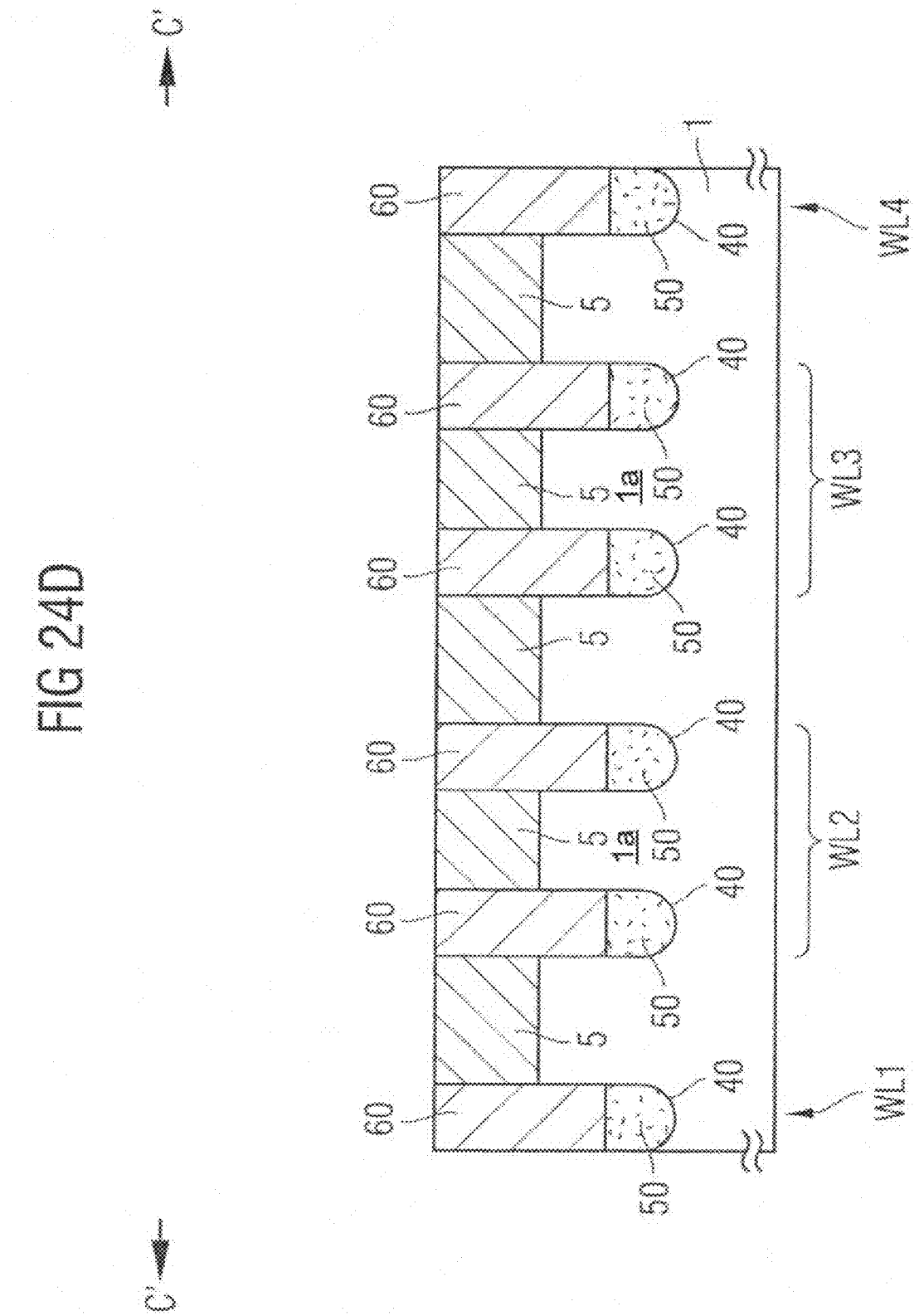

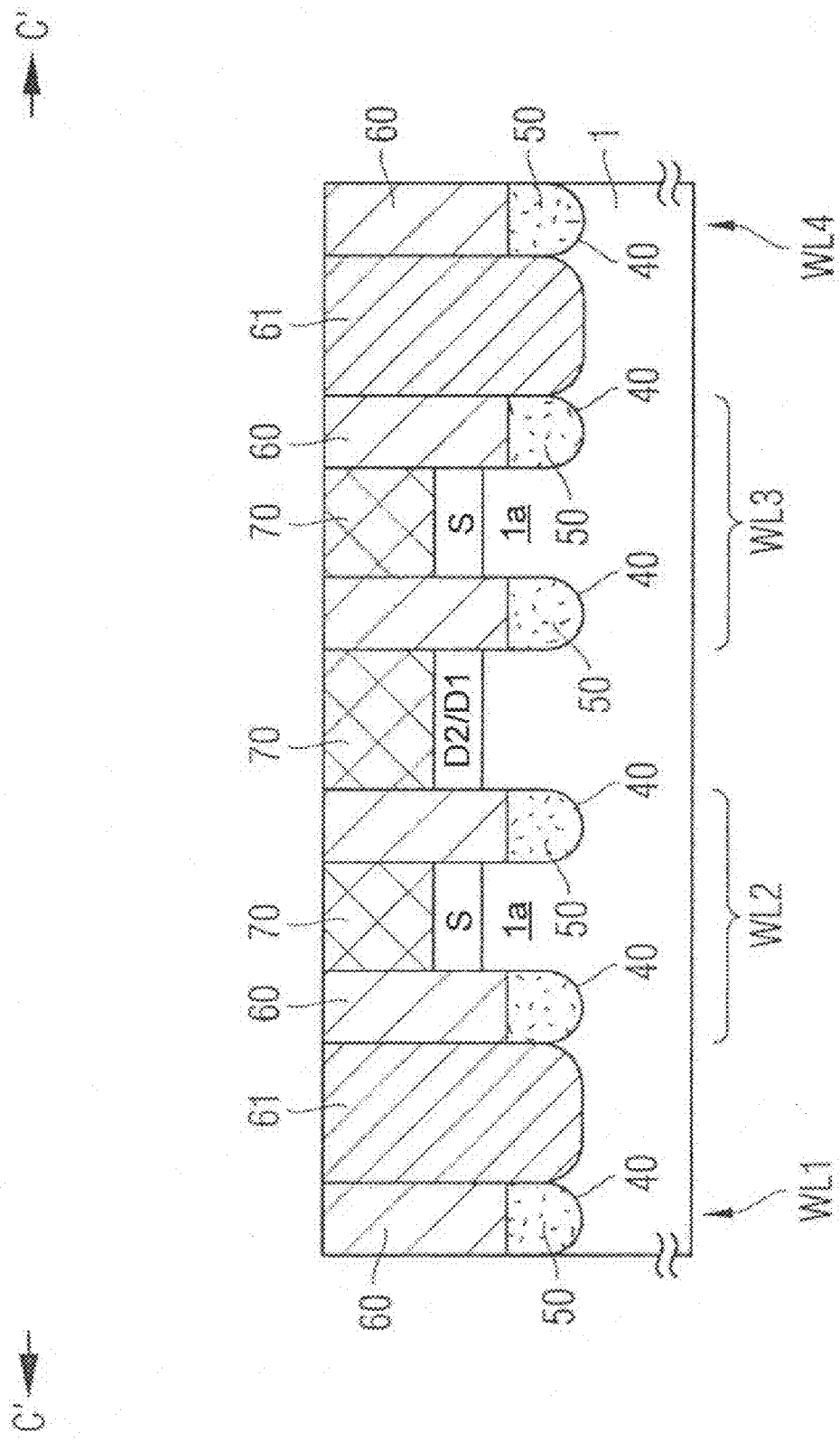

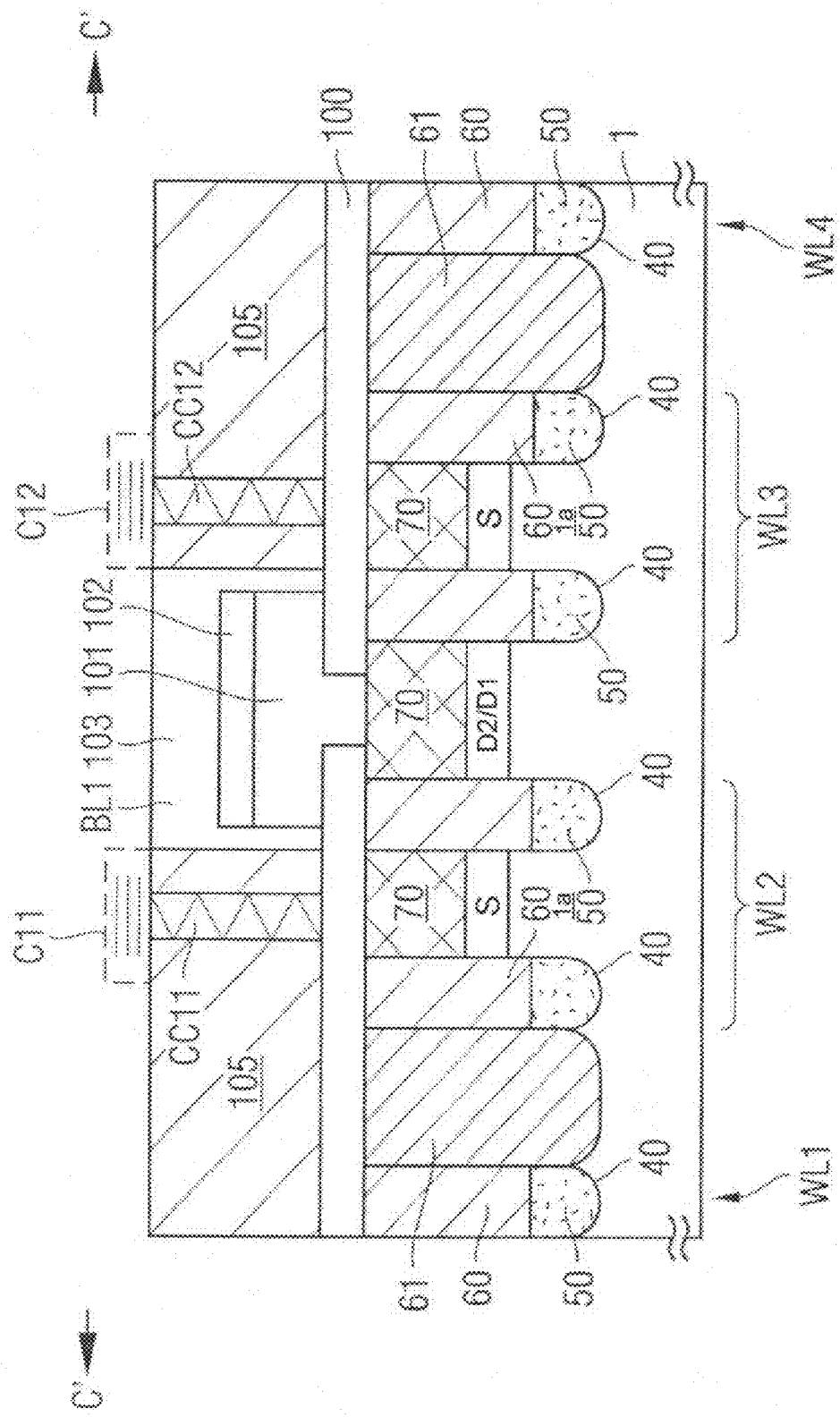

INTEGRATED MEMORY CELL ARRAY

BACKGROUND OF THE INVENTION

1. Field of the Invention

The present invention relates to an integrated memory cell array.

2. Description of the Related Art

Junction leakage of an integrated MOSFET transistor to the substrate is one of the key problems in device development. In DRAM applications, for example, these parameters have to be optimized for one contact only, i.e. an asymmetric device. All of these devices for DRAM applications need a body contact.

Recently, asymmetric planar devices, asymmetric three-dimensional devices, such as FINCUT or EUD or double gate devices have been proposed for DRAM applications. However, they all have a non-gated direct path from the node junction to the substrate.

However, still no satisfactory solution that is easy implementable has been found.

BRIEF SUMMARY OF THE INVENTION

According to a first aspect of the invention, an integrated memory cell array comprises a semiconductor substrate; a plurality of cell transistor devices formed along a plurality of parallel active area stripes of said substrate, said active area stripes running in a first direction and being laterally insulated from each other by intervening insulation trenches; each of said cell transistor devices including: a pillar formed in said semiconductor substrate; a gate trench surrounding said pillar; a first source/drain region formed in an upper region of said pillar; a gate dielectric formed on the bottom of said gate trench and surrounding a lower region of said pillar; a gate formed on said gate dielectric in said gate trench and surrounding a lower region of said pillar; and a second source/drain region formed in an upper region of said semiconductor substrate adjoining said gate trench; a plurality of parallel bitlines running in a second direction and being connected to respective first source/drain regions of said cell transistor devices; a plurality of wordlines running in a third direction and connecting the respective gates of said cell transistor devices; and a plurality of cell capacitor devices being connected to the second source/drain regions of said cell transistor devices.

According to a second aspect of the invention, an integrated memory cell array comprises a semiconductor substrate; a plurality of cell transistor devices including: a pillar formed in said semiconductor substrate; a gate trench surrounding said pillar; a first source/drain region formed in an upper region of said pillar; a gate dielectric formed on the bottom of said gate trench and surrounding a lower region of said pillar; a gate formed on said gate dielectric in said gate trench and surrounding a lower region of said pillar; and a second source/drain region formed in an upper region of said semiconductor substrate adjoining said gate trench; a plurality of bitlines being connected to respective first groups of first source/drain regions of said cell transistor devices; a plurality of wordlines connecting the respective gates of second groups of said cell transistor devices; and a plurality of cell capacitor devices being connected to the second source/drain regions of said cell transistor devices.

The basic idea underlying this invention is the formation of an array of memory cells having transistor devices with a fully surrounded gate around the contact on one source/drain side and a conventional contact on the other source/drain side. The source/drain side fully surrounded by the gate has no junction area towards the body which leads to a remarkable reduction of leakage current. The GIDL (GIDL=gate induced strain leakage) can be reduced by vertical arranged potential reduction area, i.e. a lowly doped area<$10^{18}$ cm$^{-3}$ between the highly doped source/drain side and the gate.

Preferred embodiments are listed in the respective dependent claims.

According to an embodiment, each of said cell transistor devices comprises a third source/drain region formed in an upper region of said semiconductor substrate adjoining said gate trench opposite to said second source/drain region, said second and third source/drain regions belonging to two different memory cells which share said first source/drain region and which have adjacent wordlines.

According to another embodiment, said second and third directions are orthogonal to each other and said first direction lies between said second and third directions.

According to another embodiment, said first direction forms an angle of between 15 and 25 degrees with said second direction.

According to another embodiment, said adjacent wordlines are insulated from another neighboring wordline by a respective insulation region formed in said active area stripe.

According to another embodiment, each of said cell transistor devices comprises a channel formed in the semiconductor substrate below the gate dielectric which has a curved upper surface in a direction perpendicular to a current flow direction.

According to another embodiment, said pillar has curved sidewalls.

According to another embodiment, each of said cell transistor devices comprises a channel formed in the semiconductor substrate below the gate dielectric which includes upper corners covered by said gate dielectric and gate.

According to another embodiment, said cell capacitor devices are formed above an associated second or third source/drain region.

In the Figures, identical reference signs denote equivalent or functionally equivalent components.

In each of FIG. 1 to 18, a) denotes a plain view, b) denotes a cross section along line A-A of the plain view of a), c) denotes a cross section along line B-B of the plain view of a), d) denotes a cross section along line I-I of the plain view of a), e) denotes a cross section along line II-II of the plain view of a), and f) denotes a cross section along line III-III of the plain view of a).

DESCRIPTION OF THE PREFERRED EMBODIMENTS

Figure 1D:
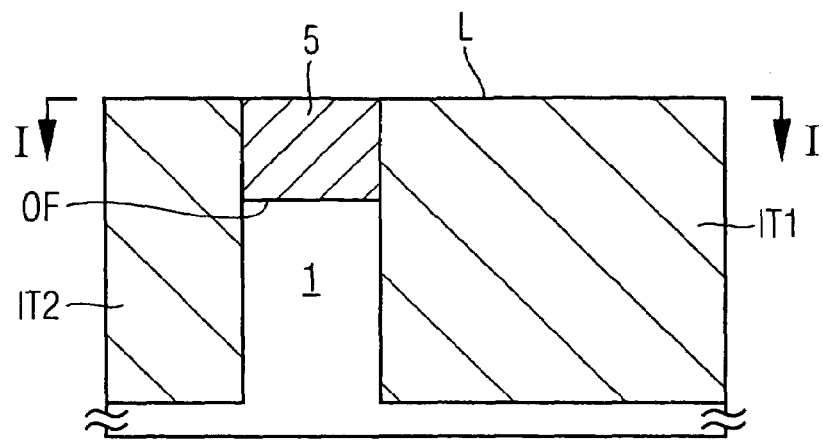
FIG. 1a)-f) to 10a)-f) show schematic layouts of a manufacturing method for an integrated transistor device used in a memory cell array according to a first embodiment of the present invention.
Figure 1E:
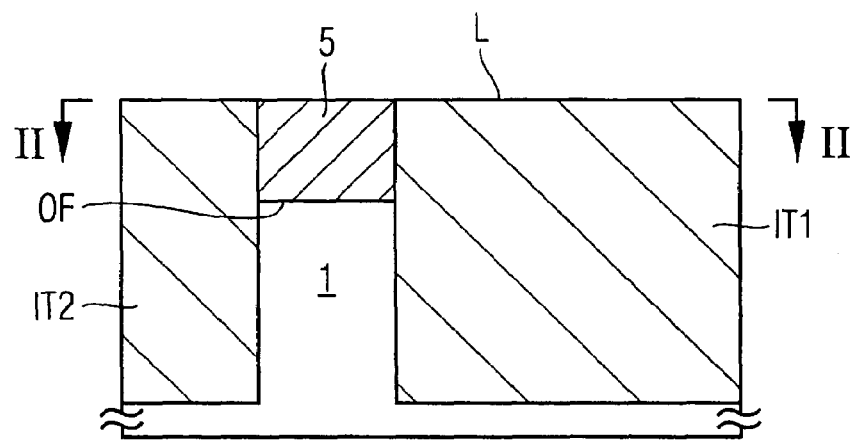
Figure 1F:
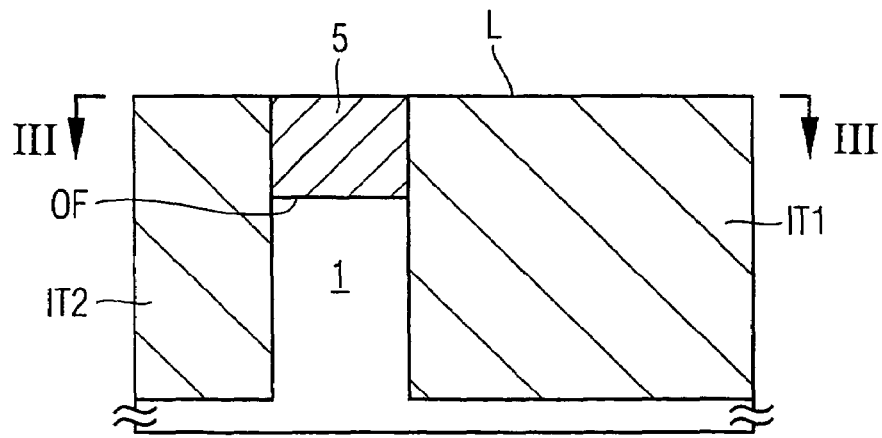

FIG. 1a)-f) to 10a)-f) show schematic layouts of a manufacturing method for an integrated transistor device used in a memory cell array according to a first embodiment of the present invention.

FIG. 1a)-f) show a silicon semiconductor substrate 1 in which insulation trenches IT1 and IT2 filled with a dielectric insulating material such as silicon dioxide have been formed. The formation of said insulating trenches IT1, IT2 has been carried out by means of a silicon nitride mask stripe 5, provided on an upper surface OF of said substrate 1. After an etch step for forming the insulation trenches IT1, IT2, the insulating filling material has been deposited and treated by a chemical mechanical polishing step wherein the silicon nitride mask stripe 5 has been used as a polish stop. Therefore, the upper surface of the silicon nitride mask stripe 5 and the insulation trenches IT1, IT2 are on a same level L of height. It should be mentioned that the thickness of the silicon nitride mask stripe 5 amounts to x where x is in the order of several 25-200 nm.

Although not shown here, it is clear that insulation trenches could also be provided at the remaining two sides of the layout of FIG. 1a).

Figure 2D:
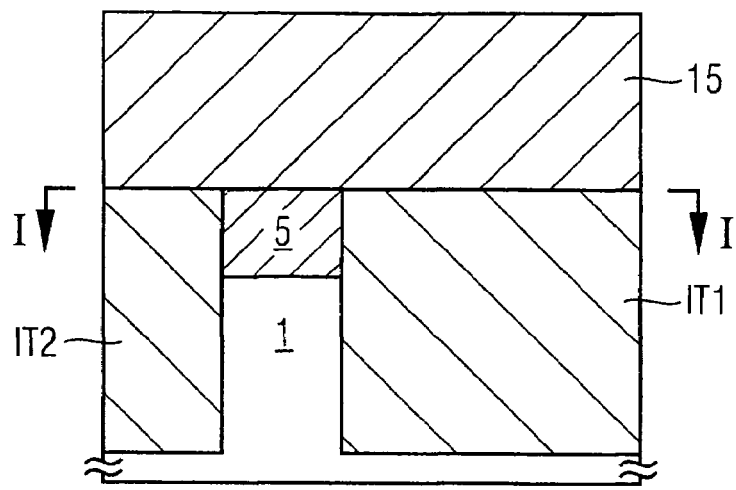
Figure 2E:
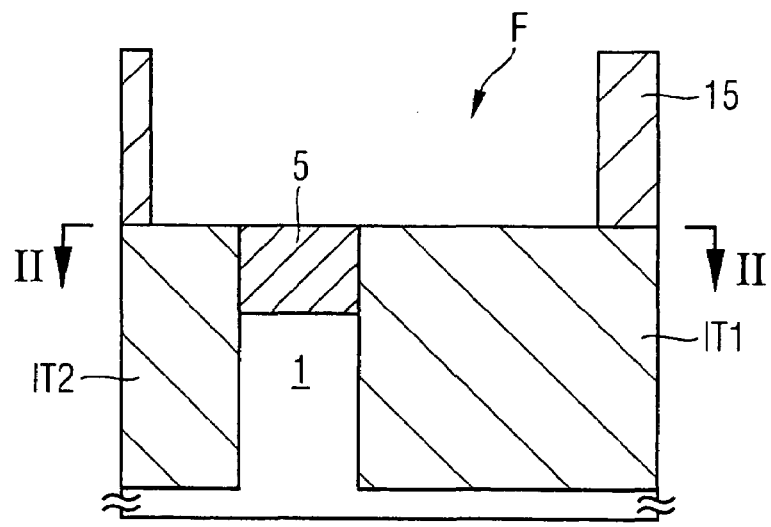
Figure 2F:
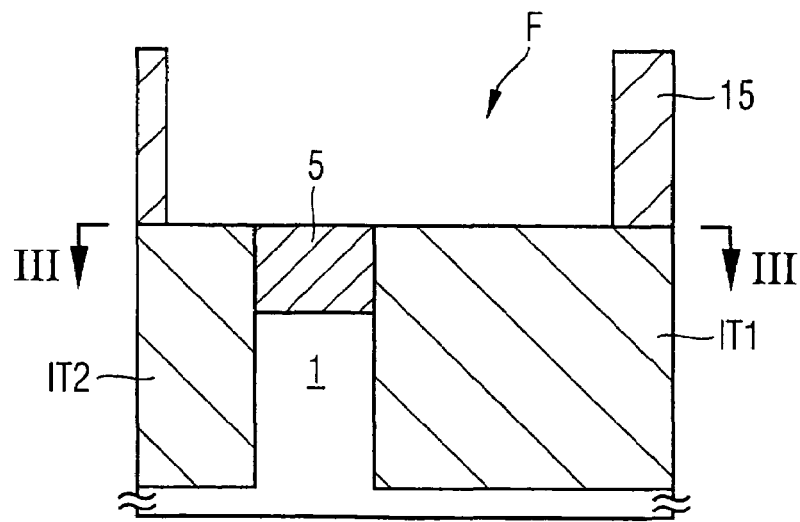

In a subsequent process step shown in FIG. 2a)-f), a hard mask 15 is formed on the structure of FIG. 1a)-f) having a thickness of 2x, i.e. double the thickness of the silicon nitride mask stripe 5 lying thereunder. The material of said hard mask 15 is preferably also silicon nitride. The hard mask 15 includes a window F which exposes a part of said silicon nitride mask stripe 5 and of said insulation trenches IT1, IT2. It should be mentioned that during the step of forming said hard mask window F, the underlying oxide of said insulation trenches IT1, IT2 can be used for endpoint detection.

Figure 3D:
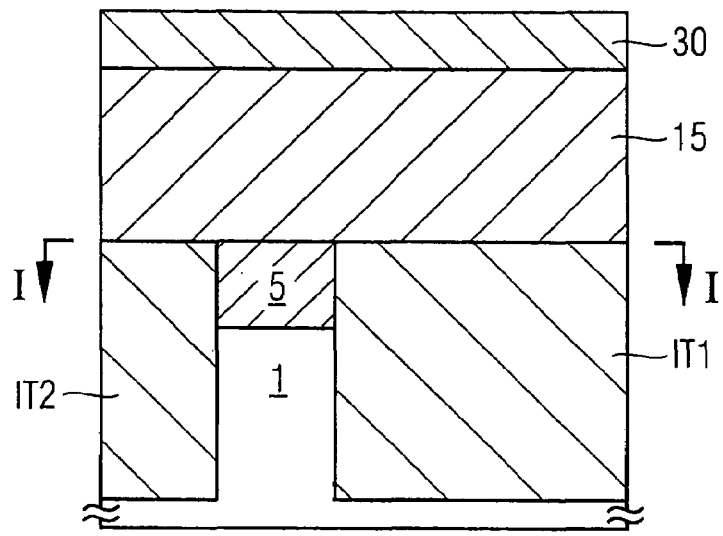
Figure 3E:
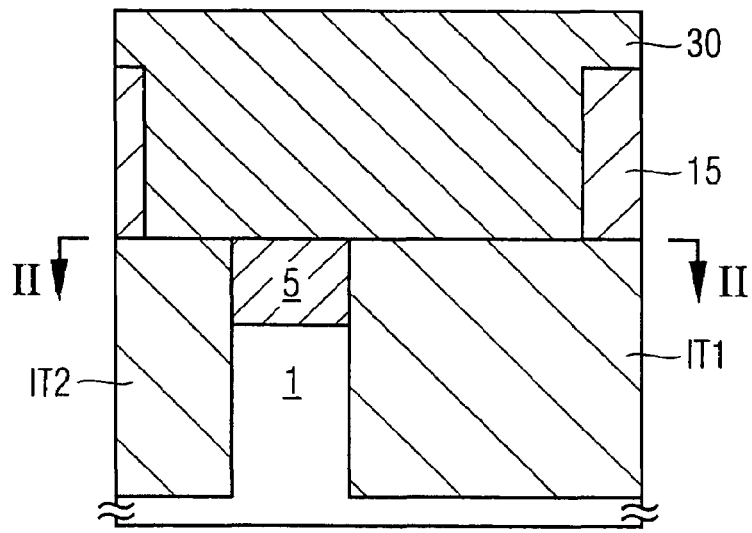
Figure 3F:
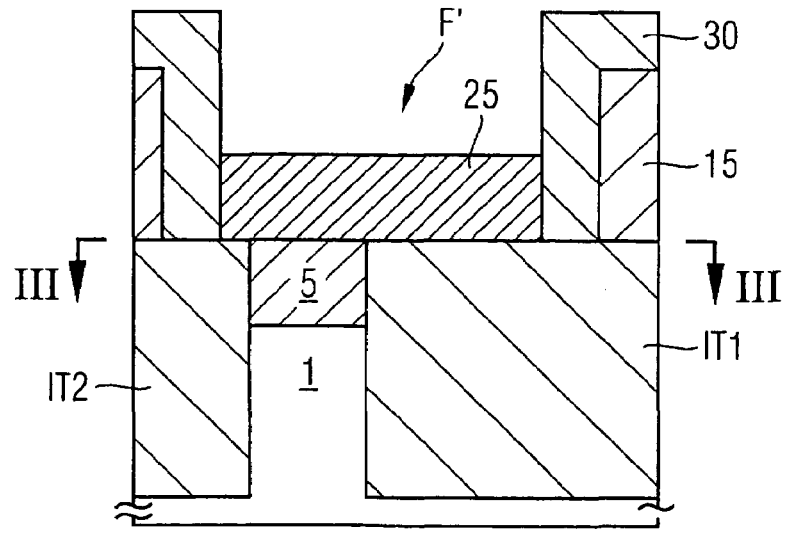

In a next process step which is depicted in FIG. 3a)-f), a silicon oxide liner layer 30 is deposited on the structure of FIG. 2a)-f) and subjected to an oxide liner spacer etch step for opening said oxide liner layer 30 only on the bottom of said window F such that a smaller window F' is formed. Thereafter, another silicon nitride layer 25 is deposited and etched back in said smaller window F' to a final thickness of x, i.e. the thickness of said silicon nitride mask stripe 5 or half of the thickness of said hard mask 15.

Figure 4D:
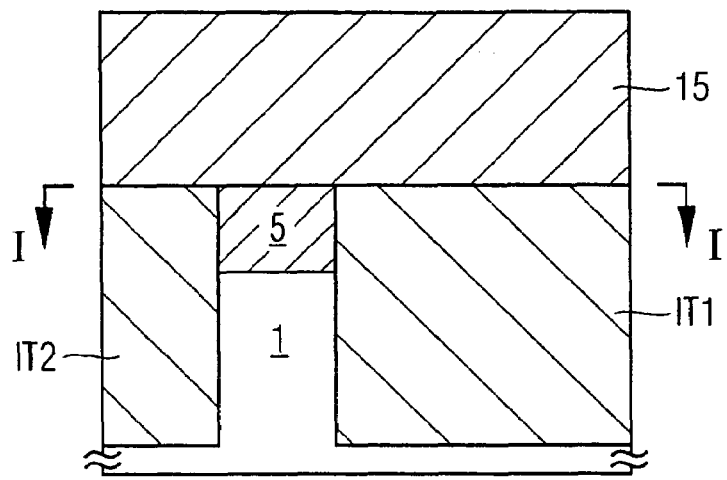
Figure 4E:
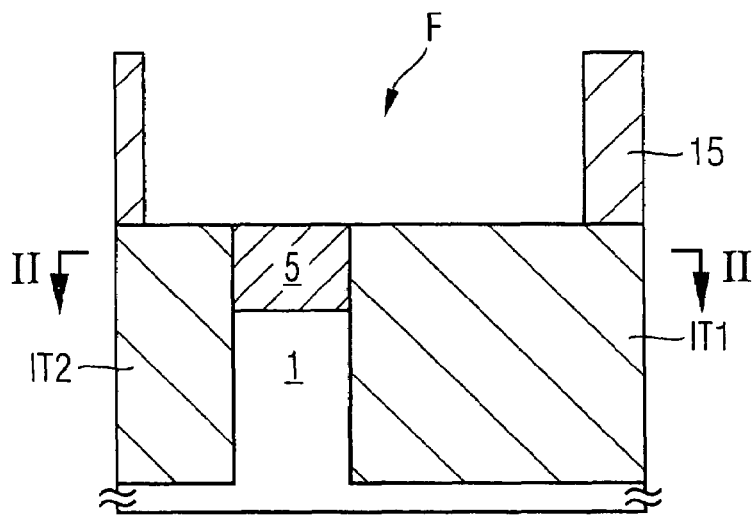
Figure 4F:
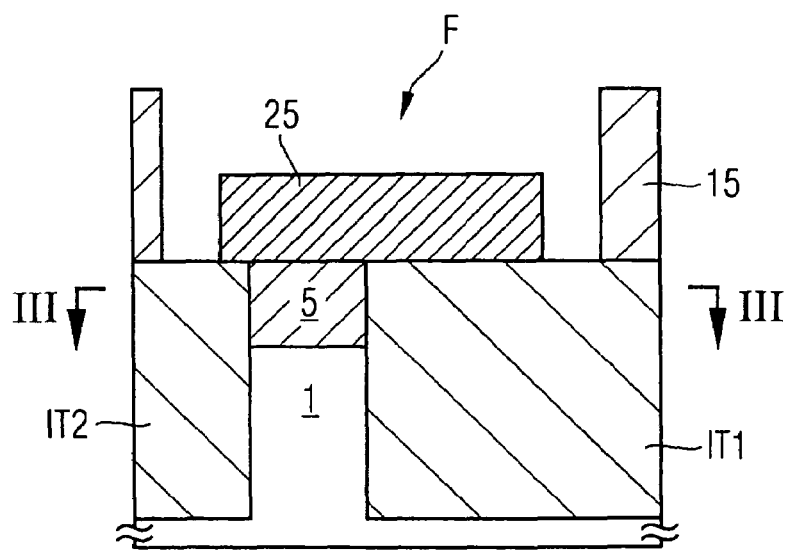

Thereafter, as shown in FIG. 4a)-f) the silicon oxide liner layer 30 is stripped in an etch step, said etch step being stopped on the upper surface of said hard mask 15. As may be obtained from FIG. 4a), the process state of FIG. 4a)-f) differs from the process status of FIG. 2a)-f) by the additional silicon nitride stripe 25 having the extensions of said smaller window F'.

Figure 5B:
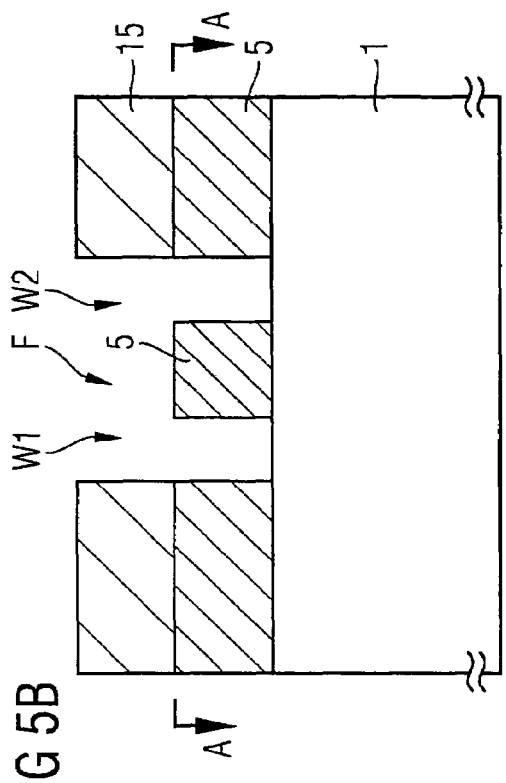
Figure 5C:
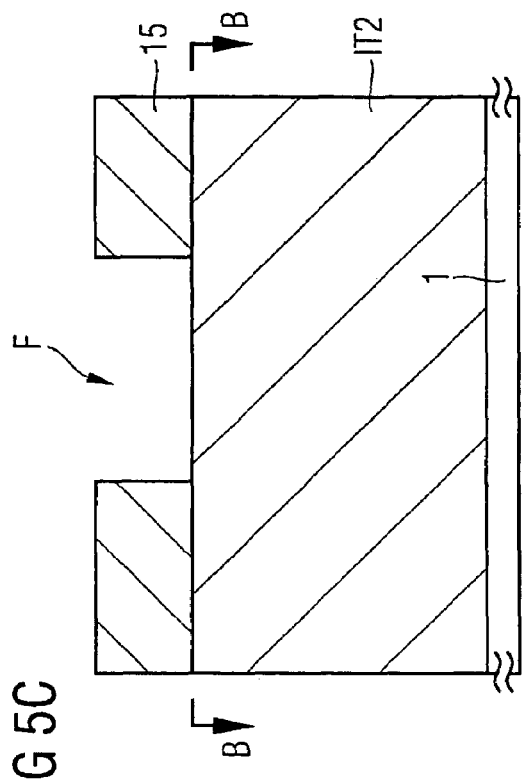
Figure 5A:
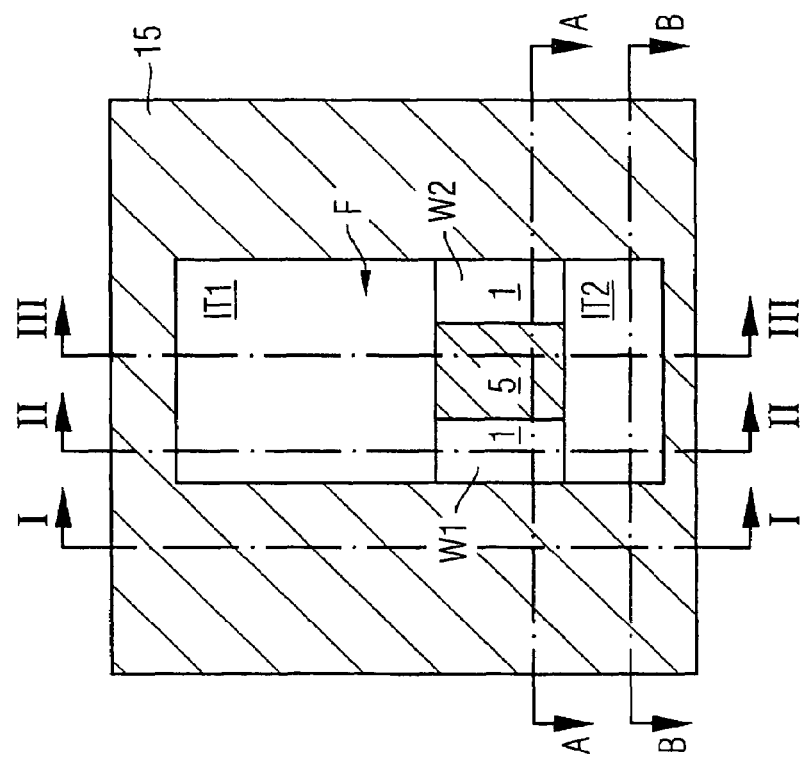
Figure 5D:
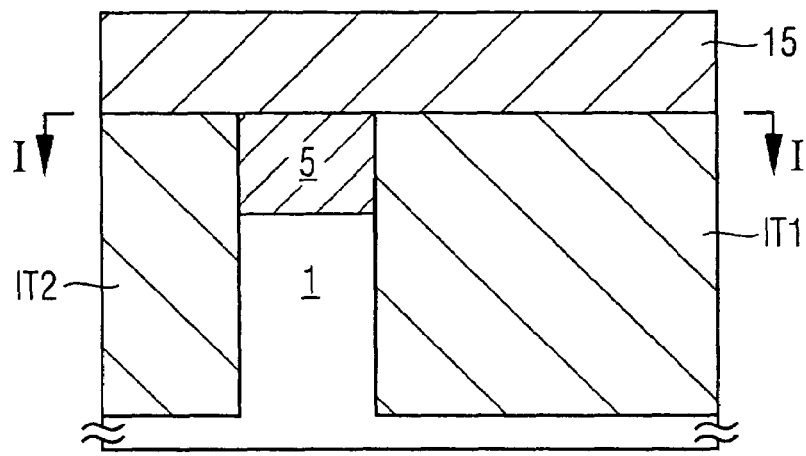
Figure 5E:
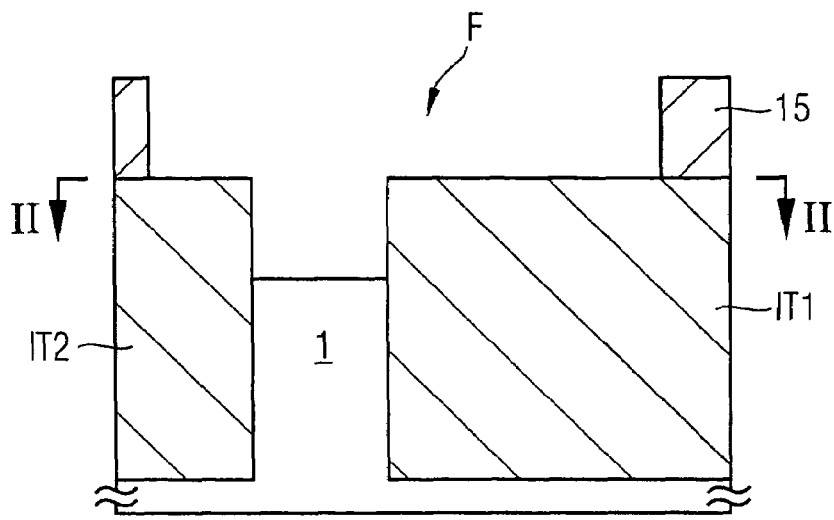
Figure 5F:
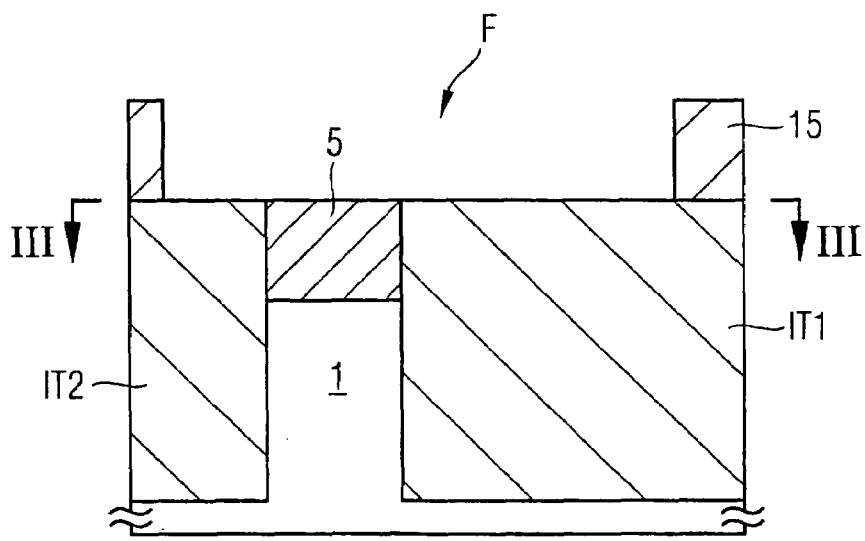

In a next process step, a transfer etch is performed which means that the exposed silicon nitride layers 5, 15, 25 are reduced by thickness of x which results in the process state shown in FIG. 5a)-f). This transfer etch step etches silicon nitride selective to silicon oxide and to silicon. Thus, two windows W1, W2 exposing said substrate 1 are formed between said insulation trenches IT1, IT2, said windows W1, W2 being separated by a part of said silicon nitride mask stripe 5.

Figure 6D:
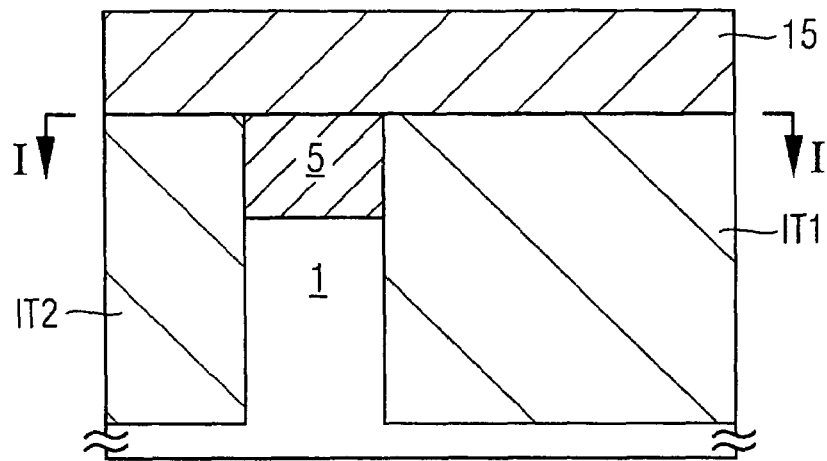
Figure 6E:
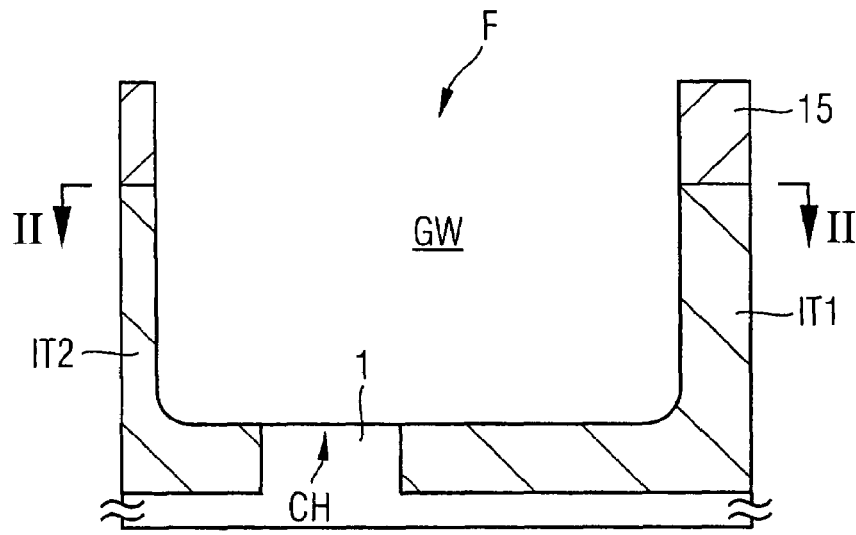

As may be obtained from FIG. 6a)-f), a combined silicon oxide/silicon etch step is now performed for forming a gate trench GW having. The gate trench has one depth in the substrate 1 and in the neighboring insulation trenches IT1, IT2. Therefore, the etching must proceed much faster in silicon oxide.

Alternatively, a silicon oxide etch step may be performed first, and thereafter a silicon oxide/silicon etch step having no selectivity.

Figure 6F:
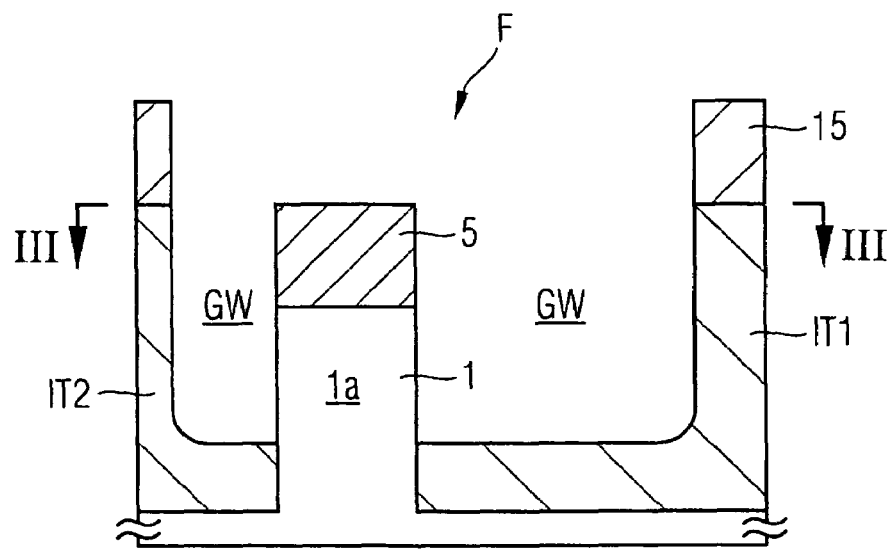

The etch process for said gate trench GW forms a pillar 1a in said substrate 1 which is completely surrounded by said gate trench GW, as may be particularly obtained from FIG. 6f). In the substrate 1 below the bottom of the gate trench GW, there is the channel of the transistor device to be formed.

After said etching process of said gate trench GW, optionally channel implants into said windows W1, W2 may be performed for adjusting the characteristics of the transistor channel CH.

Having regard to FIG. 7a-f), a gate dielectric layer 40, for example made of silicon oxide, is formed on the exposed silicon substrate 1 in said gate trench GW, f.e. by thermal oxidation or by high-k material deposition or a combination thereof. Thereafter, a polysilicon layer 50 is deposited and recessed in said gate trench GW which polysilicon layer 50 constitutes the gate of the transistor device to be formed. It should be mentioned that the material for the gate is not limited to polysilicon, but also other conductive materials can be used, such as metals, TiN, silicides etc.

Thereafter, another silicon oxide layer 60 is deposited over the entire structure and polished back to the upper surface of the remaining hard mask 15 by a chemical mechanical polishing step. This leads to the process state shown in FIG. 7a)-f).

Figure 7B:
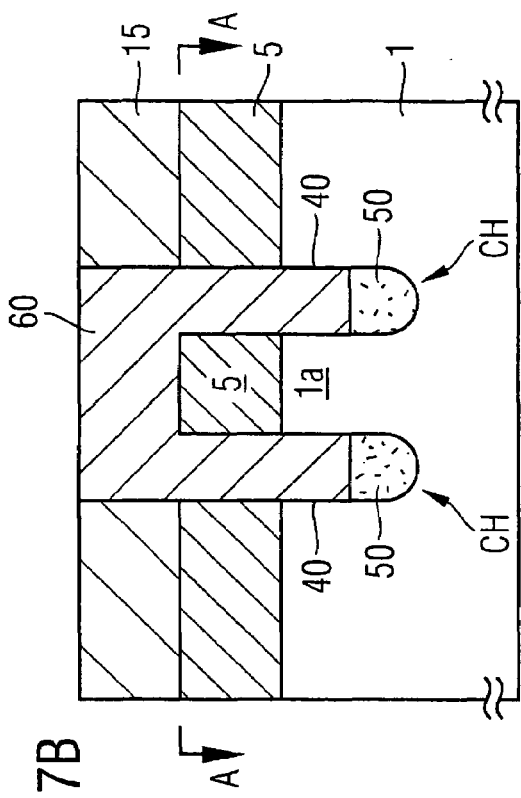
Figure 7C:
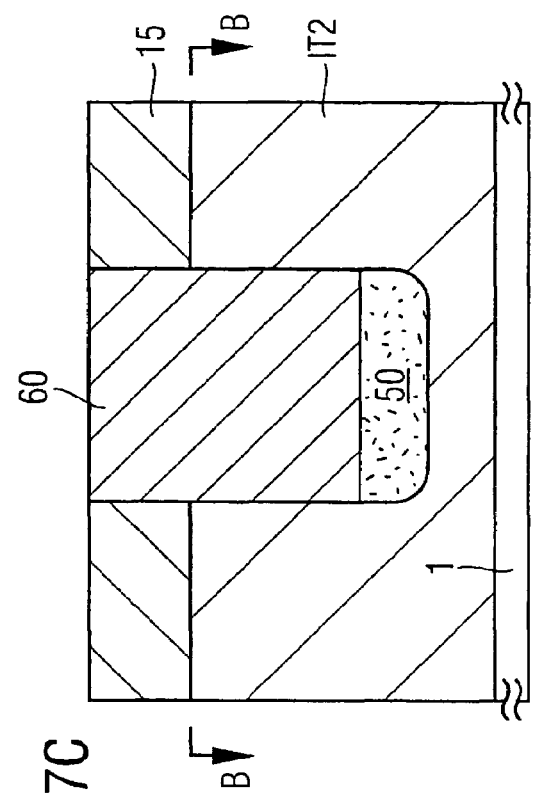
Figure 7A:
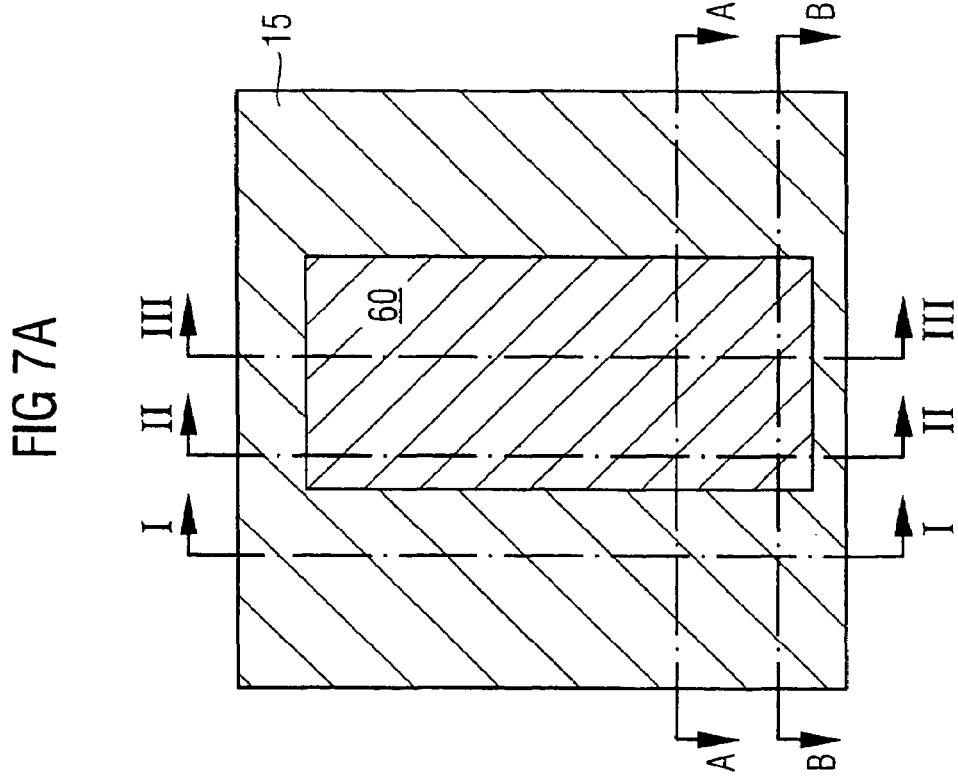
Figure 7D:
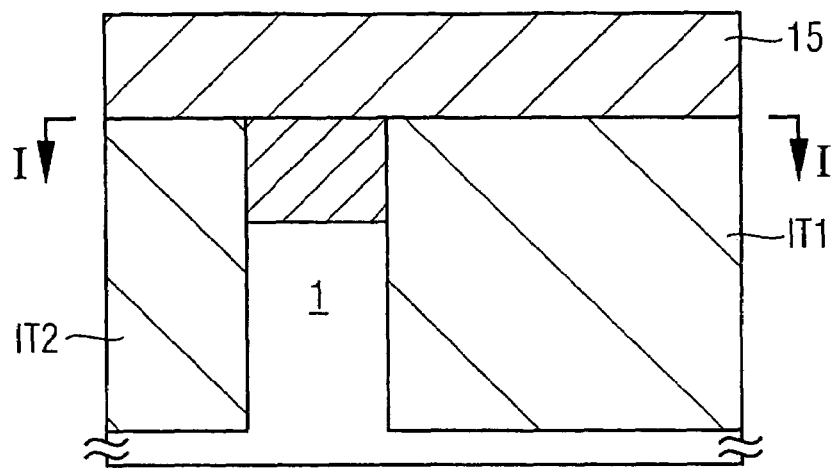
Figure 7E:
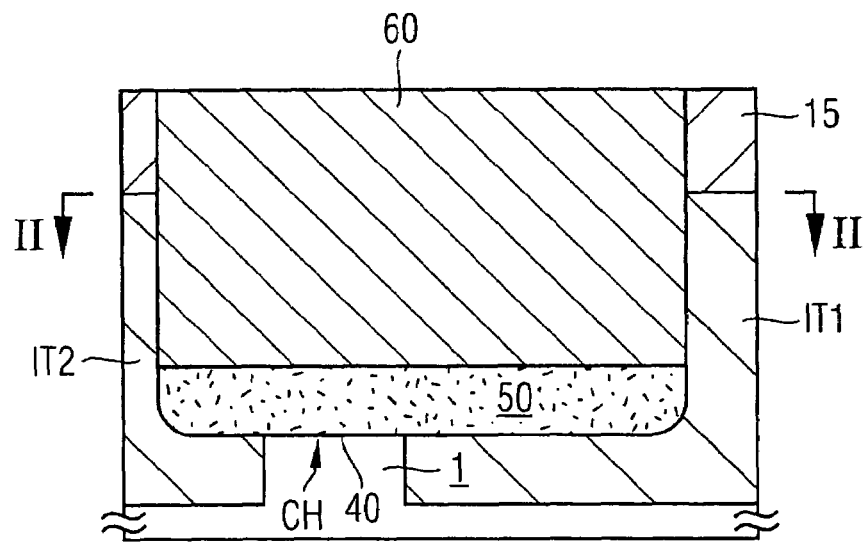
Figure 7F:
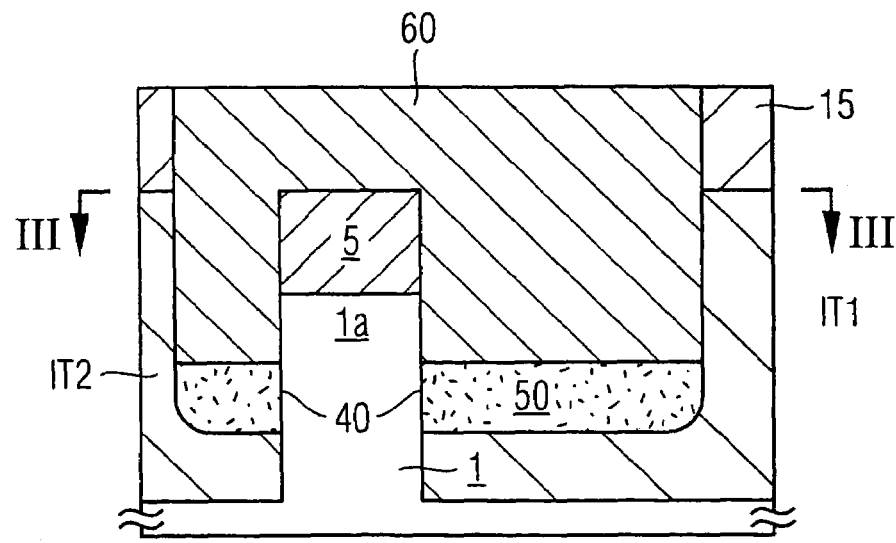
Figure 8D:
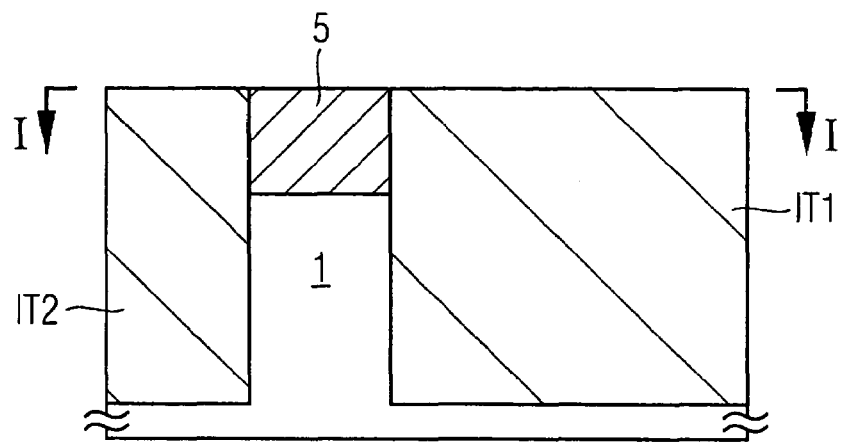
Figure 8E:
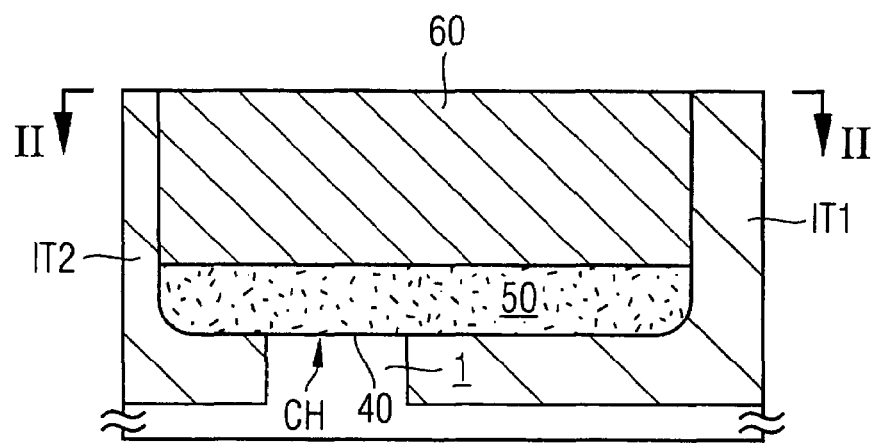
Figure 8F:
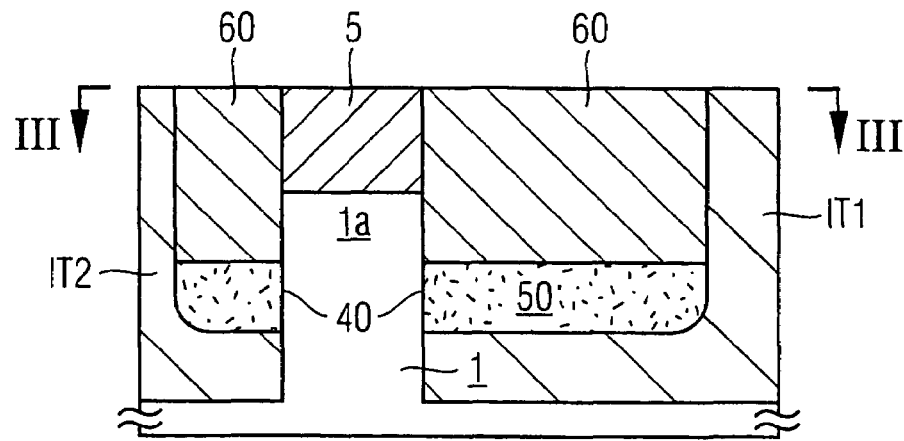

In another process step which is illustrated in FIG. 8a)-f), an silicon oxide/silicon nitride etch step is performed which removes a thickness of x of said silicon oxide layer 60 and the remaining thickness x of said hard mask 15 from the structure of FIG. 7a)-f).

Figure 9D:
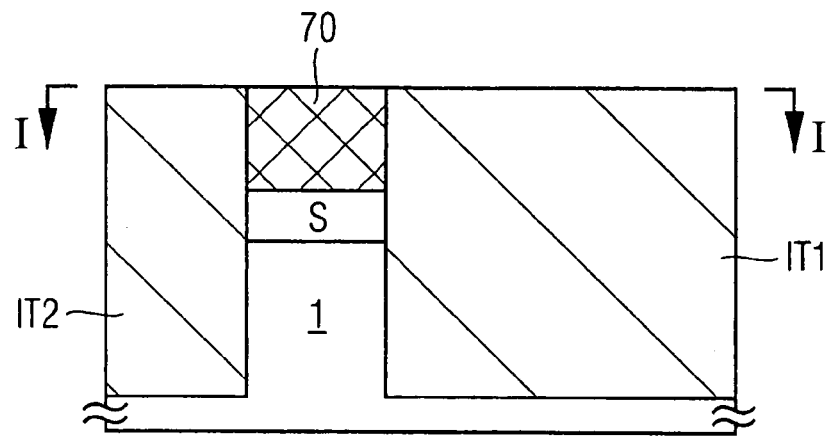
Figure 9E:
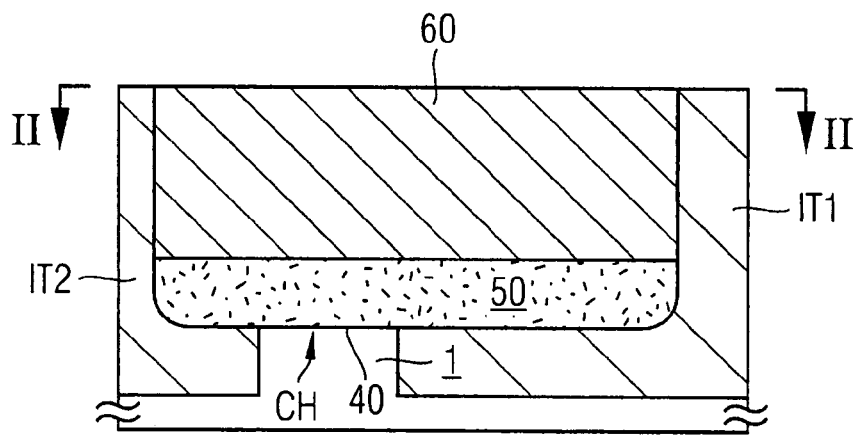
Figure 9F:
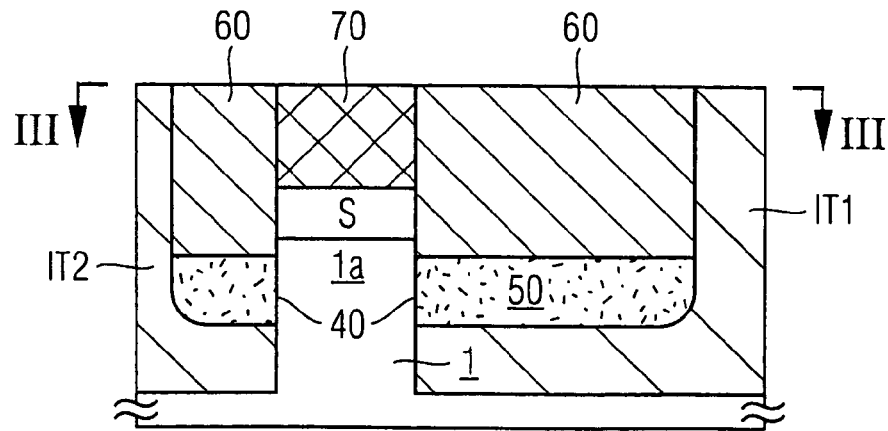

Further, with reference to FIG. 9a)-f), the exposed parts of said silicon nitride mask stripe 5 are stripped by a selective etch step, and thereafter an ion implantation is performed into the exposed surface of the substrate 1 in order to form a first source/drain region S in said pillar 1a and second and third source/drain regions D1, D2 at the surface OF of said substrate 1. Then, a poly-silicon layer 70 is deposited and polished back to the level L of the upper surface of the adjoining insulation trenches IT1, IT2.

Figure 10D:
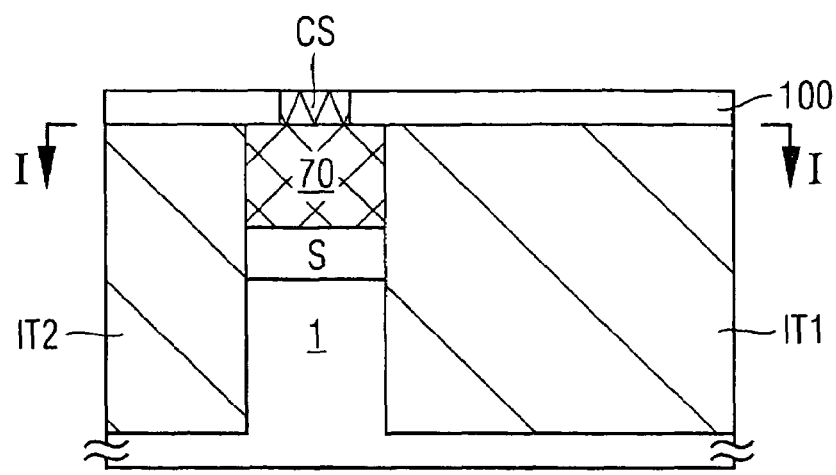

Finally, as shown in FIG. 10a)-f), another insulating layer 100, for example made of silicon oxide, is deposited over the entire structure, and thereafter source/drain contacts CD1, CD2, source/drain contact CS and a gate contact CG are formed for contacting said first and second source/drain regions D1, D2, said source/drain region S, and said gate region 50.

Figure 10E:
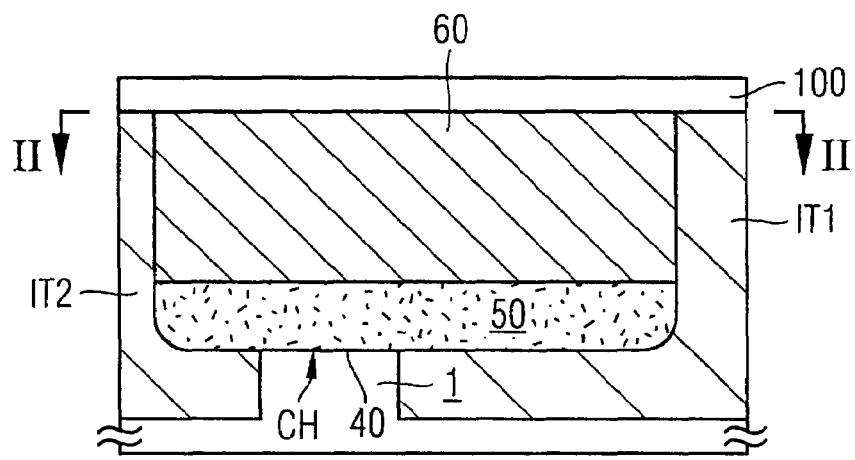
Figure 10F:
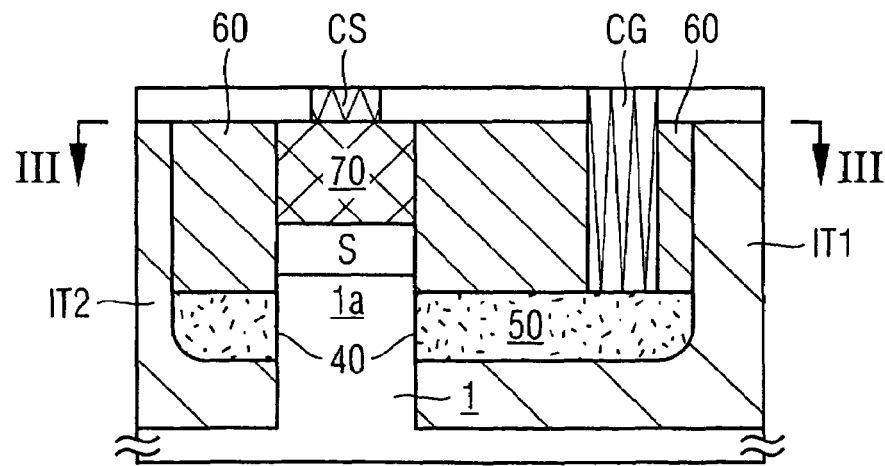

As may be seen in FIG. 10e), the channel CH of the device according to this embodiment has a planar upper surface in a direction perpendicular to the current flow direction.

It should be mentioned here that the source/drain contact CD2 as well as the source/drain region D2 are optional and not necessary. In particular, this source/drain region D2 and source/drain contact CD2 are useful, if the transistor according to this embodiment is used symmetrically.

Figure 11B:
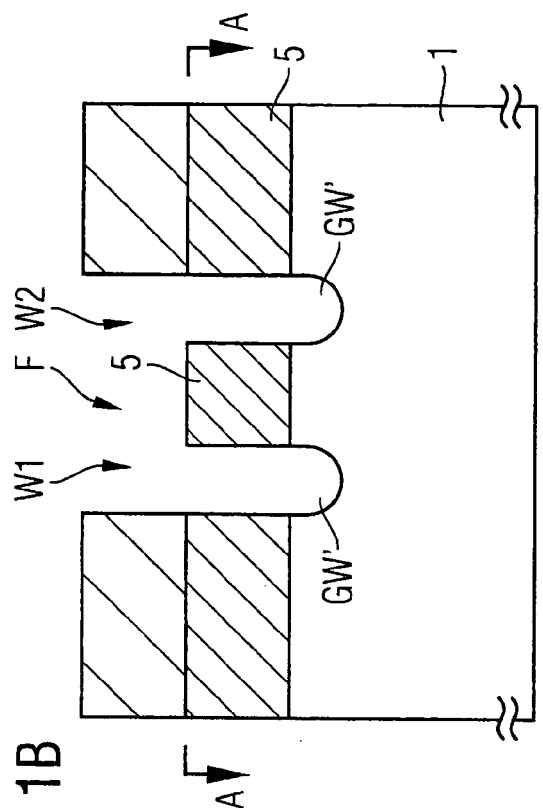
FIG. 11a)-f) to 13a)-f) show schematic layouts of a manufacturing method for an integrated transistor device used in a memory cell array according to a second embodiment of the present invention.
Figure 11C:
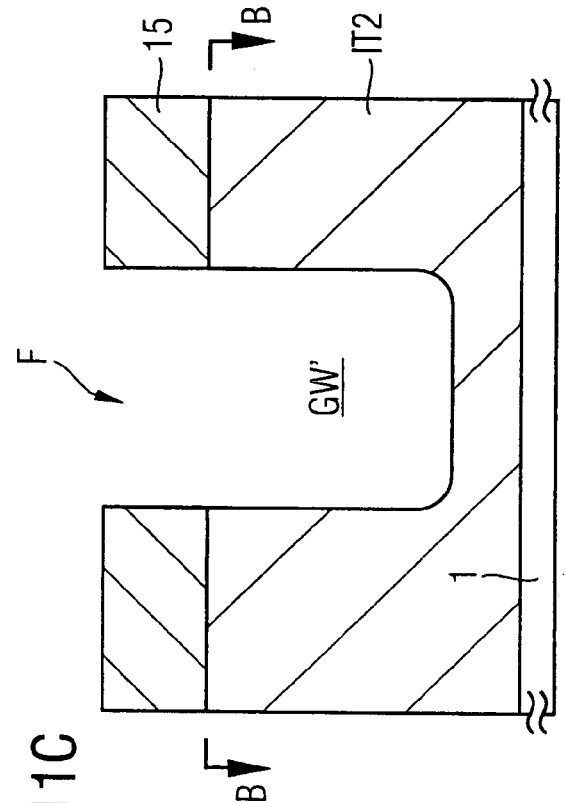
Figure 11A:
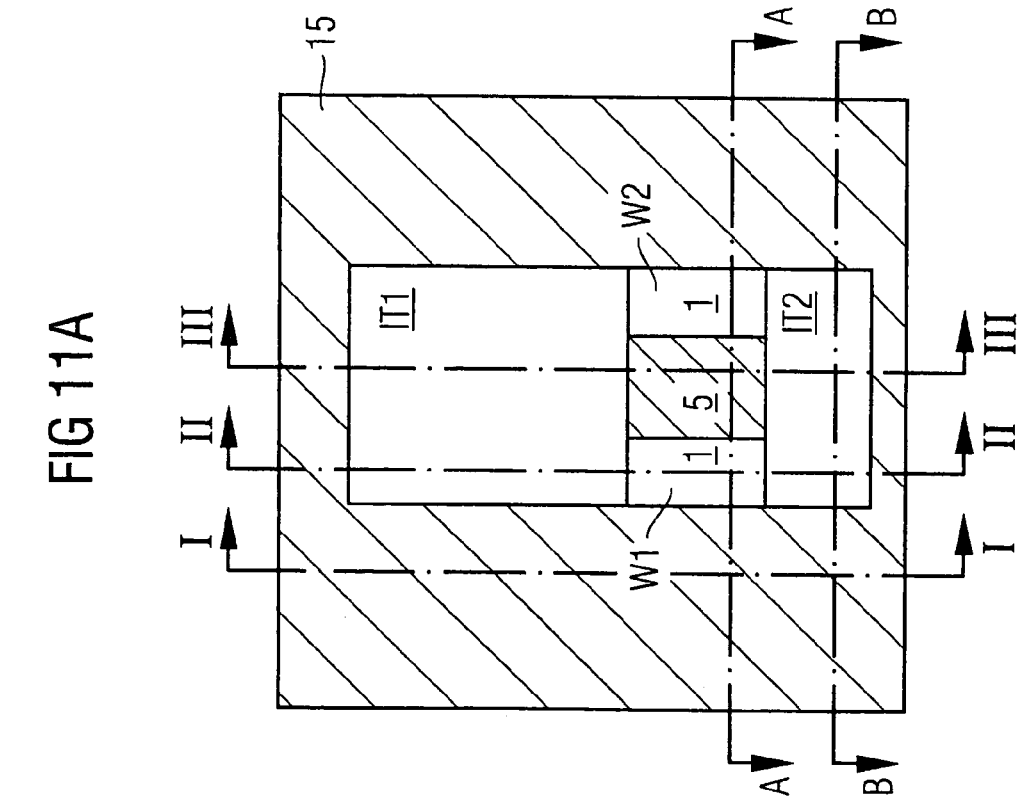
Figure 11D:
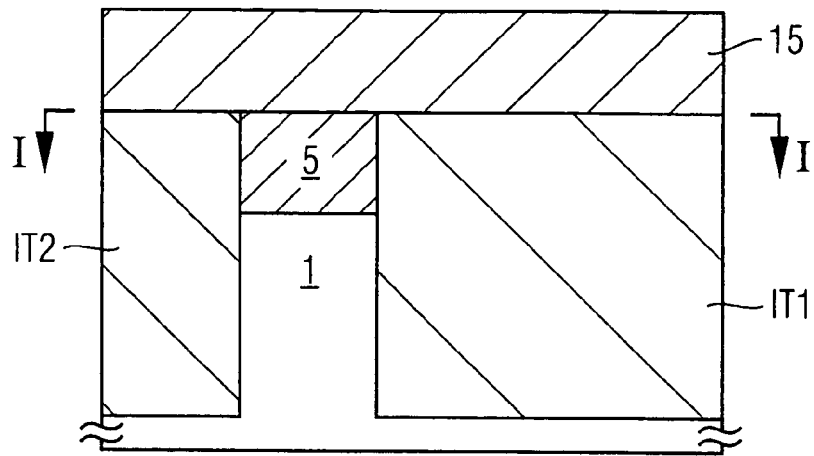
Figure 11E:
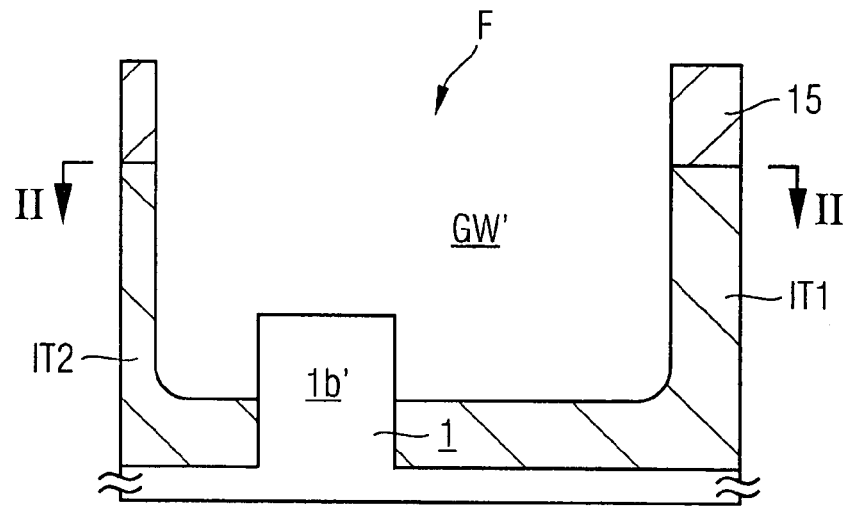
Figure 11F:
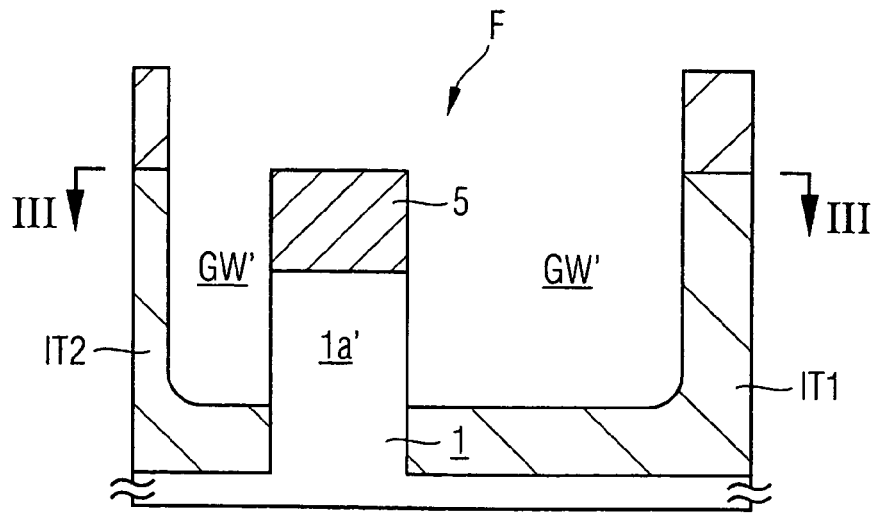

FIG. 11a)-f) to 13a-f show schematic layouts of a manufacturing method for an integrated transistor device used in a memory cell array according to a second embodiment of the present invention.

The second embodiment starts with the process state shown in FIG. 5a)-5f).

Having regard to FIG. 11a)-f), the etch process for the gate trench GW' of the second embodiment is started with a silicon oxide/silicon etch step which etches silicon oxide much faster than silicon such that the final depth of the gate trench GW' in the insulation trenches IT1, IT2 is reached, thereafter whereas the final depth of the gate trench GW' in the silicon substrate 1 is not yet reached thereafter. Clearly, this etch step is highly selective with respect to the silicon nitride which is used as a mask.

Thereafter, a silicon etch step is performed which is highly selective with respect to silicon oxide and silicon nitride. In this silicon etch step the substrate 1 is etched isotropically which leads to the process state shown in FIG. 12a)-f).

Particularly, this silicon etch step results in a lateral thinning of said pillar 1a' resulting in curved sidewalls thereof and a curved surface 1b' of the channel region CH' below the gate trench GW', as seen perpendicular to the current flow direction in FIG. 12e). By this silicon thinning step, the electrical characteristics of the transistor to be formed can be varied in a broad way.

Figure 12B:
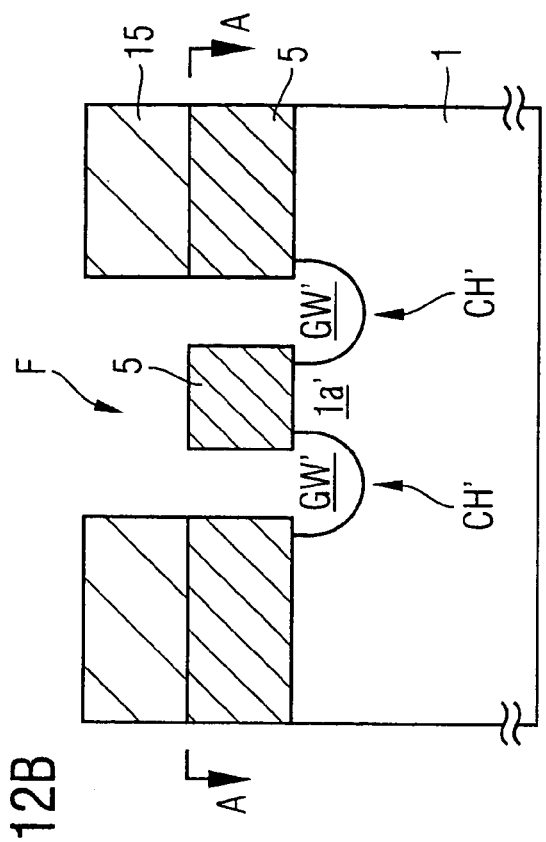
Figure 12C:
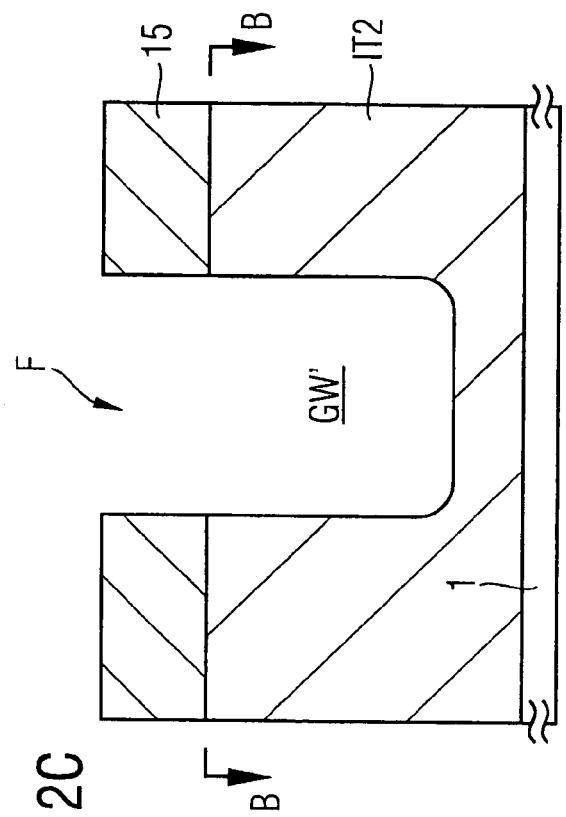
Figure 12A:
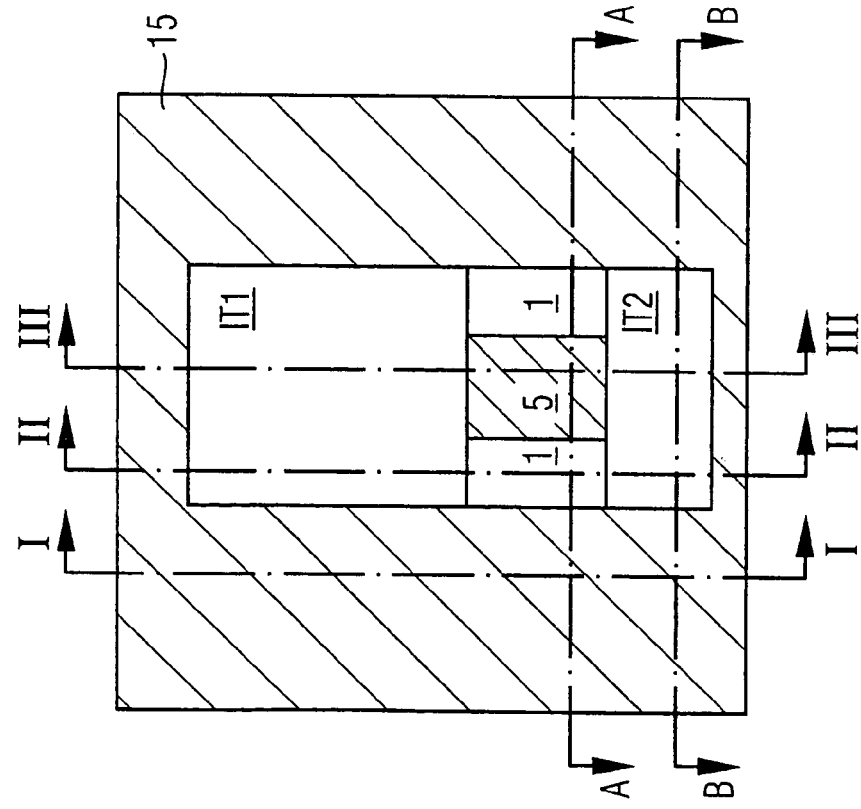
Figure 12D:
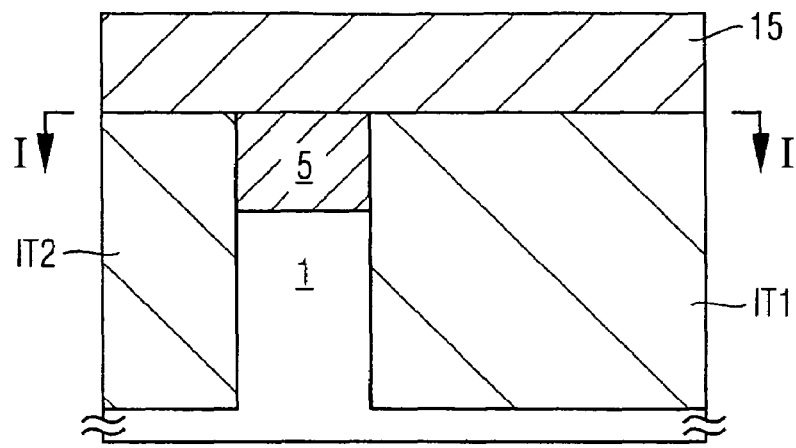
Figure 12E:
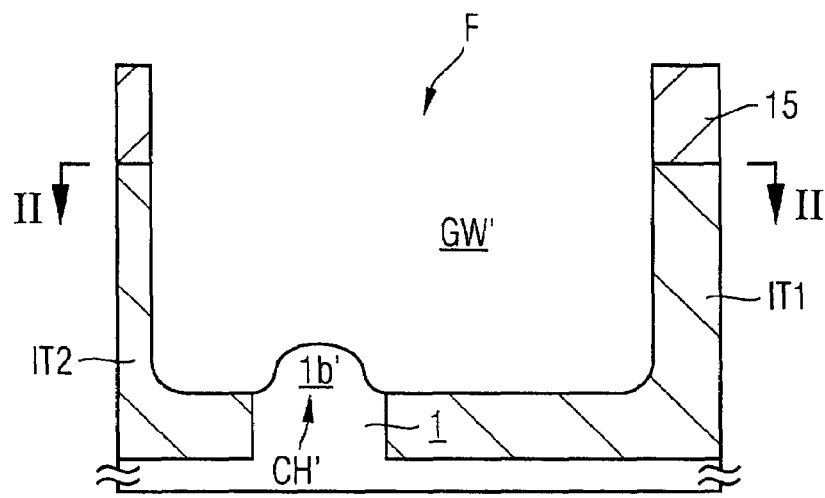
Figure 12F:
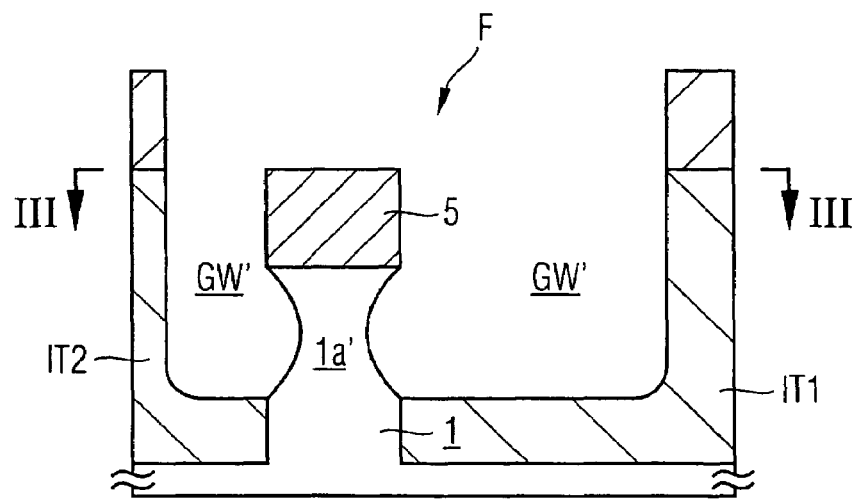
Figure 13D:
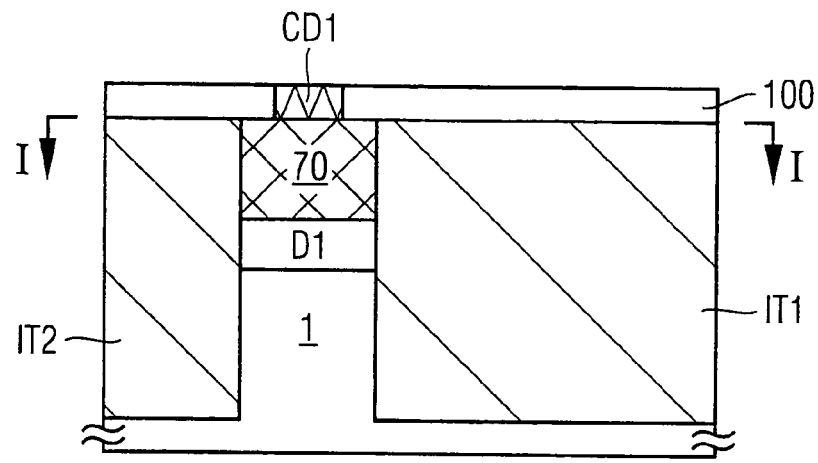
Figure 13E:
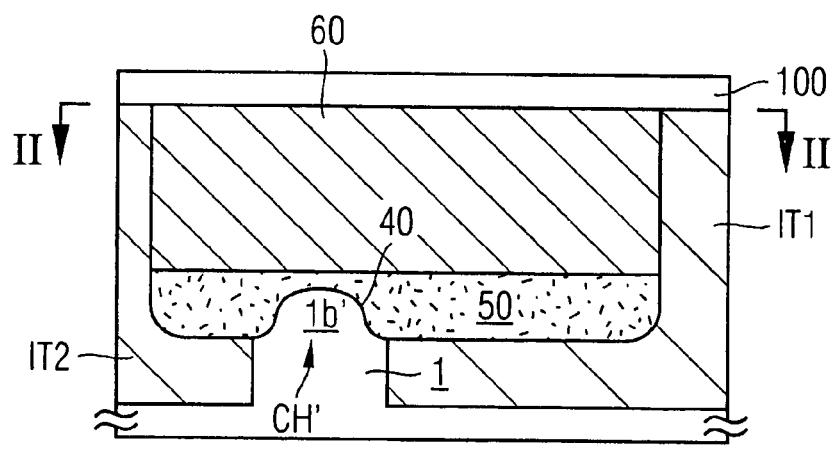
Figure 13F:
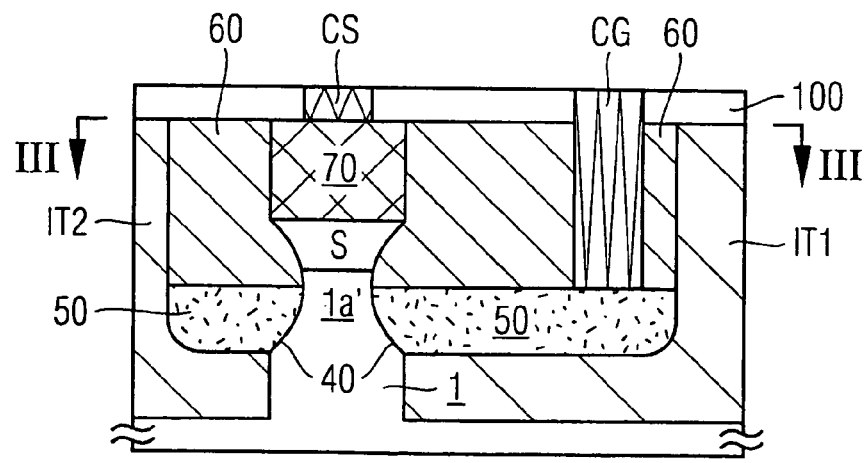

The process steps following the process state of FIG. 12a)-f) correspond to the process steps of FIG. 7a)-f) to 10a)-f), and therefore a repeated description thereof will be omitted here. Only the final process state is shown in FIG. 13a)-f) which corresponds to the process state shown in FIG. 10a)-f).

Figure 14D:
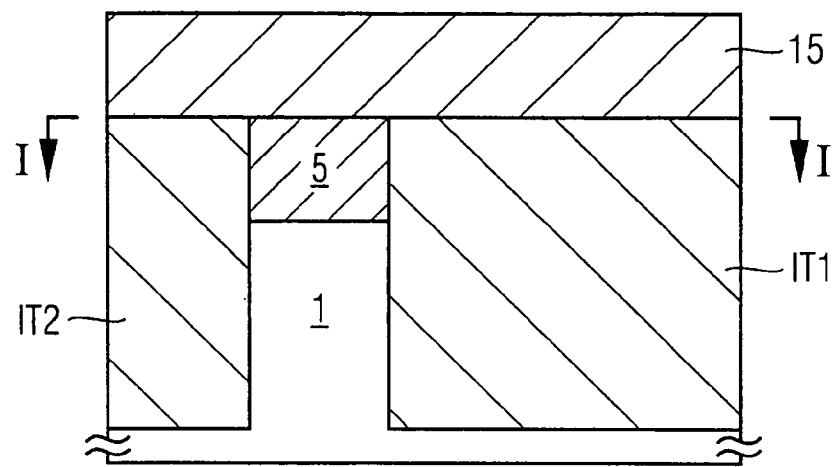
FIG. 14a)-f) to 16a)-f) show schematic layouts of a manufacturing method for an integrated transistor device used in a memory cell array according to a third embodiment of the present invention.
Figure 14E:
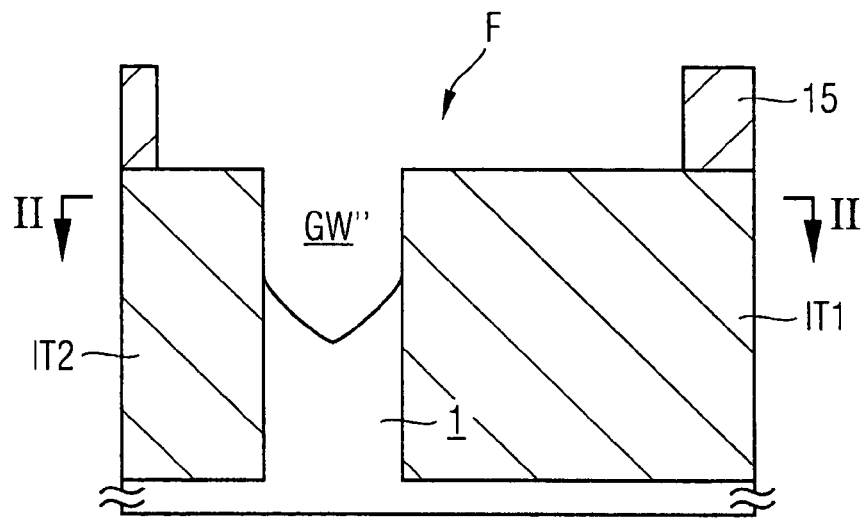
Figure 14F:
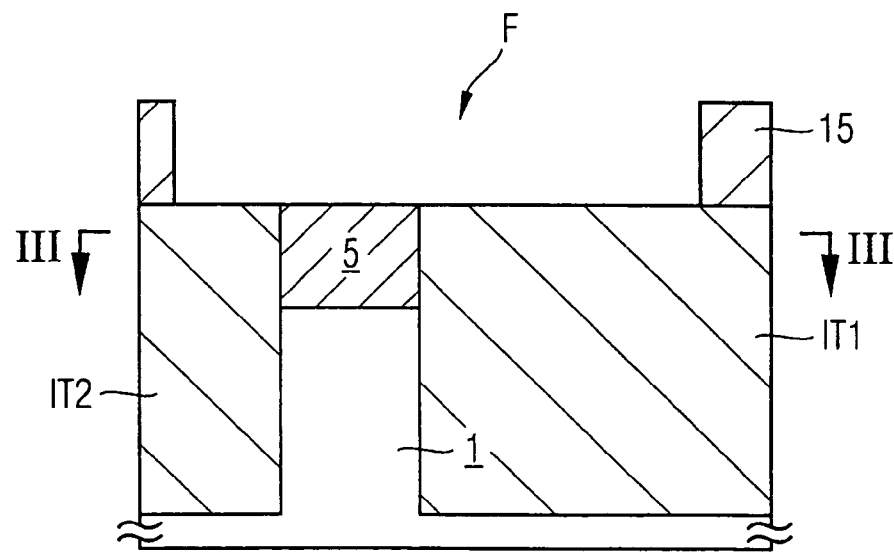

FIG. 14a)-f) to 16a)-f) show schematic layouts of a manufacturing method for an integrated transistor device used in a memory cell array according to a third embodiment of the present invention.

The third embodiment also starts with the process state shown in FIG. 5a)-f). In this third embodiment, the etch step for forming the gate trench GW" commences with a silicon etch step which is highly selective over silicon oxide and silicon nitride and forms a tapered gate trench GW" in the silicon substrate 1 as shown in FIG. 14a)-f).

Thereafter, a silicon oxide silicon etch step is performed which etches the silicon oxide much faster than silicon. This results in the process state shown in FIG. 15a)-f) which reveals that the channel region CH" under the gate trench GW" has a curved surface 1c, the curvature of which is opposite to the curvature of the surface 1b' of the second embodiment, as may be particularly obtained from FIG. 15e).

Figure 15D:
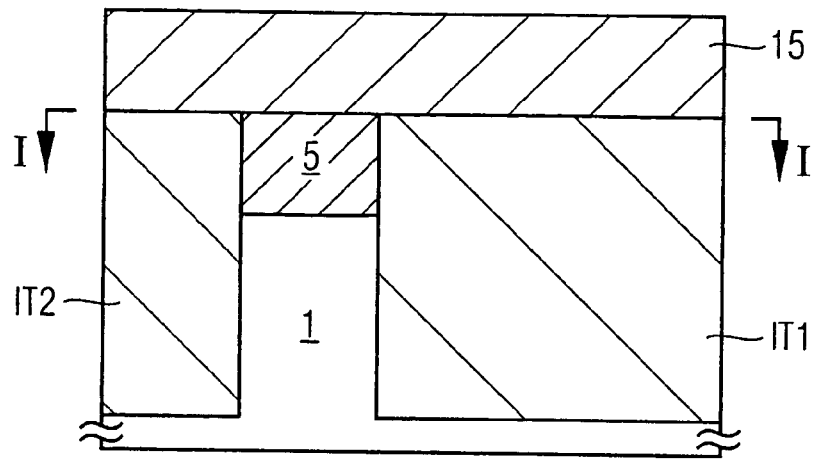
Figure 15E:
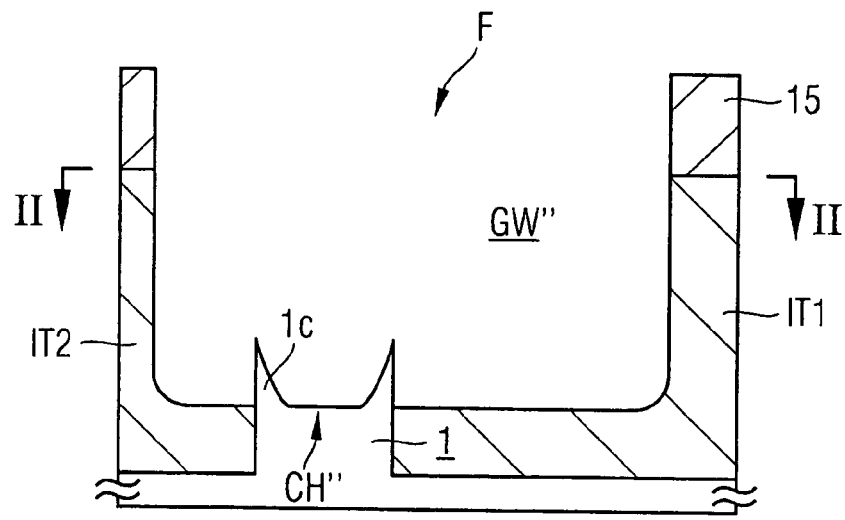
Figure 15F:
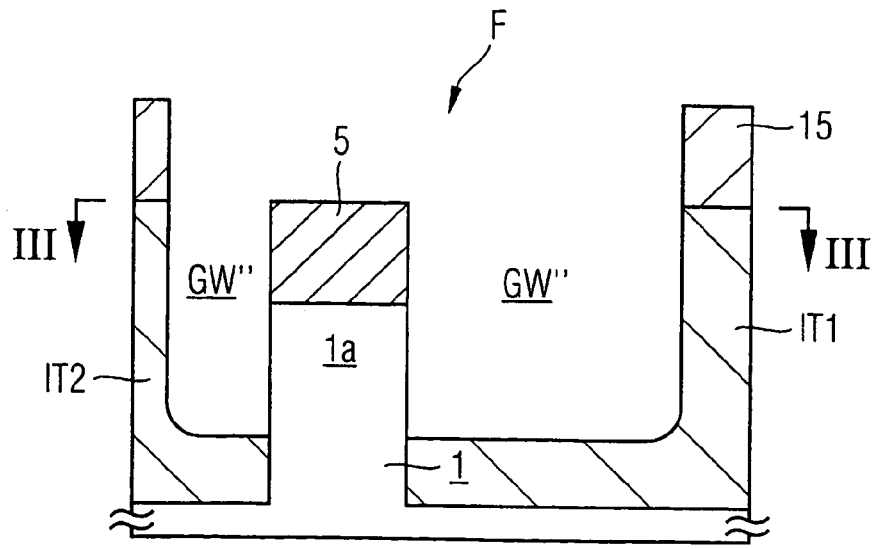
Figure 16D:
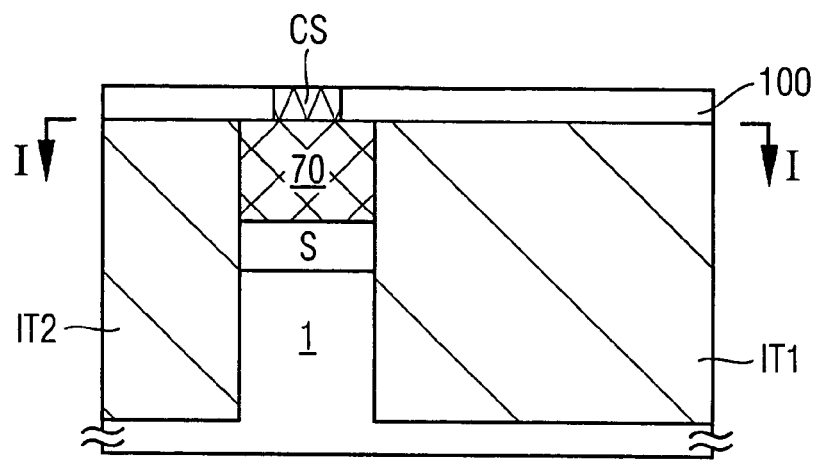
Figure 16E:
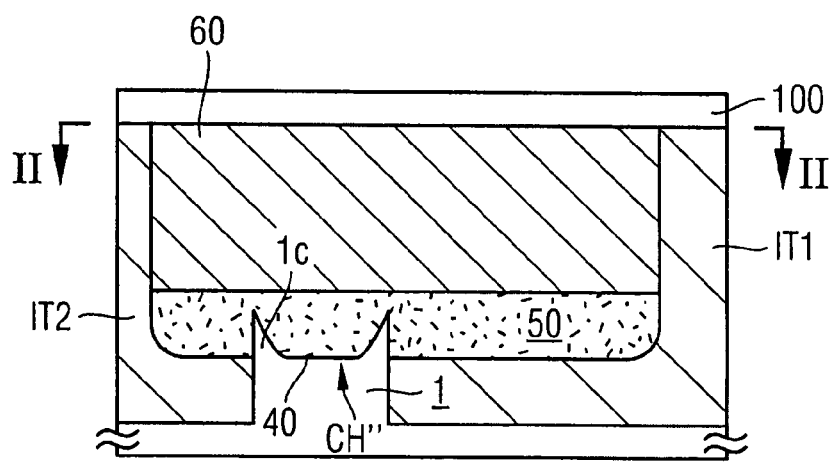
Figure 16F:
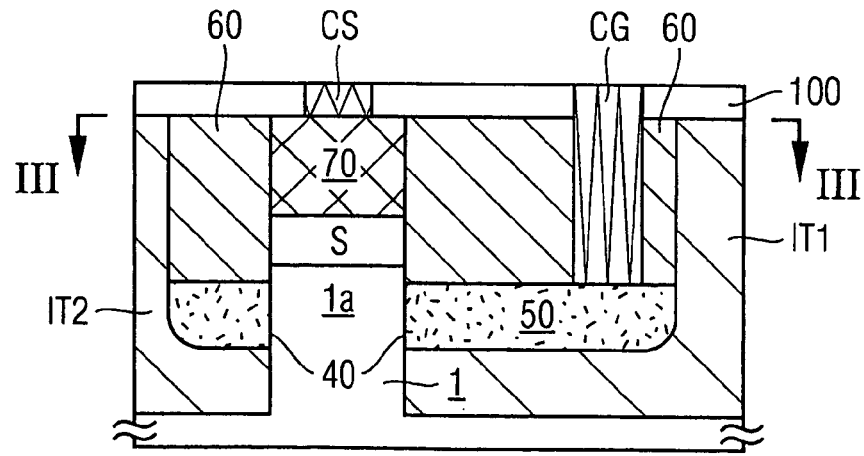

The process steps following FIG. 15a)-f) correspond to the process steps already explained above with regard to FIG. 7a)-f) to 10a)-f), and a repeated description will be therefore omitted here. Only shown in FIG. 16a)-f) is the final process state corresponding to the process state shown in FIG. 10a)-f).

Figure 17D:
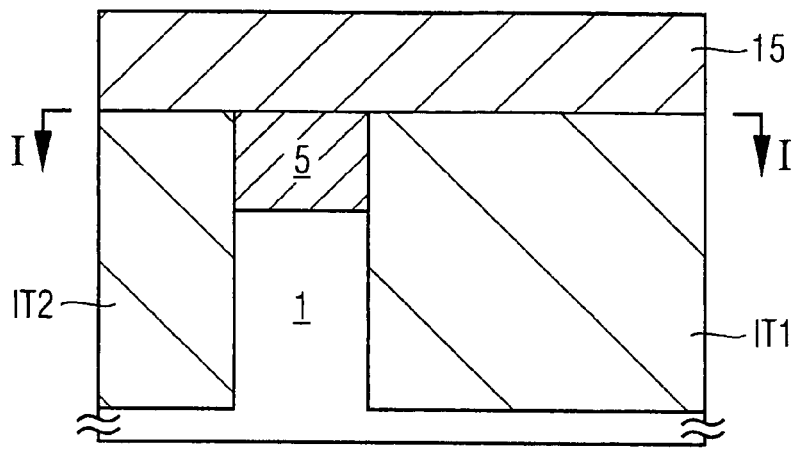
FIG. 17a)-f) and 18a)-f) show schematic layouts of a manufacturing method for an integrated transistor device used in a memory cell array according to a fourth embodiment of the present invention.
Figure 17E:
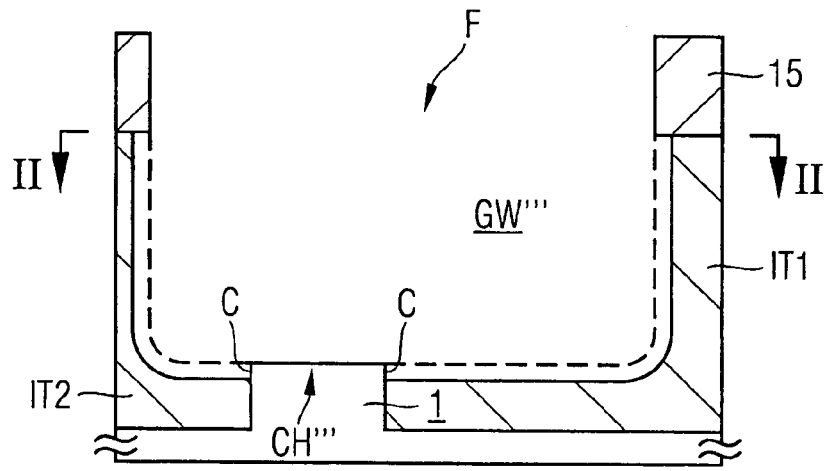
Figure 17F:
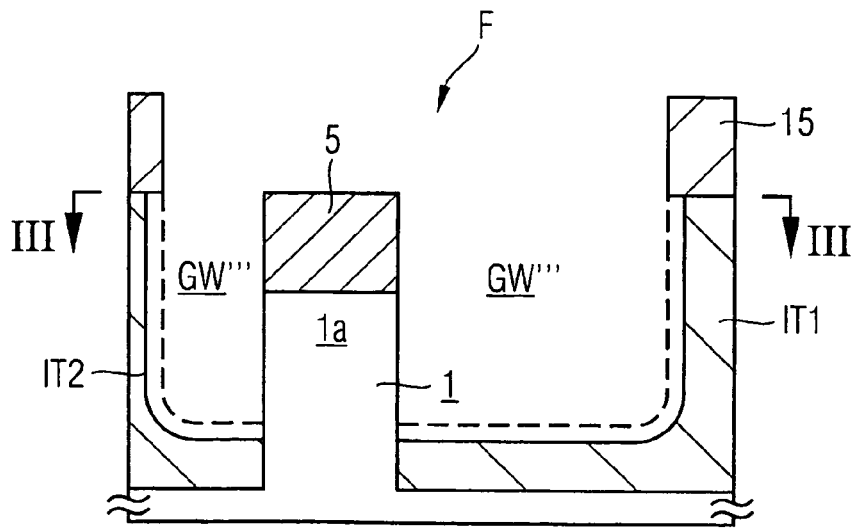

FIGS. 17a)-f) and 18a)-f) show schematic layouts of a manufacturing method for an integrated transistor device used in a memory cell array according to a fourth embodiment of the present invention.

The third embodiment starts with the process state shown in FIG. 6a)-f), i.e. after partial formation of the gate trench GW'''.

As depicted in FIG. 17a)-f) a silicon oxide etch step is performed subsequent to the process state shown in FIG. 6a)-f) which exposes corners C of the channel CH''' lying below the gate trench GW'''. For better understanding, in FIGS. 17c), 17e) and 17f) the dashed line illustrates the process state of FIG. 6a)-f), i.e. before the silicon oxide etch step.

The following process steps correspond to process steps described above with respect to FIG. 7a)-f) to FIG. 10a)-f), and a repeated description will be therefore omitted here.

Figure 18B:
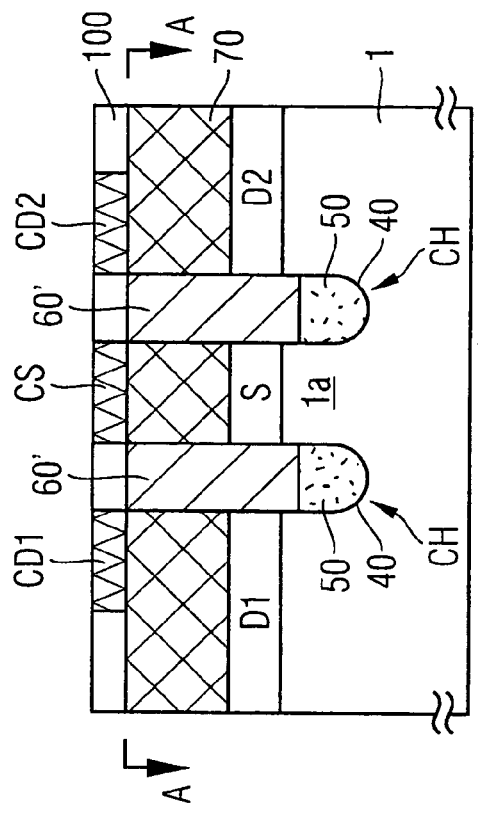
Figure 18C:
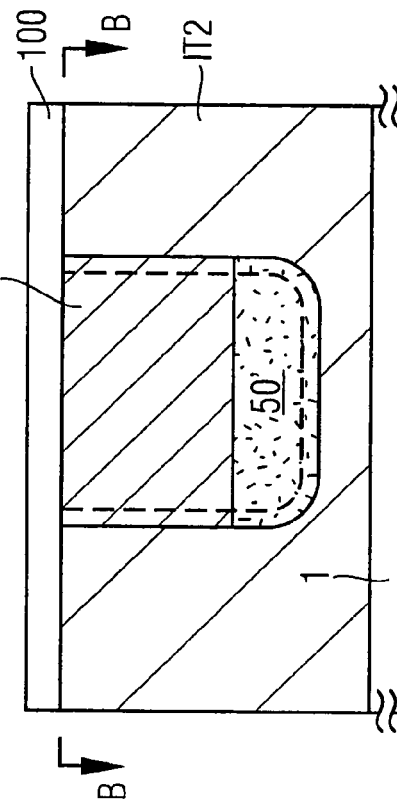
Figure 18A:
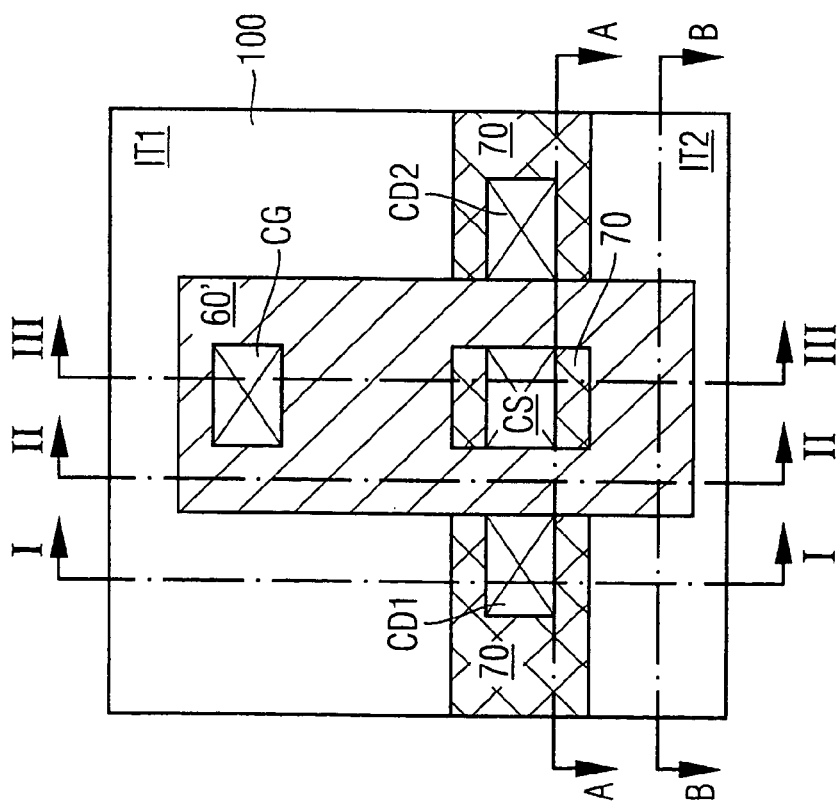
Figure 18D:
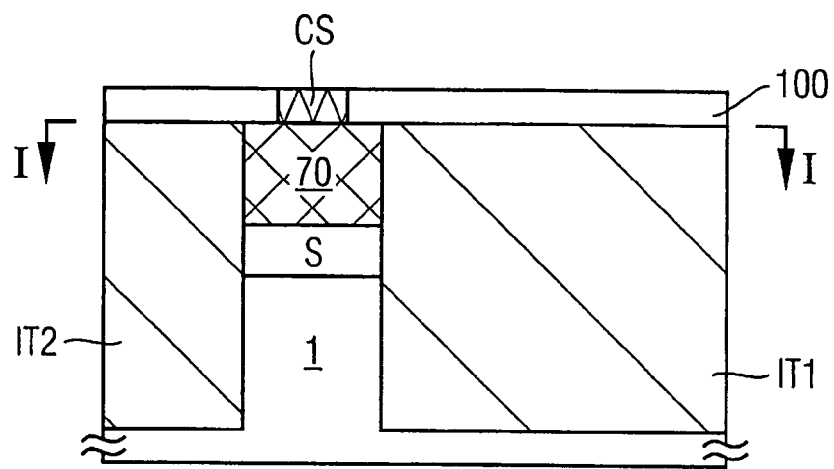

Only shown in FIG. 18a)-f) is the final process state corresponding to the process state of FIG. 10a)-f).

Figure 18E:
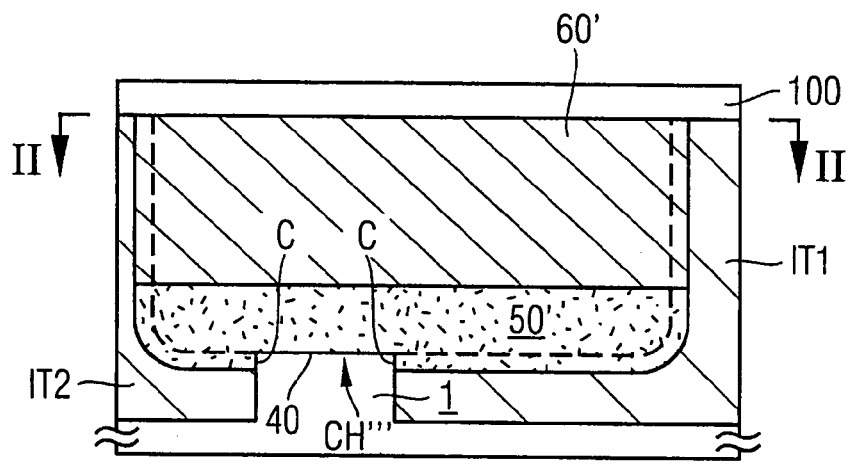
Figure 18F:
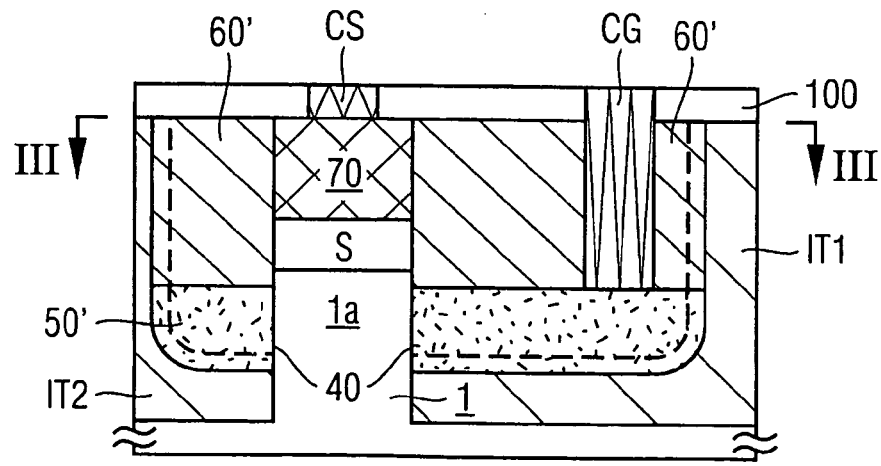

As may be obtained from FIG. 18e), the gate region 50' which is covered by the oxide layer 60' covers said exposed corners C of the channel CH''' lying below the gate trench GW''', i.e. this transistor exhibits a corner device effect.

Figure 19B:
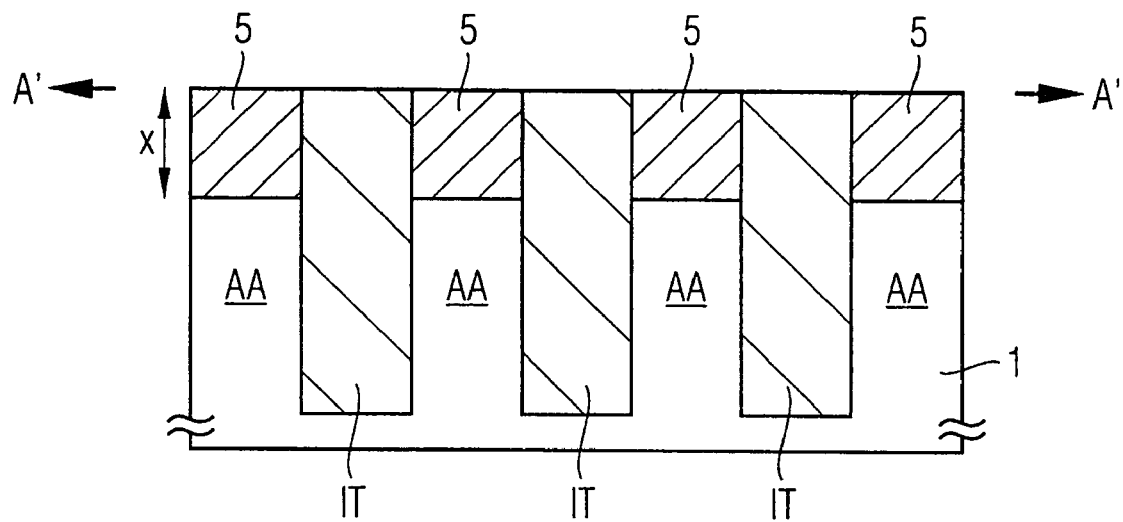
FIG. 19a),-c) to 28a)-d) show schematic layouts of a manufacturing method for a memory cell array according to a fifth embodiment of the present invention.

FIG. 19a)-c) to 28a)-d) show schematic layouts of a manufacturing method for a memory cell array according to a fifth embodiment of the present invention.

Figure 19C:
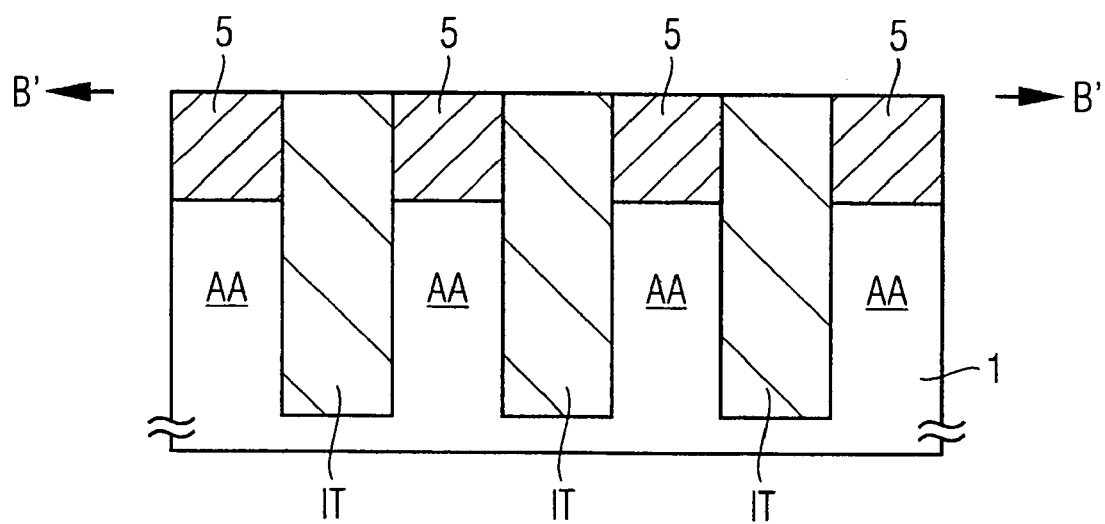

In each of FIG. 19 to 28, a) denotes a plain view, b) denotes a cross section along line A'-A' of the plain view of a), c) denotes a cross section along line B'-B' of the plain view of a), and d) denotes a cross section along line C-C' of the plain view of a), except for FIG. 19 where d) is omitted.

The process status shown in FIG. 19a)-c) corresponds to the process status shown in FIG. 1a)-f). Particularly, an array of parallel mask stripes 5 is formed on the surface of the semiconductor substrate 1 which mask stripes 5 run along z direction. The z direction forms an angle α of about 20 degrees with the x-axis of an orthogonal xy coordinate system shown in FIG. 19a). Between that mask stripes 5 insulation trenches IT having the same dimension as said mask stripes 5 are formed. The substrate stripes under the mask stripes are active area stripes AA where the cell transistors will be formed.

Figure 20A:
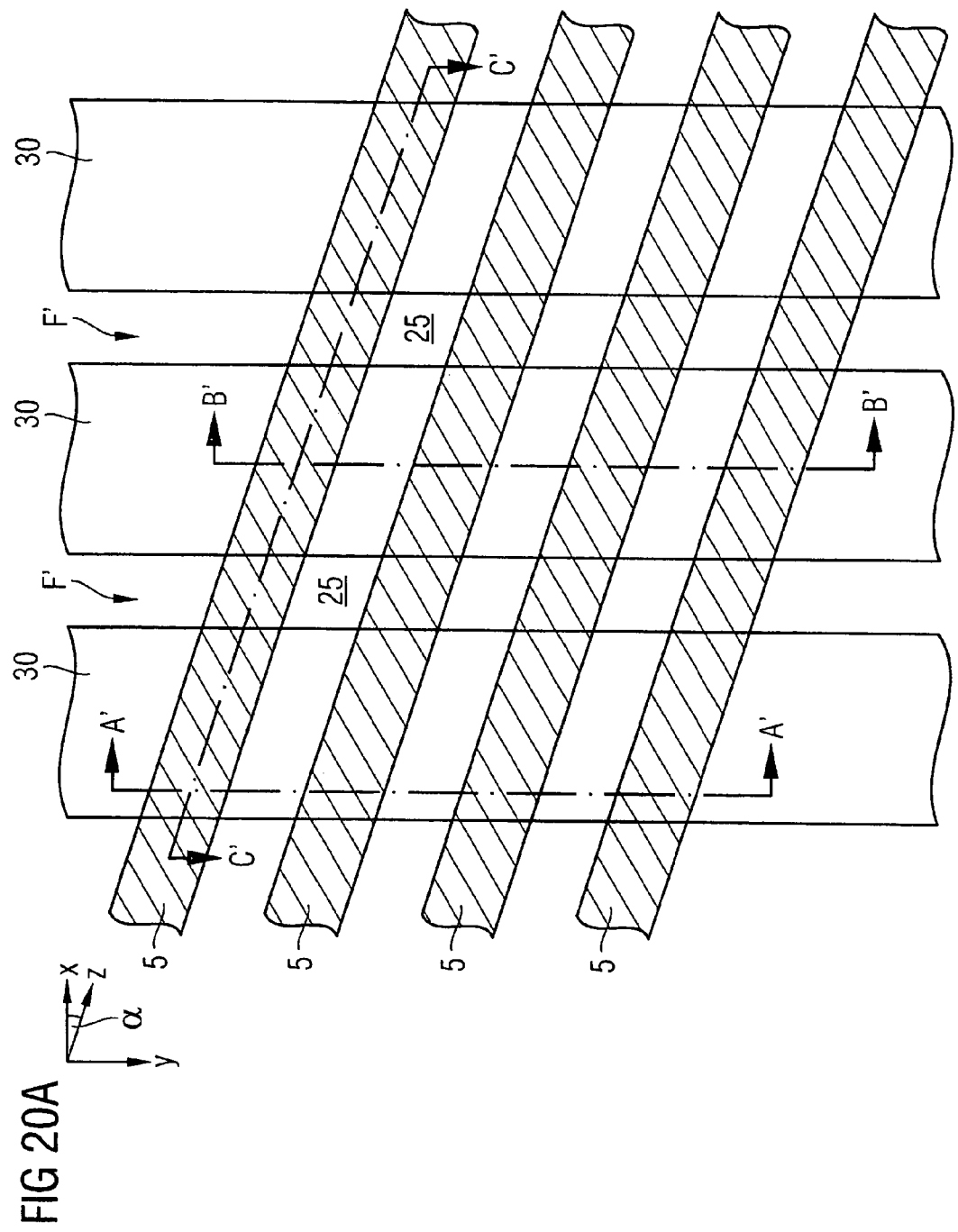
Figure 20B:
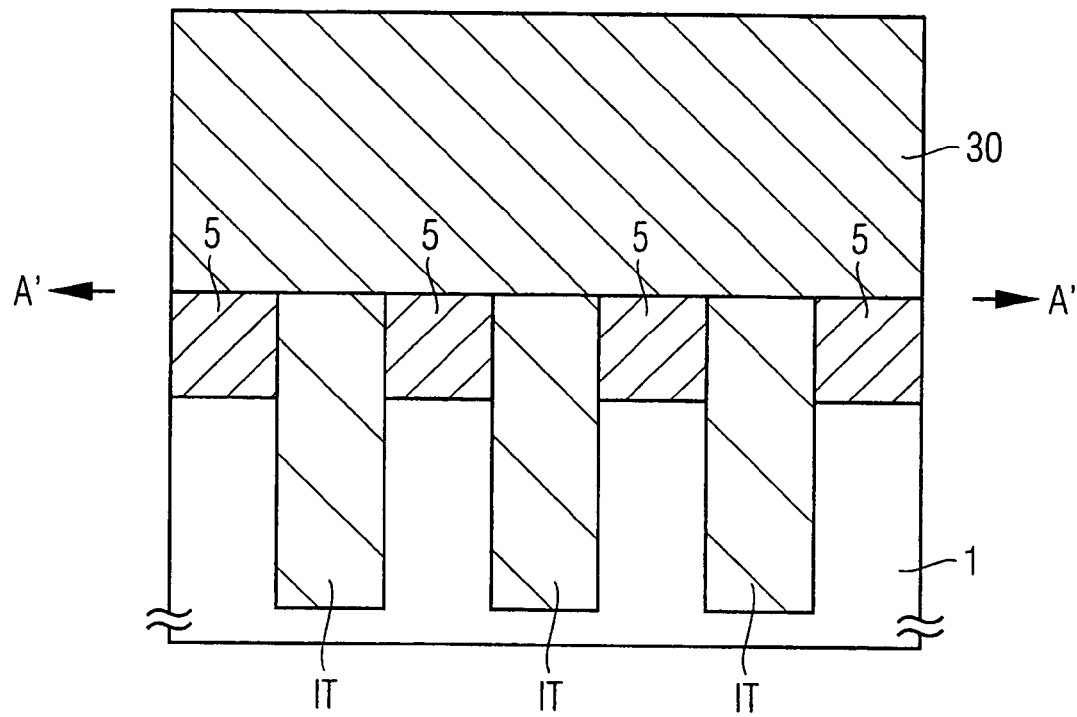
Figure 20C:
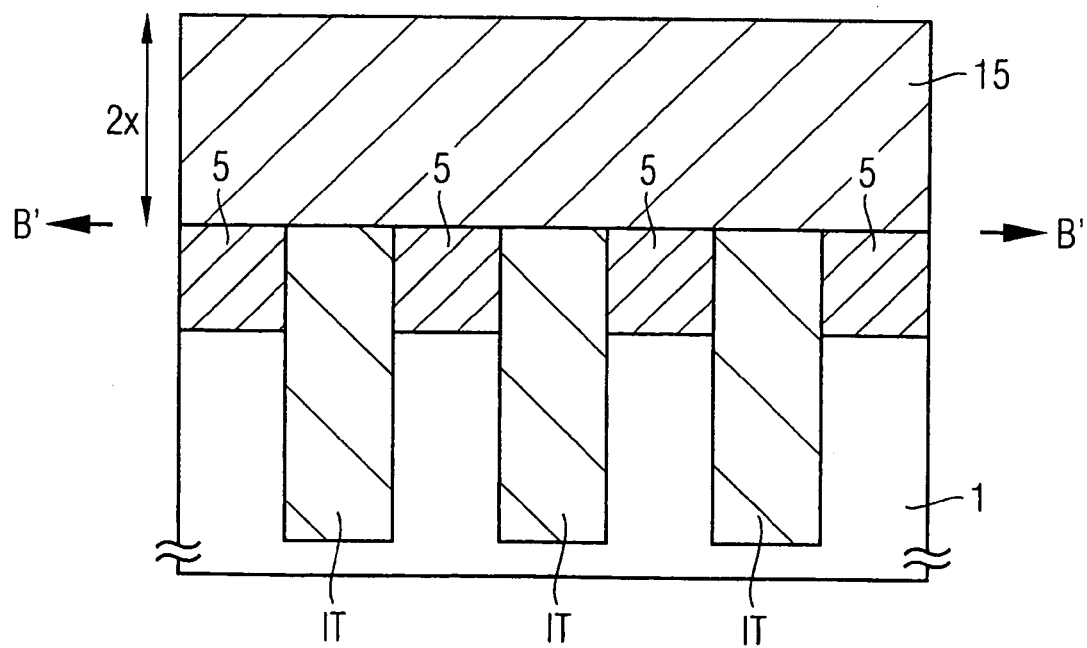

The process state of FIG. 20a)-d) corresponds to the process state shown in FIG. 3a)-f). Particularly, stripes of hard mask 15 covered with said oxide liner having intervening windows F' are formed, and in said windows F' said nitride layer 25 is deposited and etched back to a thickness of x which is half of the thickness 2x of said hard mask stripes 15.

Figure 21A:
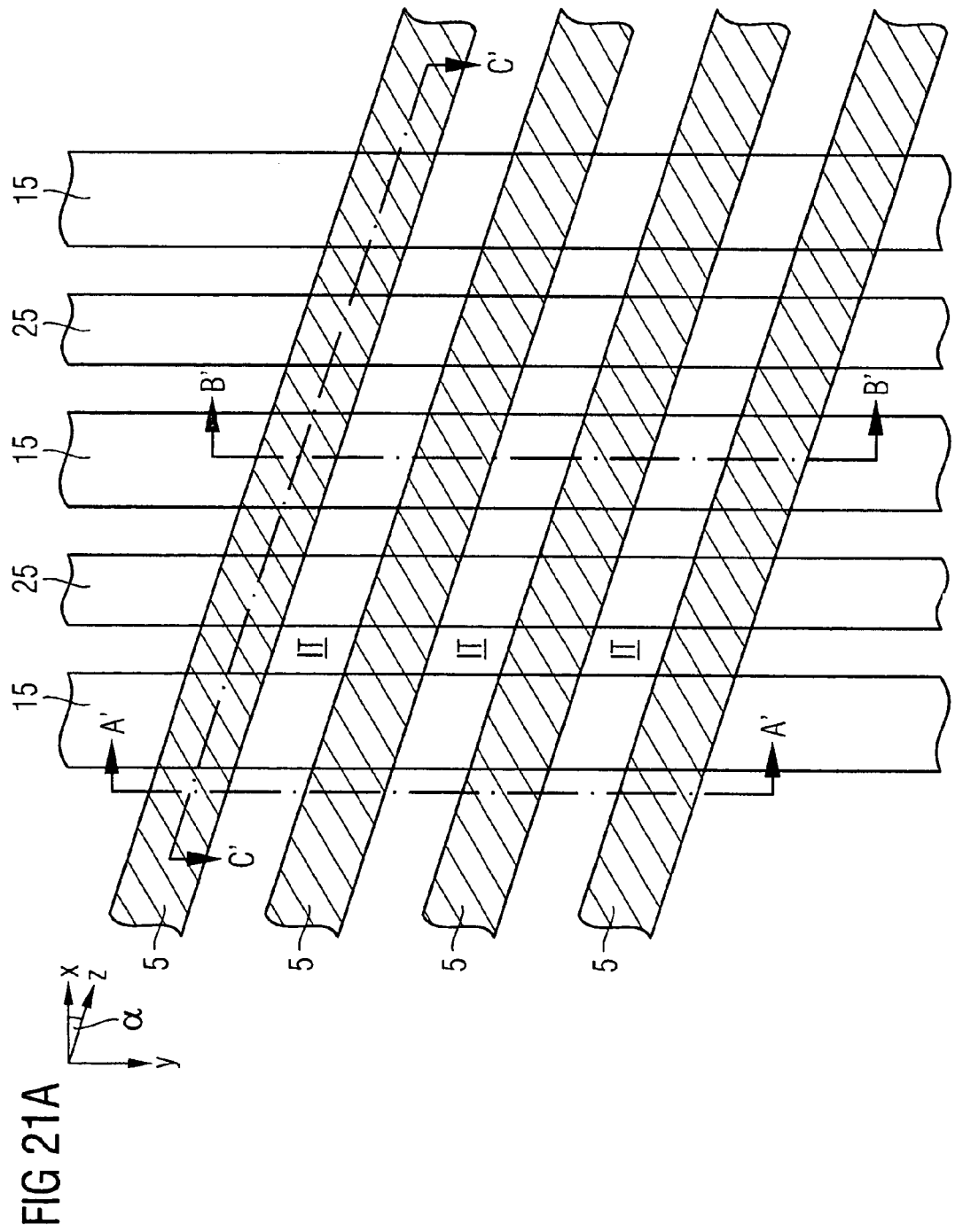
Figure 21B:
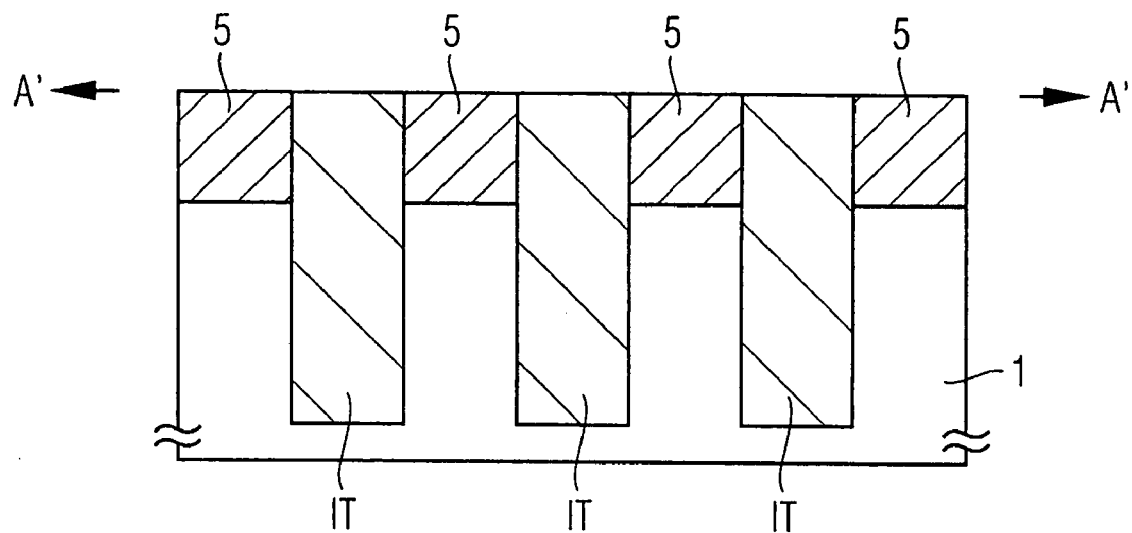
Figure 21C:
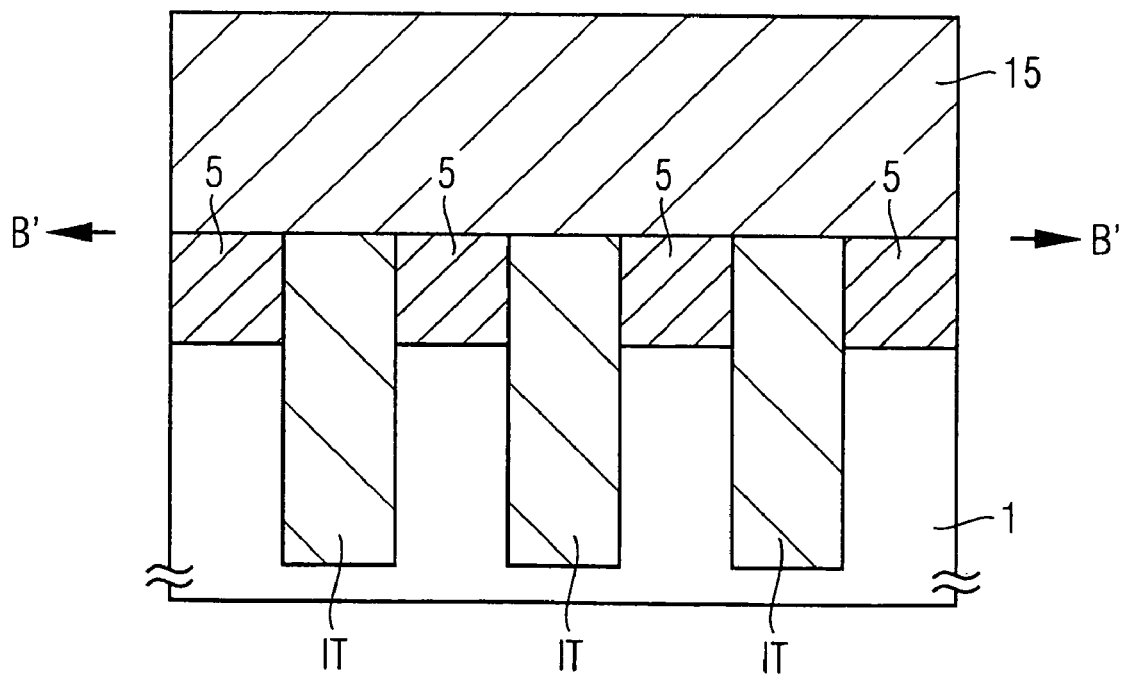
Figure 21D:
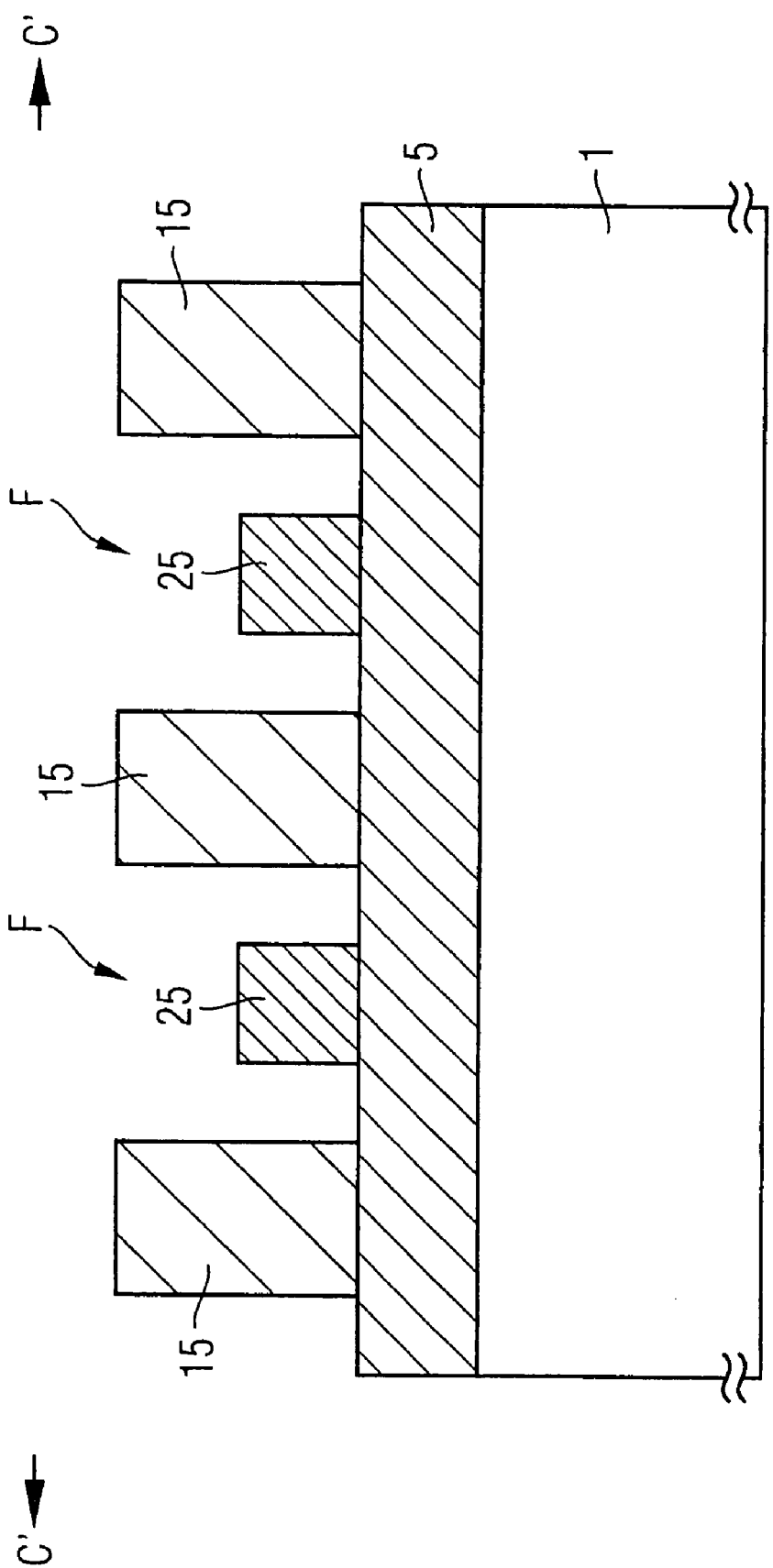

Thereafter, as shown in FIG. 21a)-d) corresponding to FIG. 4a)-f) said oxide liner layer 30 is stripped in a selective etch step.

Figure 22A:
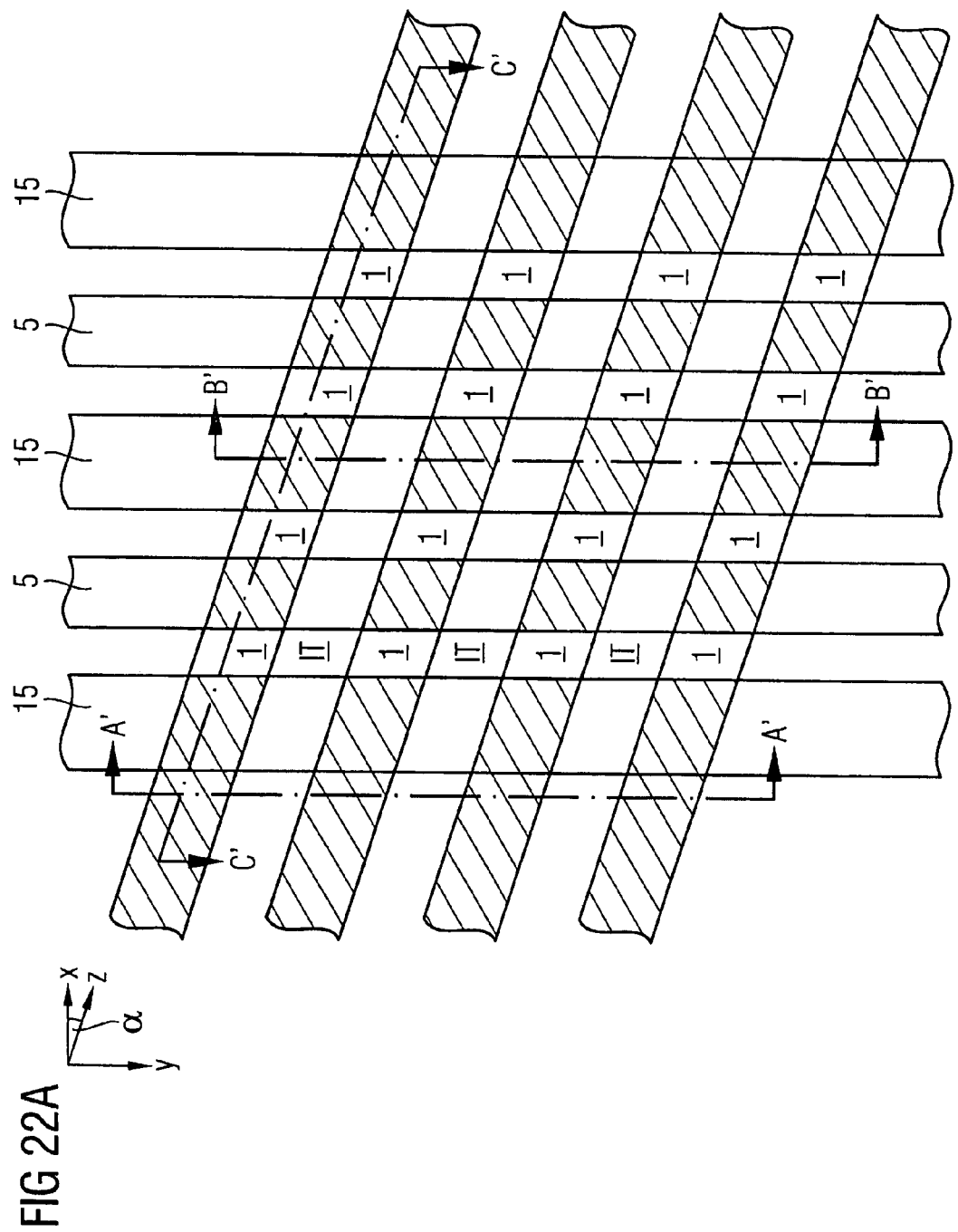
Figure 22B:
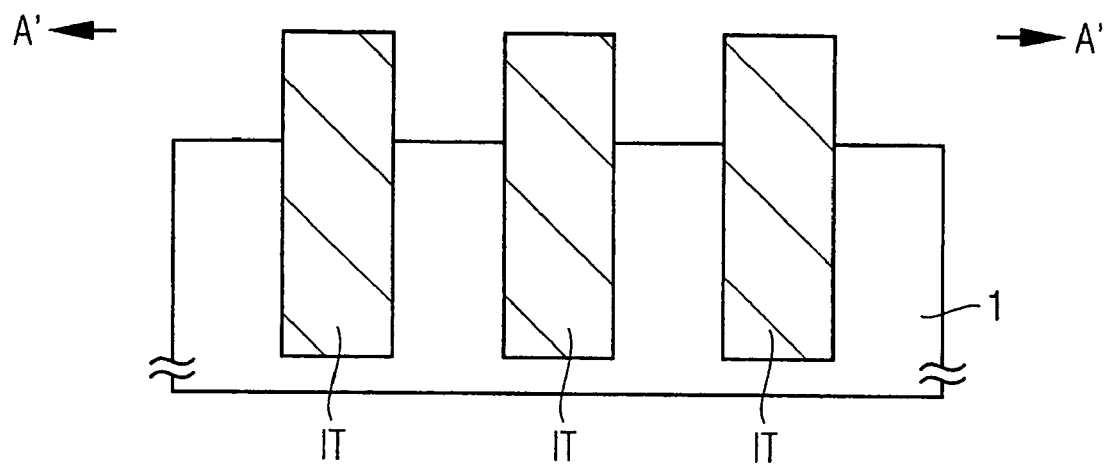
Figure 22C:
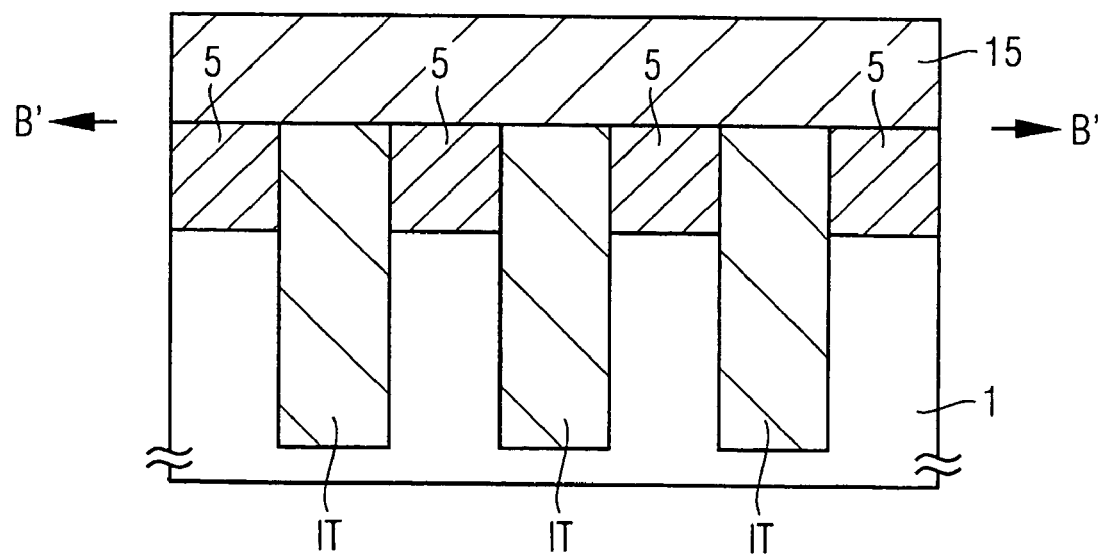
Figure 22D:
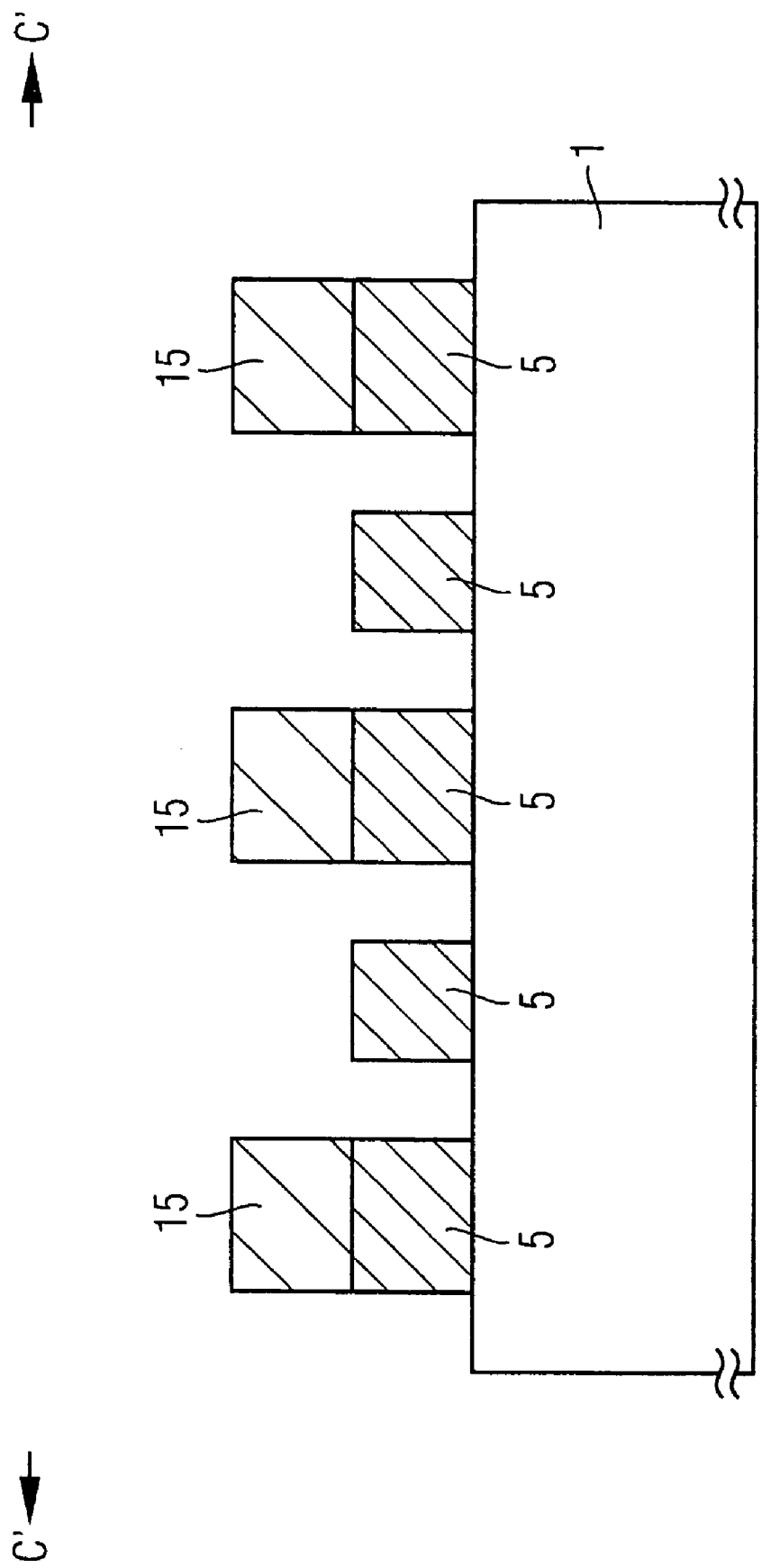

In a subsequent process step which is shown in FIG. 22a)-d) corresponding to FIG. 5a)-f), the transfer etch for reducing silicon nitride layers 5, 15, 25 by a thickness of x is performed as described above.

Figure 23A:
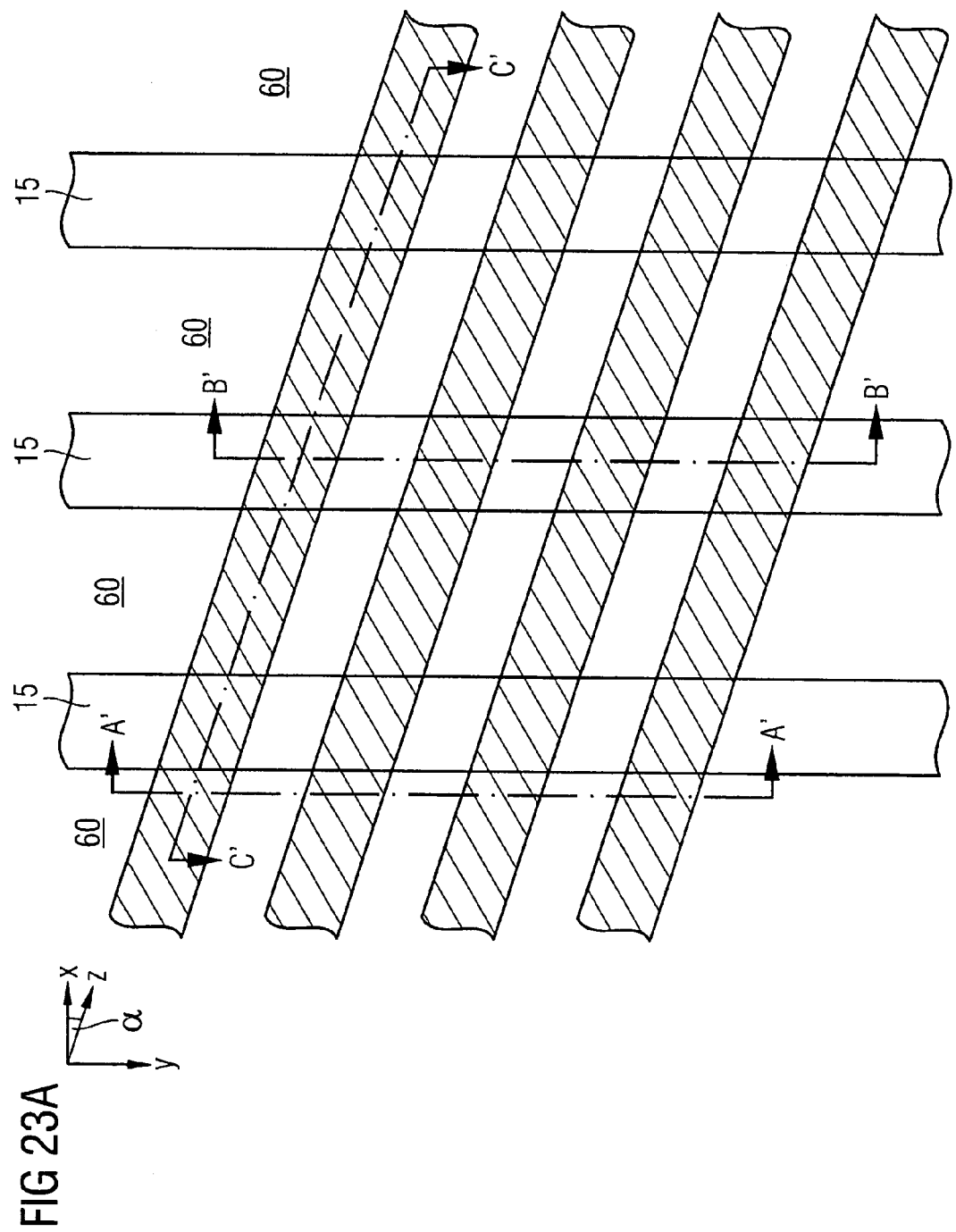
Figure 23B:
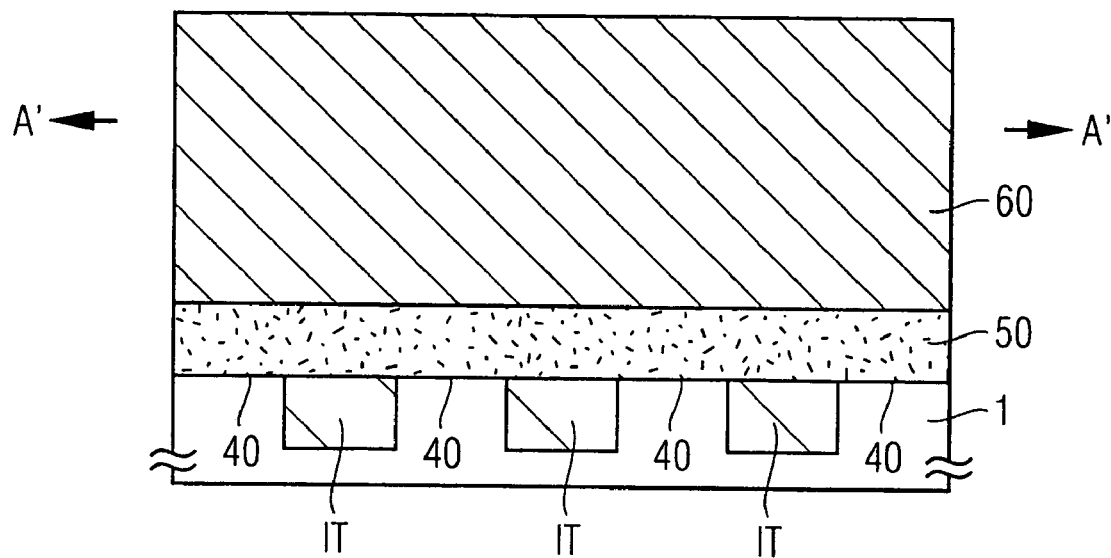
Figure 23C:
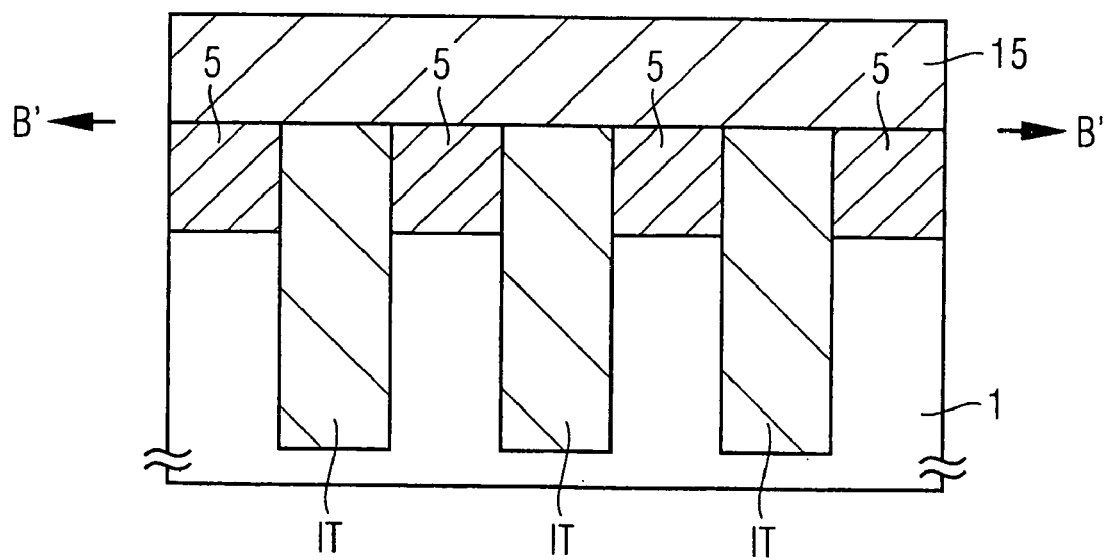
Figure 23D:
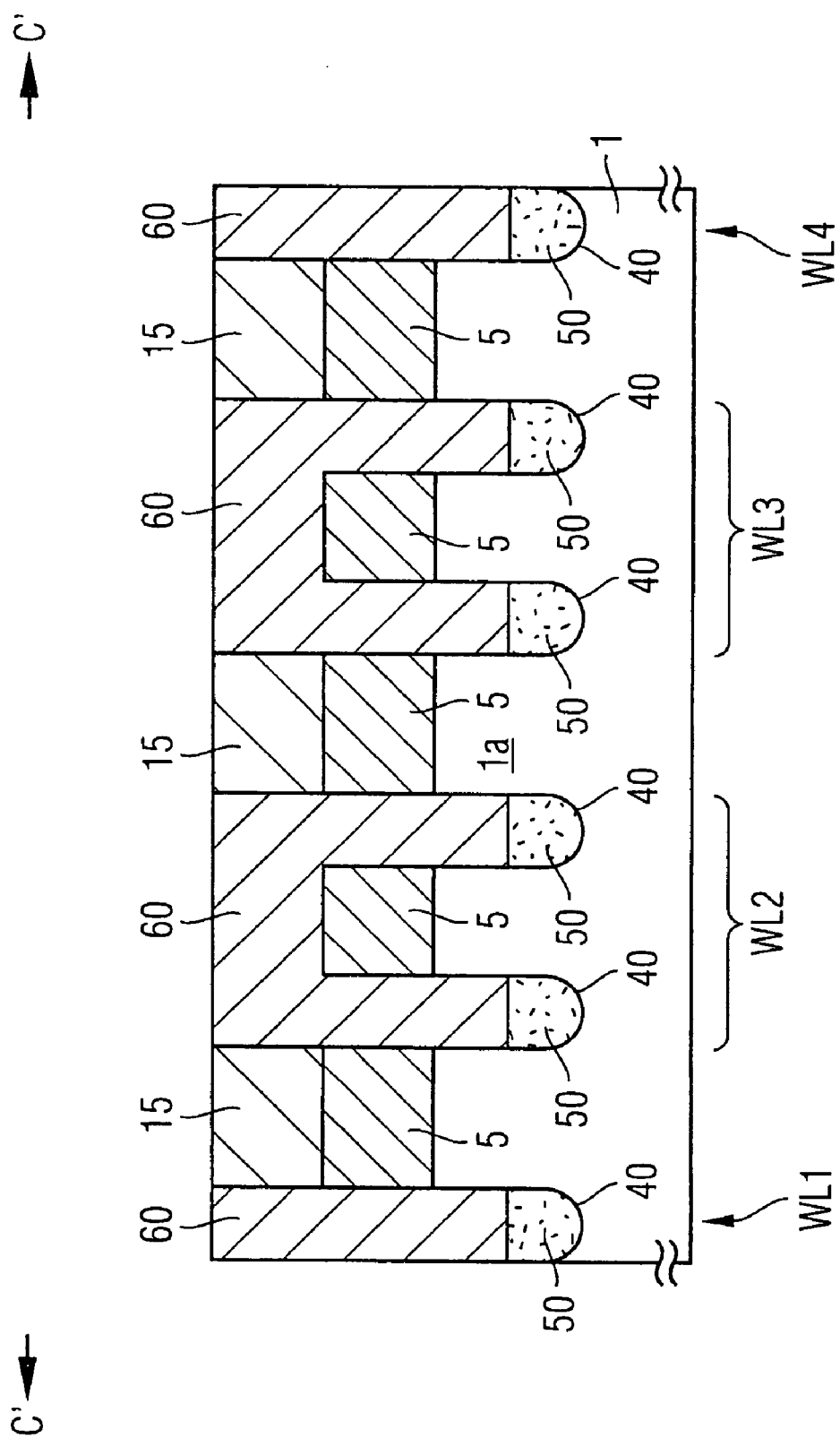

The process state shown in FIG. 23a)-d) corresponds to the process state shown in FIG. 7a)-f), i.e. the buried wordlines WL1-WL4 made of gate material 50 are formed in the corresponding wordline trenches etched in said substrate 1 using that silicon nitride layers 5, 15 as masks. Finally, insulating silicon oxide layer 60 is deposited and polished back to the upper surface of the residuals silicon nitride layer 15. As can be clearly seen, the wordlines WL1-WL4 also run in parallel along the y-direction.

Figure 24A:
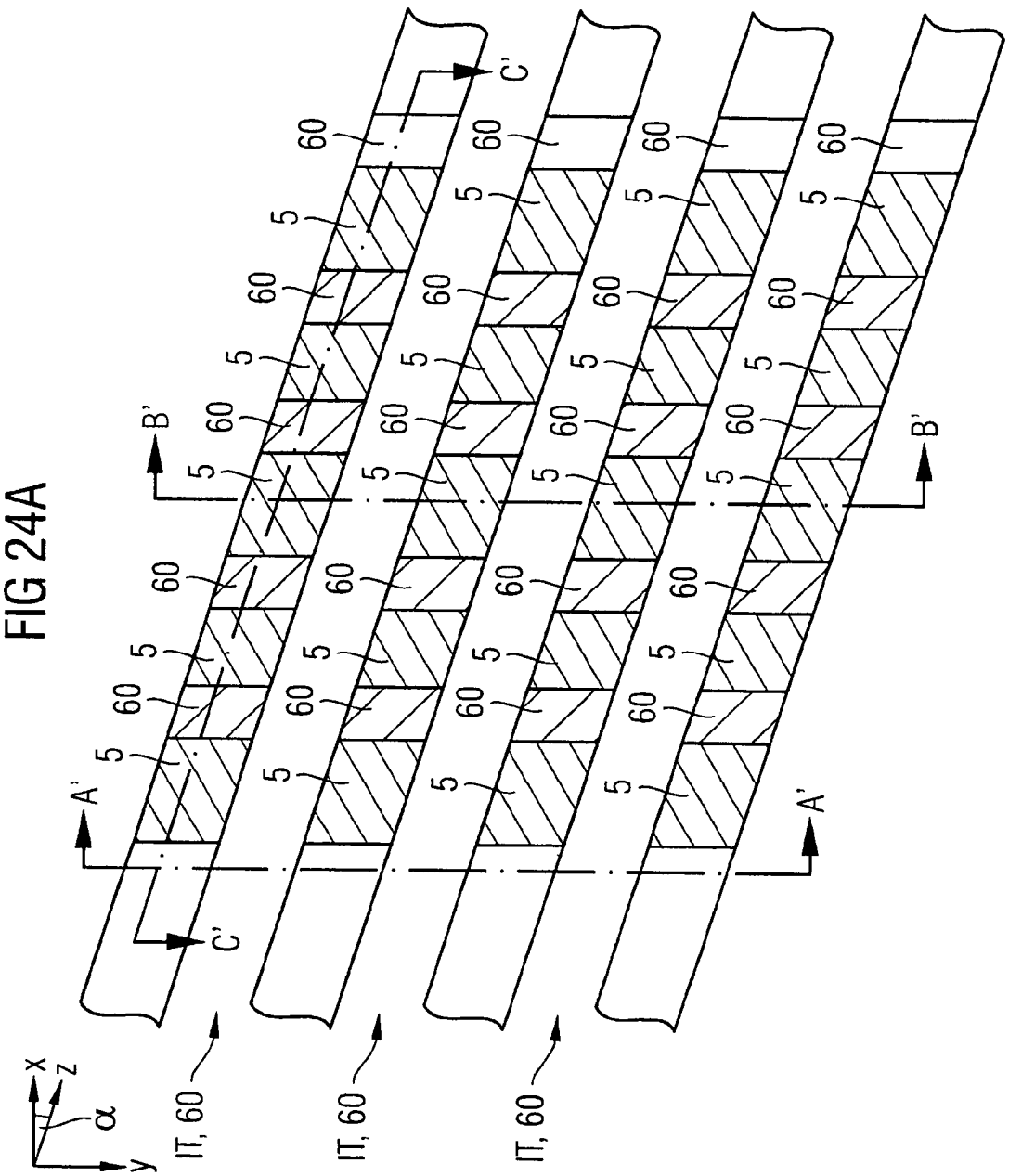
Figure 24B:
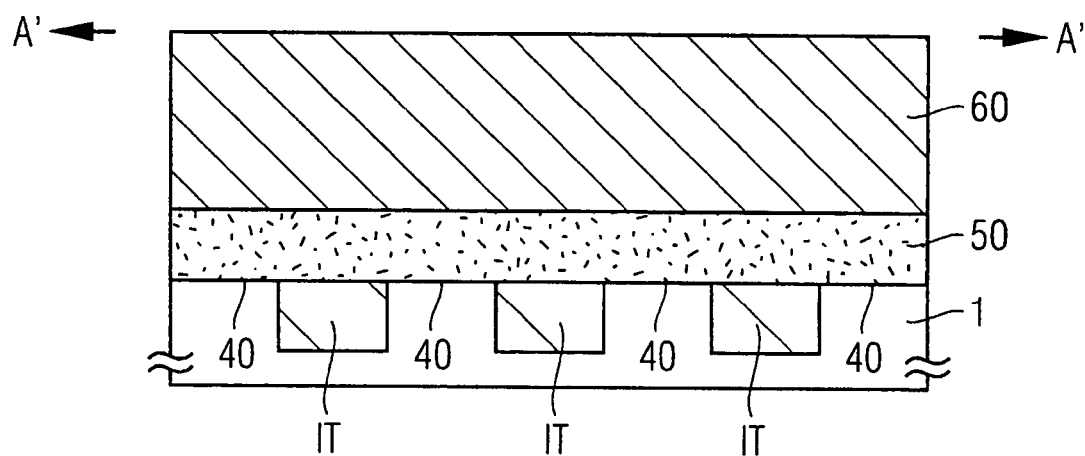
Figure 24C:
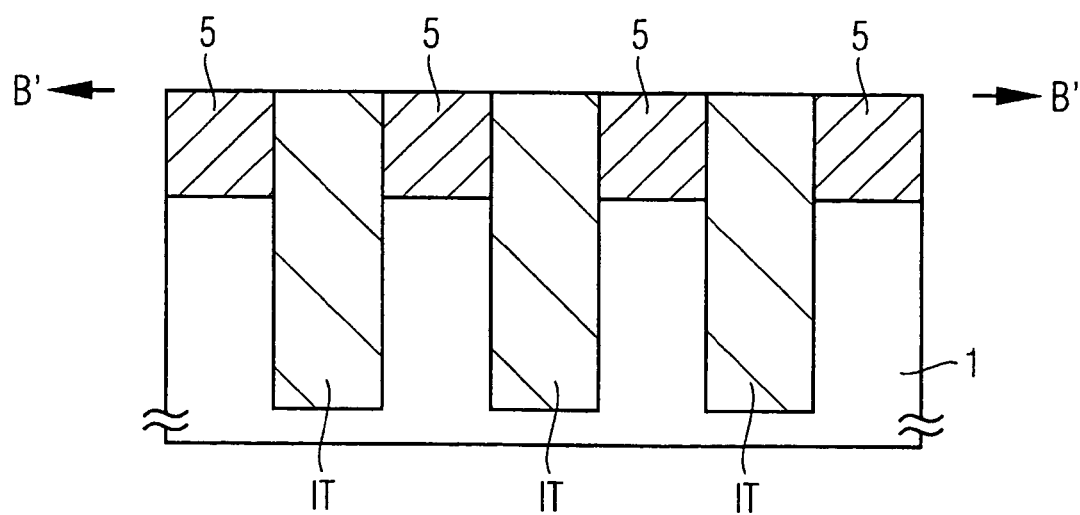

As shown in FIG. 24a)-d) corresponding to FIG. 8a)-f) a silicon oxide/silicon nitride etch step is performed which removes a thickness of x of said oxide layer 60 and the remaining thickness of said hard mask 15 stripes.

Figure 25A:
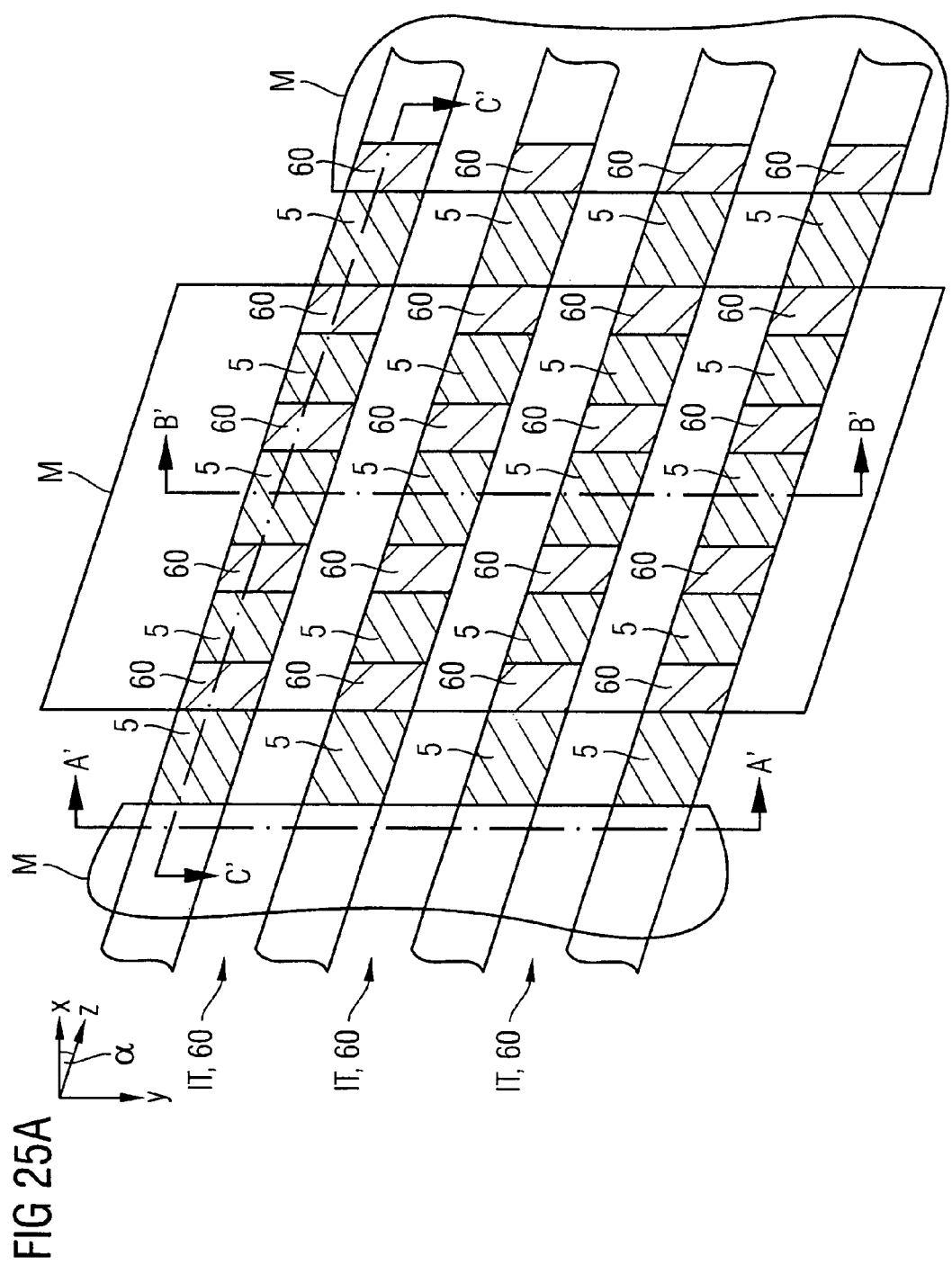
Figure 25B:
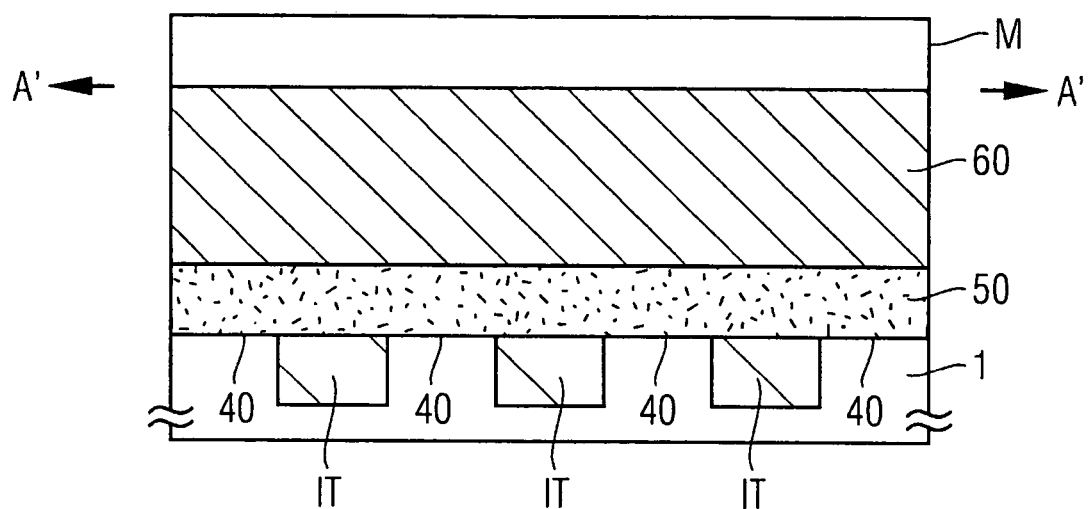
Figure 25C:
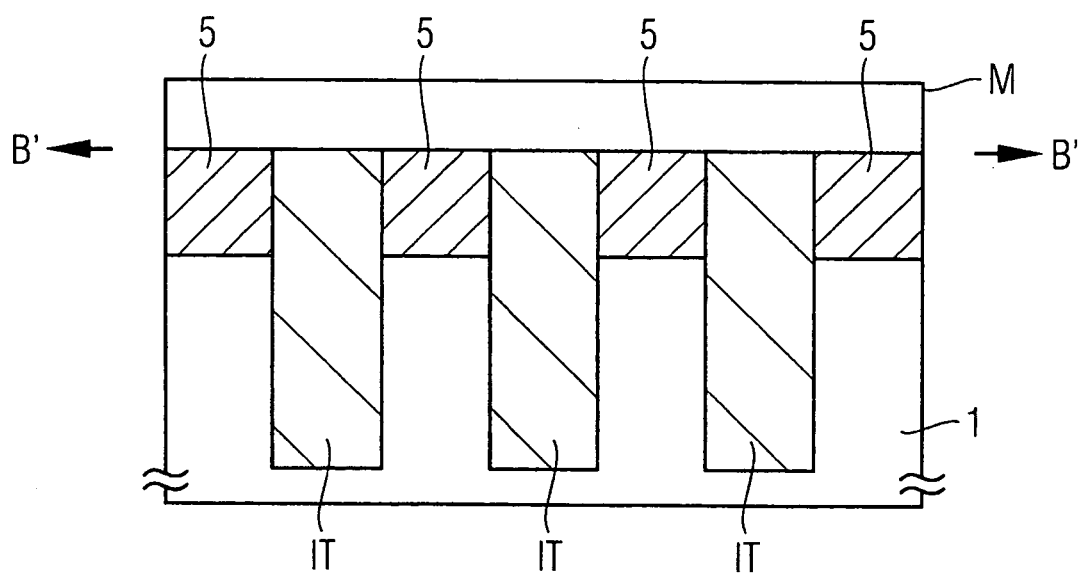

In a next process step which is shown in FIG. 25a)-d), a block mask layer M made of silicon oxide is deposited and structured into block stripes running along the y-direction over the memory cell array. Particularly, the individual block stripes of said block mask M cover two adjacent wordlines WL2, WL3 and intervening regions, as may be especially obtained from FIG. 25d).

The adjacent block stripes of the block mask M are spaced by one wordline distance, i.e. the distance between wordline WL1 and WL2 and the distance between wordline WL3 and WL4, respectively.

Using said block mask M, firstly the exposed silicon nitride layer 5 is selectively removed, f.e. in a hot phosphor acid etch step. This etch step is selective with respect to the adjacent isolation trench regions IT and the block mask M itself.

Figure 25D:
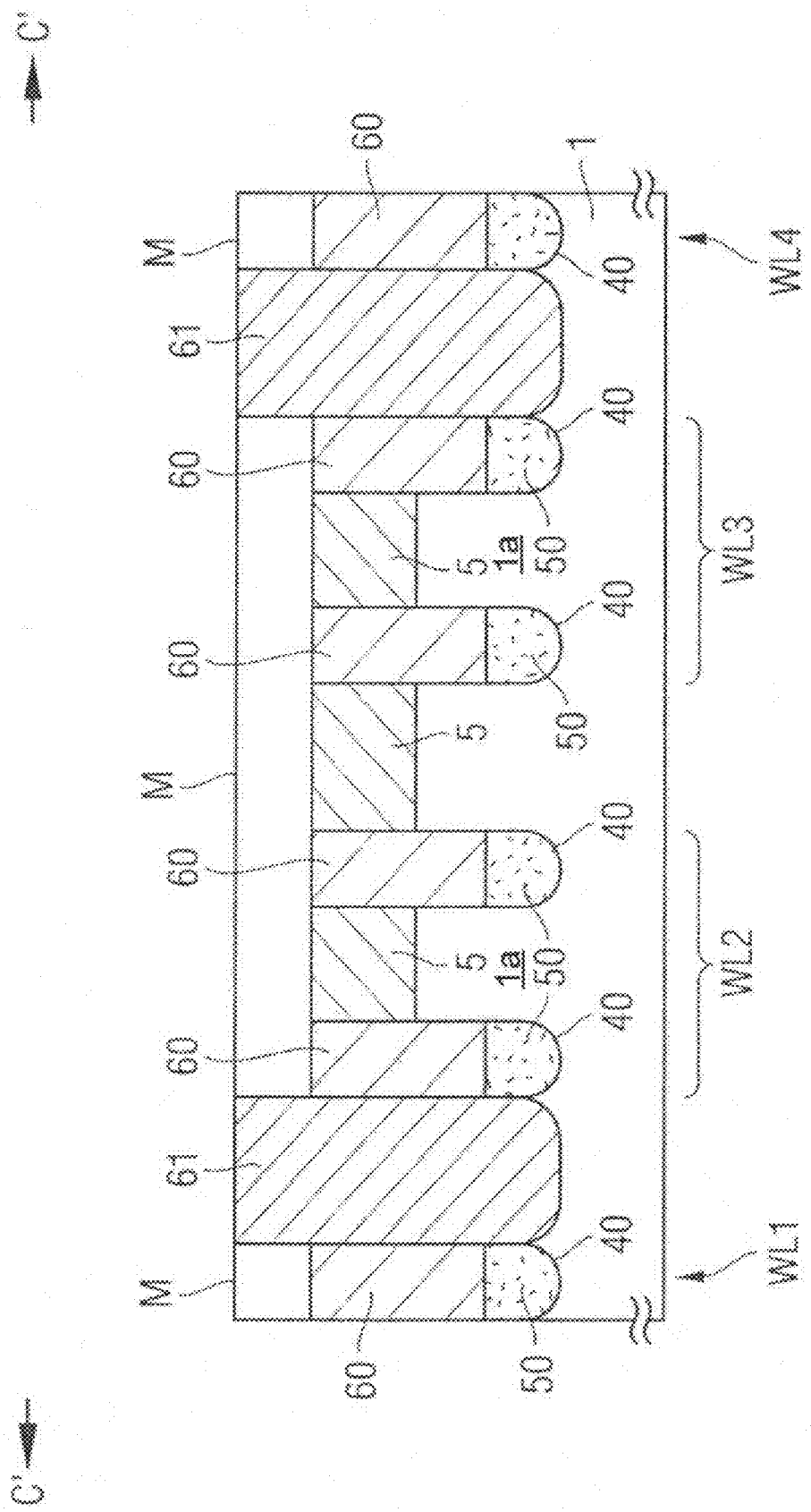

Thereafter, a silicon etch is performed for removing a silicon substrate 1 region along the active area stripes AA between wordlines WL1 and WL2 and between wordlines WL3 and WL4, as may be obtained from FIG. 25d). Then, insulation regions 61 are formed by a silicon oxide deposition and backpolish step which electrically isolate the wordlines WL2 and WL3 from the corresponding other neighboring wordline WL1 and WL4, respectively.

It should be mentioned here, that instead of removing the respective silicon substrate 1 regions by an etch step, an implantation step, f.e. implanting boron ions, into the substrate 1 using the block mask M could be performed in order to form said insulation regions 61.

Figure 26A:
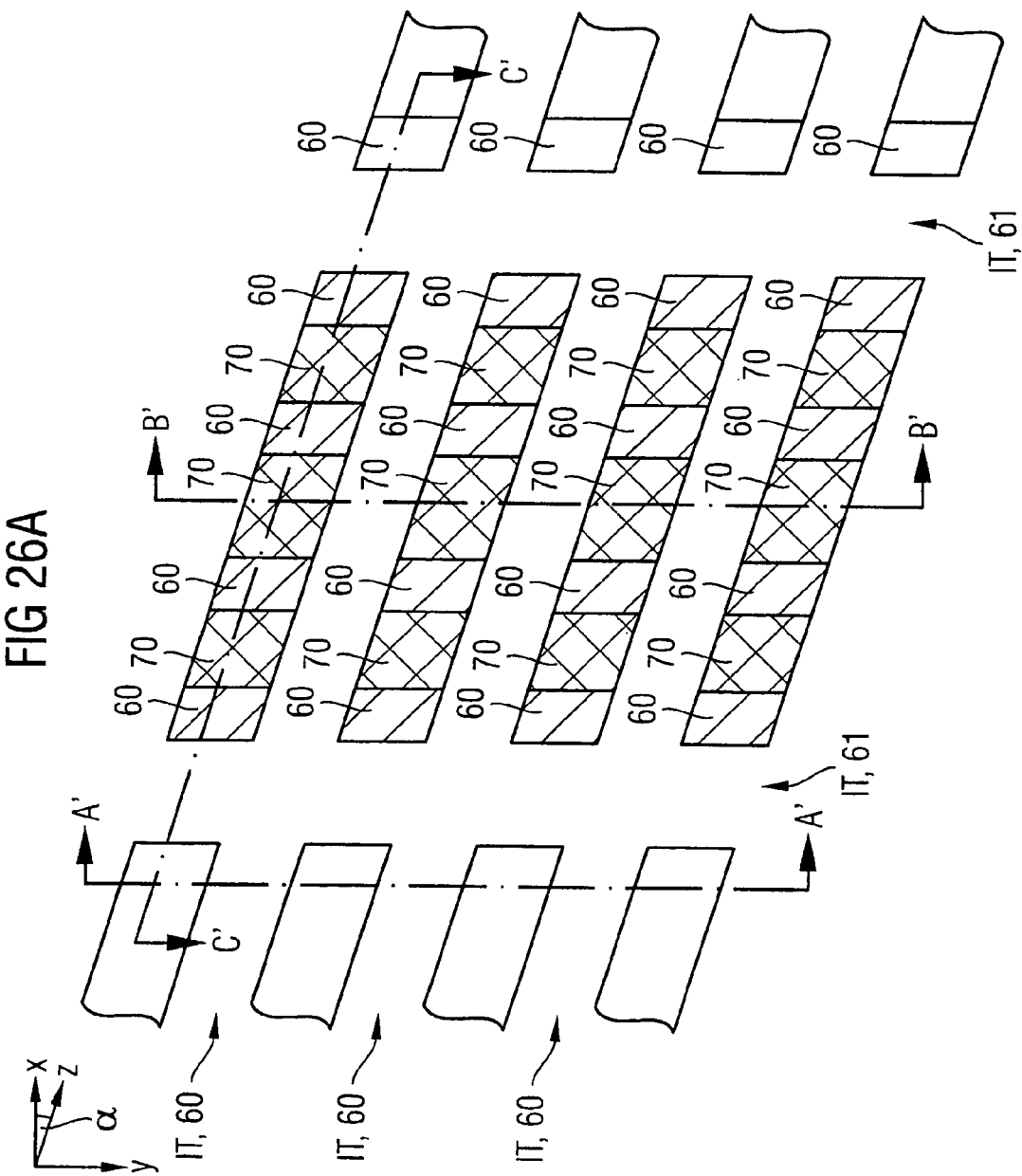
Figure 26B:
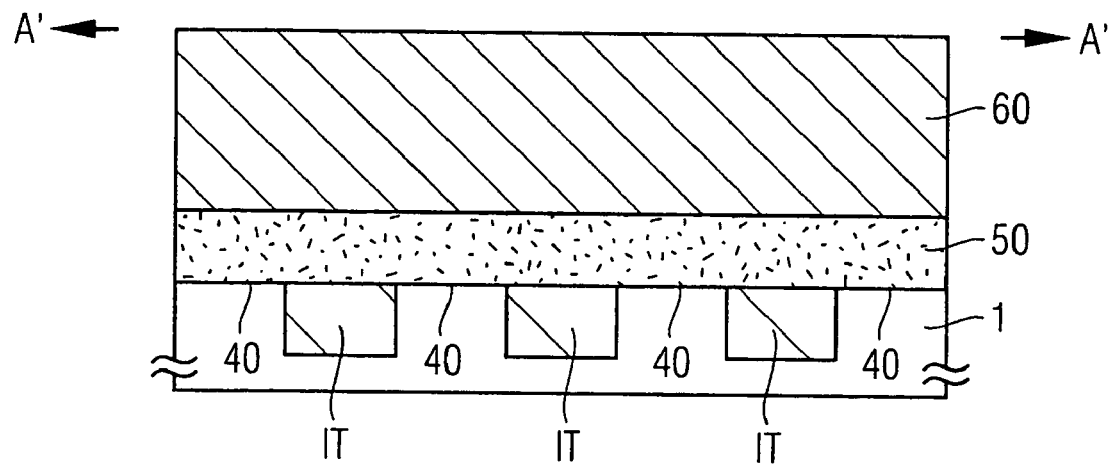
Figure 26C:
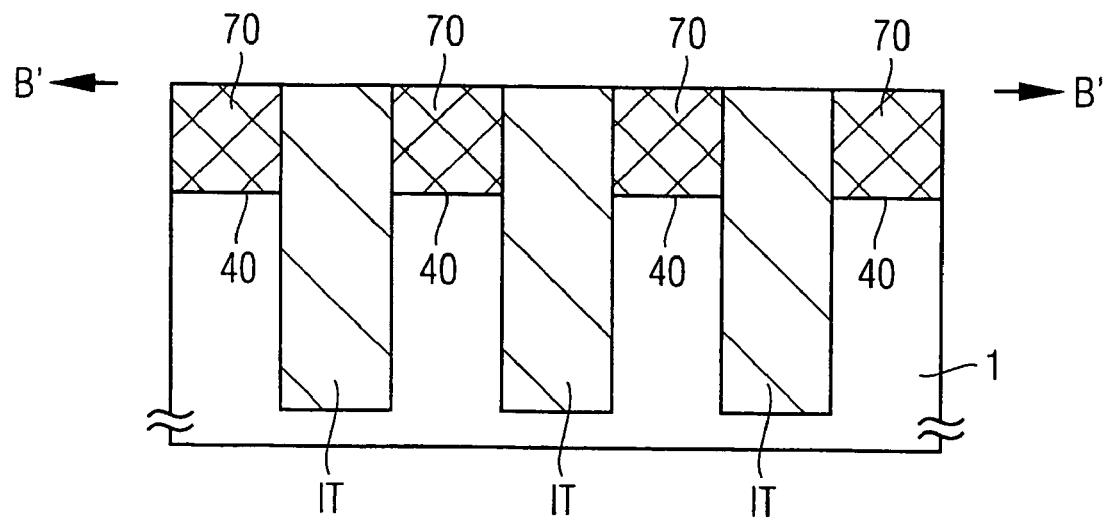

The process state shown in FIG. 26a)-d) is achieved by removing the block mask layer M and bringing the insulation regions 61 down to the level of the remaining silicon nitride mask stripes 5 in said backpolish step.

Then, as already explained with respect to FIG. 9a)-f), the exposed silicon nitride mask stripes 6 are stripped, and an implantation step is performed in order to form source and drain regions S, D1, D2, and then the polysilicon layer 70 is deposited and polished back to the level of the adjoining insulation trenches IT.

Figure 27A:
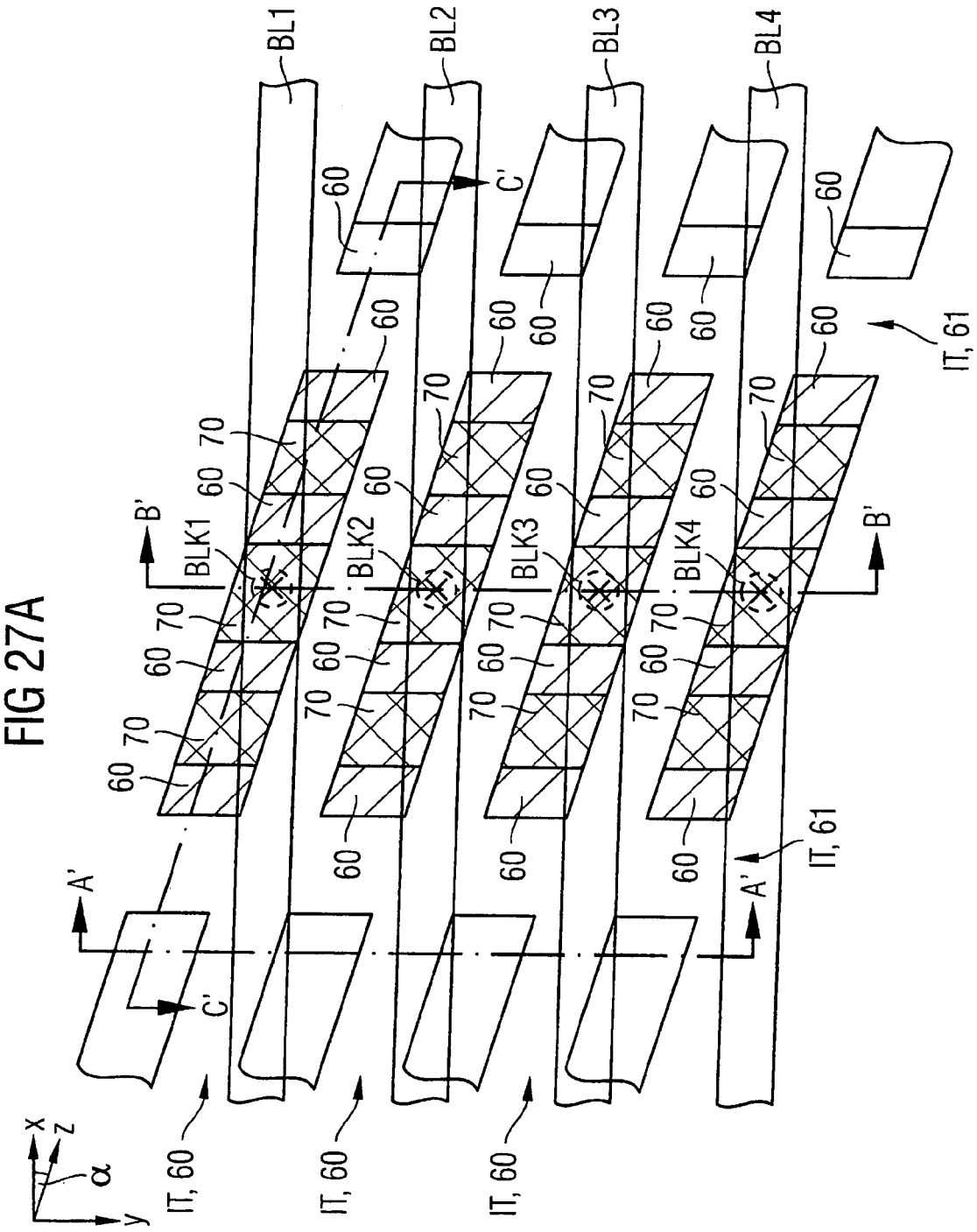
Figure 27B:
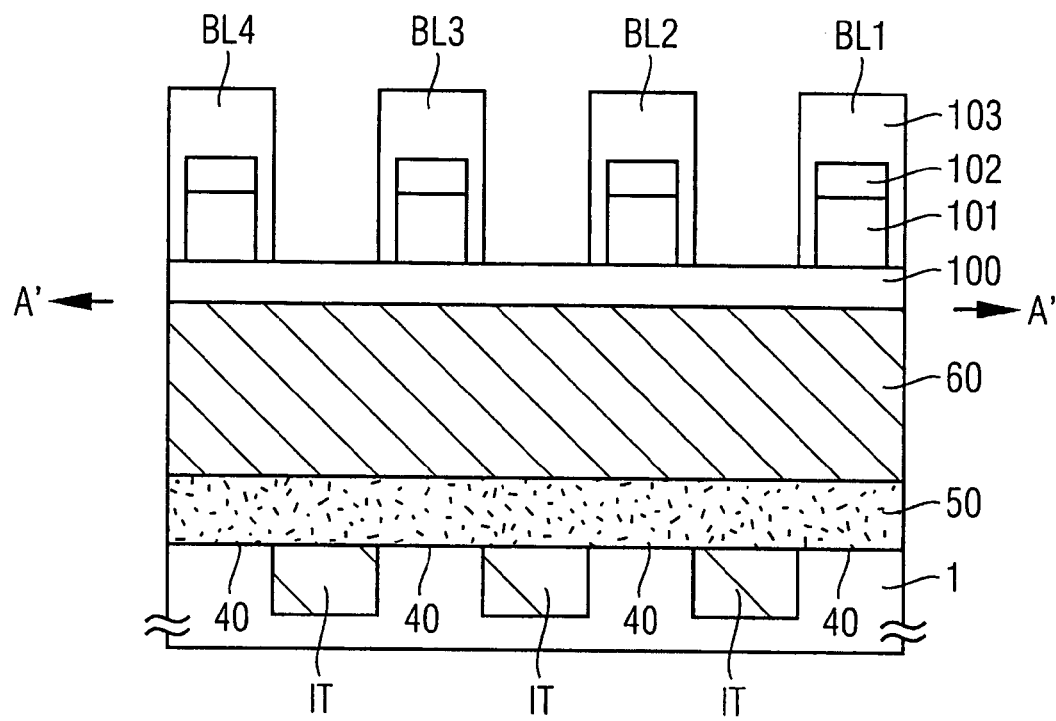
Figure 27C:
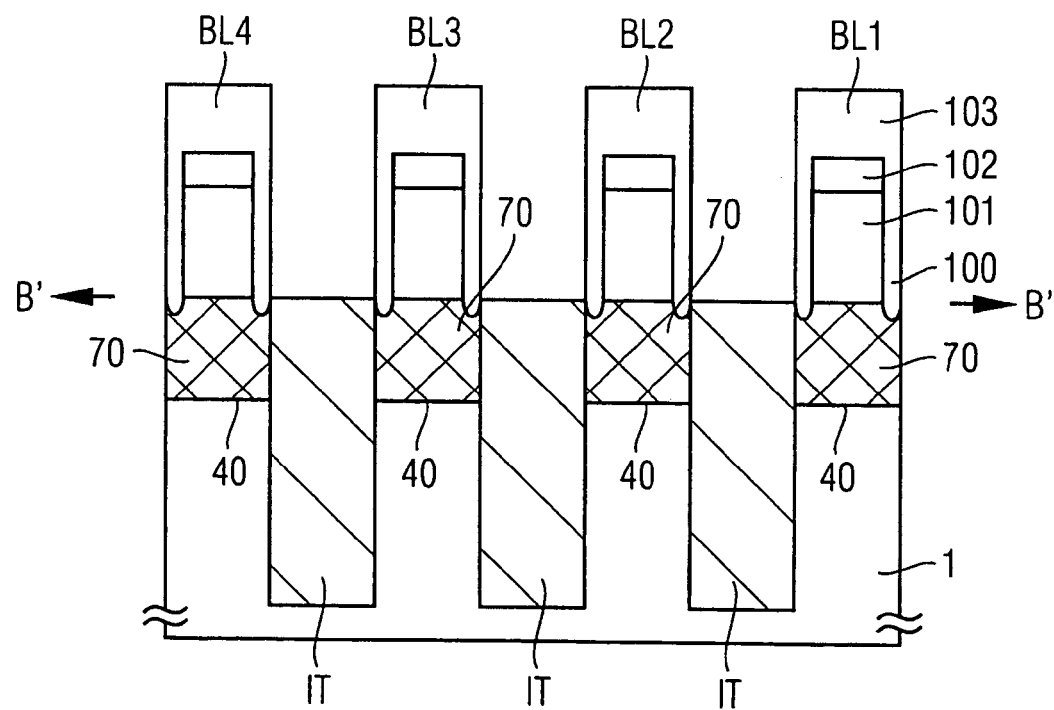
Figure 27D:
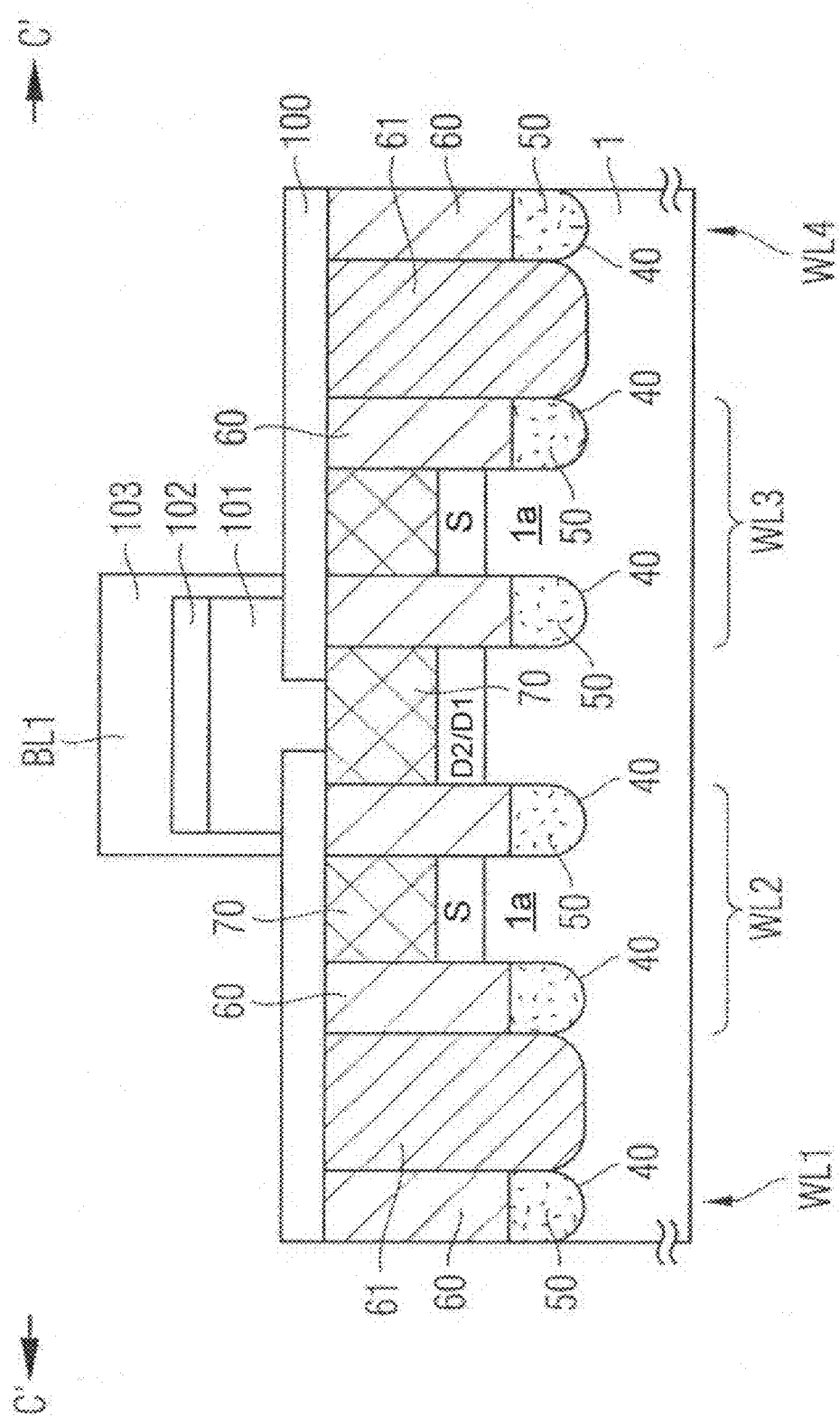

Further with respect to FIG. 27a)-d), an insulation layer 100 made of silicon oxide is formed over the entire memory cell array. Then, bitline contact holes BLK1, BLK2, BLK3, BLK4 are formed in a photolithography/etch step using a stripe mask along lines B'-B' to contact the source regions S of the cell transistors. Subsequently, bitlines BL1, BL2, BL3, BL4 running in parallel along the x-direction are formed, which bitlines BL1, BL2, BL3, BL4 comprise a lower polysilicon layer 101, an intermediate tungsten layer 102 and an upper nitride cap layer 103 as well know in the art. The polysilicon layer 101 forms the bitline contacts in bitline contact holes BLK1, BLK2, BLK3, BLK4. As may be seen in FIG. 27c, a slight underetch is created in the source regions S in the step of etching said bitlines BL1, BL2, BL3, BL4.

Figure 28A:
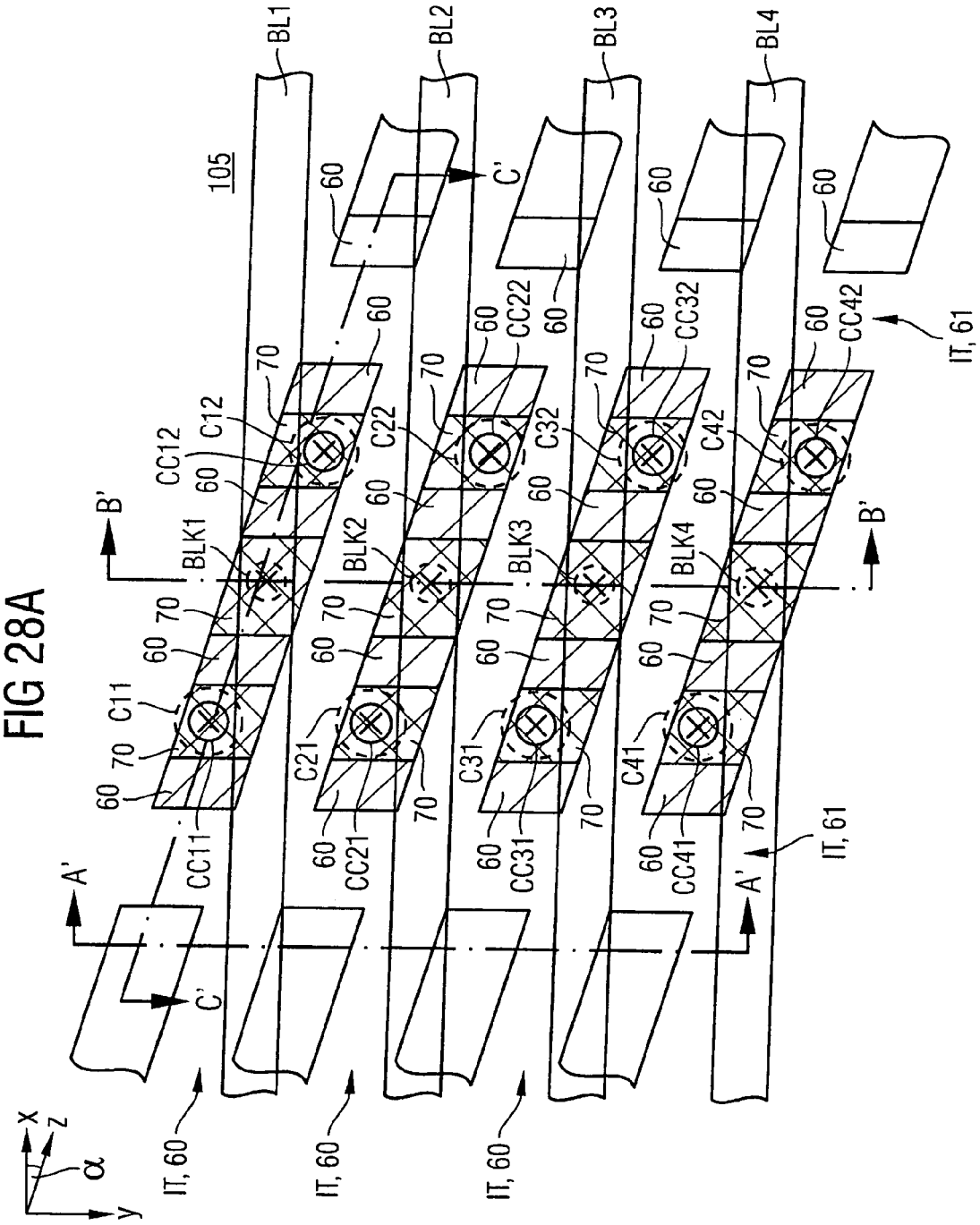
Figure 28B:
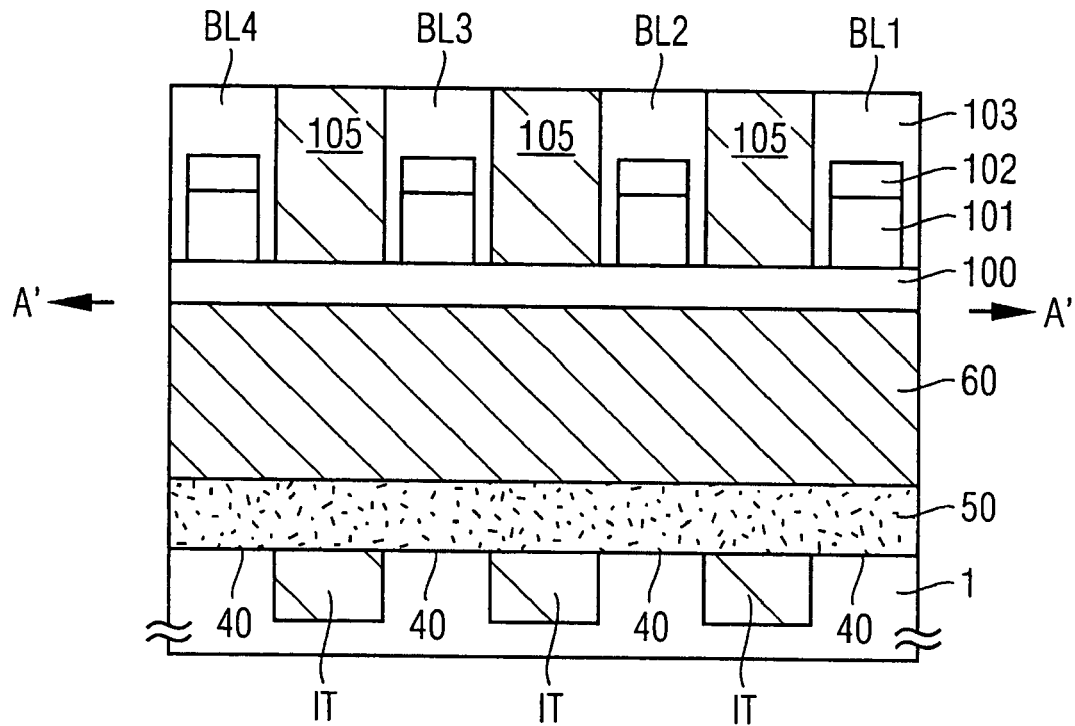
Figure 28C:
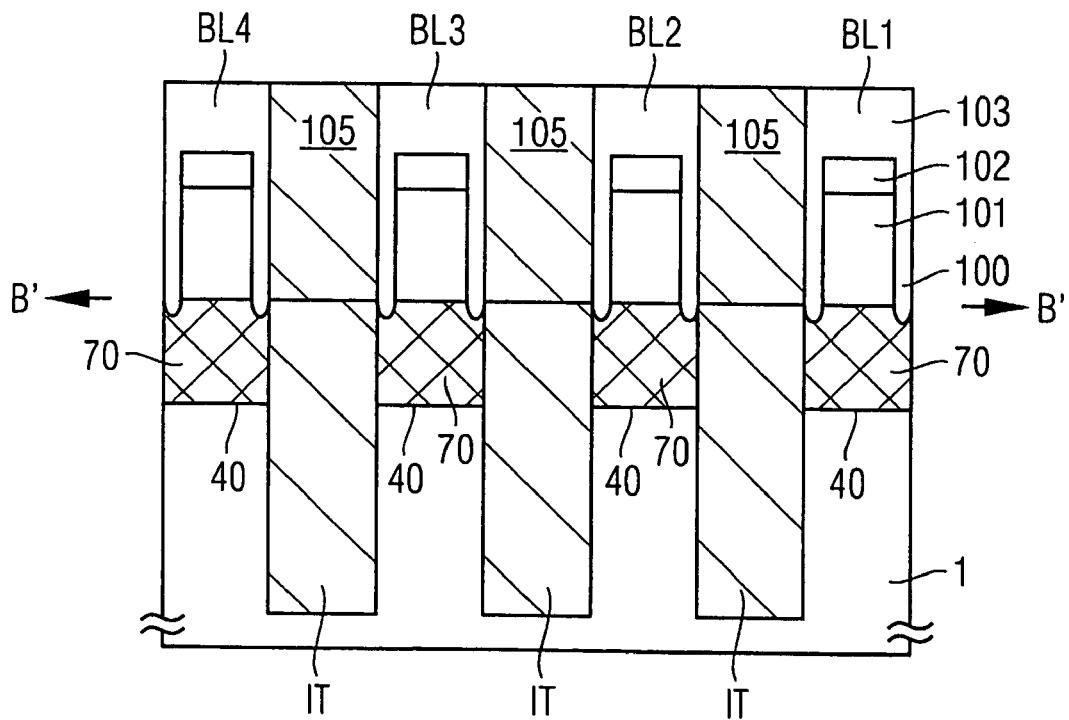

Thereafter, as depicted in FIG. 28a)-d), another dielectric layer 105 made of silicon dioxide is deposited and polished back to the upper side of said bitlines BL1, BL2, BL3, BL4. Then, capacitor contacts CC11, CC12, CC21, CC22, CC31, CC32, CC41, CC42 are formed in said dielectric layer 105 to expose the drain regions D1, D2 of the cell transistor devices. These capacitor contacts CC11, CC12, CC21, CC22, CC31, CC32, CC41, CC42 can be formed by a photolithography/etch step followed by a deposition/backpolish step using f.e. tungsten as contact material.

In a final process step, capacitors C11, C12, C21, C22, C31, C32, C41, C42 are formed on the most upper level above said dielectric layer 105, thus completing the memory cell array. Said capacitors C1, C12, C21, C22, C31, C32, C41, C42 can be formed in symmetrical rows and columns, shifted rows and columns or any other suitable arrangement.

As may be seen from FIG. 28d), the memory cells of this array are symmetrically, i.e. share bitline BL1 and are connected to two different wordlines WL2 and WL3. The major advantage of the memory cell array according to this embodiment is that the transistor can cut-off more effectively, because of the fully surrounding gate on the node side. There is the possibility to form a sub-6F$^2$ memory cell, because the size of the memory cells in bitline direction amounts to 2F whereas the size of the memory cells in wordline direction is diminishable from 2F, because of the spacer concept using the oxide spacer layer 30 for the source contacts.

It should be noted that the transistor devices of the memory cell array according to the fifth embodiment are shown as being identical to the transistor devices explained above with respect to FIG. 1a)-F) to 10a)-f). However, of course the transistor devices according to FIG. 11a)-f) to 13a)-), 14a)-f) to 16a)-f) and 17a)-f) to 18a)-f) may also be used for the memory cell array according to the present invention.

Particularly, the active areas AA may also have a zig-zag substructure which can be achieved by mirroring every second drain 1—source-drain 2—element.

Although the present invention has been described with reference to a preferred embodiment, it is not limited thereto, but can be modified in various manners which are obvious for a person skilled in the art. Thus, it is intended that the present invention is only limited by the scope of the claims attached herewith.

The invention claimed is:

1. An integrated circuit comprising a memory cell array, comprising:
a semiconductor body;
a plurality of cell transistor devices formed along a plurality of parallel active area stripes of said body, said active area stripes running in a first direction and being laterally insulated from each other by intervening insulation trenches;
each of said cell transistor devices comprising:
a pillar formed in said semiconductor body;
a gate trench surrounding said pillar;
a first source/drain region formed in an upper region of said pillar;
a gate dielectric formed on a bottom of said gate trench and surrounding a lower region of said pillar;
a gate formed on said gate dielectric in said gate trench and surrounding a lower region of said pillar; and
1a second source/drain region formed in an upper region of said semiconductor body adjoining said gate trench;
a plurality of parallel bitlines running in a second direction and being connected to respective second source/drain regions of said cell transistor devices;
a plurality of wordlines running in a third direction and connecting the respective gates of said cell transistor devices associated with different bitlines; and
a plurality of cell capacitor devices being connected to respective first source/drain regions of said cell transistor devices.

2. The integrated circuit comprising the memory cell array according to claim 1, wherein each of said cell transistor devices comprises a channel formed in the semiconductor body below the gate dielectric which has a curved upper surface in a direction perpendicular to a current flow direction.

3. The integrated circuit comprising the memory cell array according to claim 1, wherein said pillar has curved sidewalls.

4. The integrated circuit comprising the memory cell array according to claim 1, wherein each of said cell transistor devices comprises a channel formed in the semiconductor body below the gate dielectric which includes upper corners covered by said gate dielectric and gate.

5. The integrated circuit comprising the memory cell array according to claim 1, wherein said cell capacitor devices are formed above an associated first source/drain region.

6. The integrated circuit comprising the memory cell array according to claim 1, wherein said active area stripes running in the first direction have a zig-zag substructure.

7. The integrated circuit comprising the memory cell array according to claim 1, wherein said wordlines are formed by adjacent gates.

8. The integrated circuit comprising the memory cell array according to claim 1, further comprising a second pillar defining a second gate trench surrounding the second pillar, a second gate dielectric and a second gate formed in the second trench, wherein the second gate dielectric is disposed between the second gate and the second pillar, wherein each of said cell transistor devices comprises a third source/drain region formed in an upper region of the second pillar formed in said semiconductor body adjoining said gate trench opposite to said first source/drain region, said first and third source/drain regions belonging to two different memory cells which share said second source/drain region and which have adjacent wordlines.

9. The integrated circuit comprising the memory cell array according to claim 8, wherein said adjacent wordlines are insulated from another neighboring wordline by a respective insulation region formed in said active area stripe.

10. The integrated circuit comprising the memory cell array according to claim 1, wherein said second and third directions are orthogonal to each other and said first direction is oblique to said second and third directions.

11. The integrated circuit comprising the memory cell array according to claim 10, wherein said first direction forms an angle of between 15 and 25 degrees with said second direction.

12. An integrated circuit comprising a memory cell array comprising:
 a semiconductor body;
 a plurality of cell transistor devices comprising;
  a pillar formed in said semiconductor body;
  a gate trench surrounding said pillar;
  a first source/drain region formed in an upper region of said pillar;
  a gate dielectric formed on the bottom of said gate trench and surrounding a lower region of said pillar;
  a gate formed on said gate dielectric in said gate trench and surrounding a lower region of said pillar; and
  a second source/drain region formed in an upper region of said semiconductor body adjoining said gate trench;
 a plurality of bitlines being connected to respective first groups of second source/drain regions of said cell transistor devices;
 a plurality of wordlines connecting the respective gates of second groups of said cell transistor devices; and
 a plurality of cell capacitor devices being connected to respective first source/drain regions of said cell transistor devices.

13. The integrated circuit comprising the memory cell array according to claim 12, wherein each of said cell transistor devices comprises a channel formed in the semiconductor body below the gate dielectric which has a curved upper surface in a direction perpendicular to a current flow direction.

14. The integrated circuit comprising the memory cell array according to claim 12, wherein said pillar has curved sidewalls.

15. The integrated circuit comprising the memory cell array according to claim 12, wherein each of said cell transistor devices comprises a channel formed in the semiconductor body below the gate dielectric which includes upper corners covered by said gate dielectric and gate.

16. The integrated circuit comprising the memory cell array according to claim 12, wherein said cell capacitor devices are formed above an associated first source/drain region.

17. The integrated circuit comprising the memory cell array according to claim 12, wherein said wordlines are formed by adjacent gates.

18. The integrated circuit comprising the memory cell array according to claim 12, further comprising a second pillar defining a second gate trench surrounding the second pillar, a second gate dielectric and a second gate formed in the second trench, wherein the second gate dielectric is disposed between the second gate and the second pillar, wherein each of said cell transistor devices comprises a third source/drain region formed in an upper region of the second pillar formed in said semiconductor body adjoining said gate trench opposite to said first source/drain region, said second and third source/drain regions belonging to two different memory cells which share said second source/drain region and which have adjacent wordlines.

19. The integrated circuit comprising the memory cell array according to claim 18, wherein said adjacent wordlines are insulated from another neighboring wordline by a respective insulation region formed in said active area stripe.

20. An integrated circuit comprising a memory cell array, comprising: a plurality of parallel active area stripes formed in a semiconductor body, the active area stripes running in a first direction and being separated from each other by first isolation trenches, the active area stripes each comprising a plurality of pillars comprising a center pillar, a first outer pillar and a second outer pillar, wherein the first and second outer pillars are arranged on opposite sides of the center pillar, and wherein each of the plurality of pillars comprise a source/drain region formed in an upper portion thereof; a plurality of parallel bitlines running in a second direction and connected to the source/drain region of a respective center pillar of the plurality of active area stripes; and a plurality of wordlines running in a third direction, and a plurality of cell capacitor devices connected to the source/drain regions of respective first and second outer pillars, wherein the first and second outer pillars of each group of pillars in an active area stripe are surrounded by gate trenches, wherein each gate trench comprises a gate electrode arranged at a bottom portion of the gate trenches, and a gate dielectric disposed between the gate electrode and the respective pillar, and wherein each group of pillars correspond to two memory cell transistors with a common bitline contact associated with the center pillar, and with gate electrodes connected to adjacent wordlines.

* * * * *